United States Patent
Lu

(10) Patent No.: US 12,308,072 B2
(45) Date of Patent: May 20, 2025

(54) INTEGRATED SCALING AND STRETCHING PLATFORM FOR OPTIMIZING MONOLITHIC INTEGRATION AND/OR HETEROGENEOUS INTEGRATION IN A SINGLE SEMICONDUCTOR DIE

(71) Applicants: INVENTION AND COLLABORATION LABORATORY PTE. LTD., Singapore (SG); ETRON TECHNOLOGY, INC., Hsinchu (TW)

(72) Inventor: Chao-Chun Lu, Hsinchu (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 684 days.

(21) Appl. No.: 17/531,015

(22) Filed: Nov. 19, 2021

(65) Prior Publication Data

US 2022/0293170 A1      Sep. 15, 2022

Related U.S. Application Data

(60) Provisional application No. 63/276,698, filed on Nov. 8, 2021, provisional application No. 63/254,598, filed
(Continued)

(51) Int. Cl.
*G11C 11/417* (2006.01)
*G11C 11/412* (2006.01)
(Continued)

(52) U.S. Cl.
CPC .......... *G11C 11/417* (2013.01); *G11C 11/412* (2013.01); *H03K 19/17728* (2013.01);
(Continued)

(58) Field of Classification Search
CPC ..... G11C 11/417; G11C 11/412; G11C 11/40; G11C 11/407; H03K 19/17728;
(Continued)

(56) References Cited

U.S. PATENT DOCUMENTS 6,462,395 B1    10/2002  Fukuda et al.
2002/0096773 A1   7/2002  Anezaki et al.
(Continued)

FOREIGN PATENT DOCUMENTS

EP    0 195 977 A2   10/1986
EP    2 239 771 A1   10/2010
(Continued)

OTHER PUBLICATIONS

Extended European Search Report for European Application No. 22160535.5, dated Aug. 16, 2022.
(Continued)

*Primary Examiner* — Paul Dinh
(74) *Attorney, Agent, or Firm* — Birch, Stewart, Kolasch & Birch, LLP

(57) ABSTRACT

The present invention provides a single monolithic the comprising a first schematic circuit manufactured based on a first technology node. A die area of the single monolithic die is smaller than a die area of another monolithic die with a second schematic circuit made based on the first technology node, wherein the first schematic circuit is the same as the second schematic circuit, and the first schematic circuit is a SRAM circuit, a logic circuit, a combination of SRAM and logic circuit, or a major function block circuit.

9 Claims, 55 Drawing Sheets

Related U.S. Application Data on Oct. 12, 2021, provisional application No. 63/158,896, filed on Mar. 10, 2021.

(51) Int. Cl.
*H03K 19/17728* (2020.01)
*H03K 19/1776* (2020.01)
*H10B 10/00* (2023.01)

(52) U.S. Cl.
CPC ......... *H03K 19/1776* (2013.01); *H10B 10/12* (2023.02); *H10B 10/18* (2023.02)

(58) Field of Classification Search
CPC .... H03K 19/1776; H10B 10/12; H10B 10/18; G06F 15/781; H01L 27/11807; H01L 27/0207; H01L 25/0652; H01L 25/16; H01L 27/105
USPC .......................................................... 716/138
See application file for complete search history.

(56) References Cited

U.S. PATENT DOCUMENTS

| | | |
|---|---|---|
| 2005/0258498 A1 | 11/2005 | Suzuki |
| 2006/0071074 A1 | 4/2006 | Konevecki et al. |
| 2007/0052092 A1 | 3/2007 | Kao |
| 2008/0116583 A1 | 5/2008 | Yuki |
| 2010/0289084 A1 | 11/2010 | Yoon et al. |
| 2011/0156107 A1 | 6/2011 | Bohr et al. |
| 2013/0069168 A1 | 3/2013 | Blatchford |
| 2013/0075920 A1 | 3/2013 | Chen et al. |
| 2014/0143565 A1 | 5/2014 | Paul et al. |
| 2014/0199837 A1 | 7/2014 | Hung et al. |
| 2016/0092396 A1 | 3/2016 | Rusu |
| 2016/0240541 A1 | 8/2016 | Liaw |
| 2017/0263506 A1 | 9/2017 | Bouche et al. |
| 2018/0285261 A1 | 10/2018 | Mandal et al. |
| 2019/0250209 A1 | 8/2019 | Lee et al. |
| 2019/0296012 A1 | 9/2019 | Iwata et al. |
| 2019/0303268 A1 | 10/2019 | Ansari et al. |
| 2019/0355620 A1 | 11/2019 | Freed et al. |
| 2019/0355672 A1 | 11/2019 | Fujita et al. |
| 2020/0106441 A1 | 4/2020 | Liaw |
| 2020/0233312 A1 | 7/2020 | Kim |
| 2020/0176574 A1 | 8/2020 | Huang et al. |
| 2020/0294180 A1 | 9/2020 | Koker et al. |
| 2020/0350322 A1 | 11/2020 | Liu et al. |
| 2020/0365464 A1 | 11/2020 | Sreenivasan et al. |
| 2021/0066187 A1 | 3/2021 | Lee et al. |
| 2021/0167176 A1 | 6/2021 | Inden et al. |
| 2021/0408245 A1 | 12/2021 | Lu |
| 2022/0059460 A1 | 2/2022 | Do et al. |
| 2023/0106517 A1 | 4/2023 | Lu et al. |
| 2023/0291405 A1* | 9/2023 | Ahmad ................ H03K 19/007 |
| 2023/0395142 A1* | 12/2023 | Sato ...................... G11C 11/417 |

FOREIGN PATENT DOCUMENTS

| | | |
|---|---|---|
| JP | 2001-44282 A | 2/2001 |
| JP | 2005-244247 A | 9/2005 |
| JP | 2013-143485 A | 7/2013 |
| JP | 2016-530704 A | 9/2016 |
| JP | 2018-536214 A | 12/2018 |
| KR | 10-0415519 B1 | 1/2004 |
| KR | 10-2005-0087626 A | 8/2005 |
| KR | 10-2015-0041092 A | 4/2015 |
| TW | 200529364 A | 9/2005 |
| TW | I710064 B | 11/2020 |
| WO | WO 2011/014409 A1 | 2/2011 |
| WO | WO 2017/095494 A1 | 6/2017 |
| WO | WO 2019/094843 A1 | 5/2019 |
| WO | WO 2020/054109 A1 | 3/2020 |

OTHER PUBLICATIONS

Partial European Search Report for European Application No. 22160726.0, dated Jul. 25, 2022.
Partial European Search Report for European Application No. 22160752.6, dated Jul. 27, 2022.
Partial European Search Report for European Application No. 22161083.5, dated Jul. 29, 2022.
Taiwanese Office Action and Search Report for Taiwanese Application No. 111108252, dated Jul. 5, 2022.
Extended European Search Report for European Application No. 22161038.9, dated Feb. 20, 2023.
Taiwanese Office Action and Search Report dated Oct. 13, 2023 for Application No. 112109316.
U.S. Office Action dated Dec. 11, 2023 for U.S. Appl. No. 17/528,957.
Song et al., "An 10 nm FinFET 128 Mb SRAM With Assist Adjustment System for Power, Performance, and Area Optimization," IEEE Journal of Solid-State Circuits, vol. 52, No. 1, Jan. 4, 2017, pp. 240-249.
Taiwanese Office Action and Search Report for Taiwanese Application No. 111108252, dated Jan. 29, 2024.
Japanese Office Action dated Aug. 1, 2023 for Application No. 2022-036485 with an English translation.
Chang et al., "A 5nm 135Mb SRAM in EUV and High-Mobility-Channel FinFET Technology with Metal Coupling and Charge-Sharing Write-Assist Circuitry Schemes for High-Density and Low-VMIN Applications," 2020 IEEE, ISSCC, Feb. 16, 2020, pp. 238-240.
Extended European Search Report for European Application No. 22160758.3, dated Dec. 5, 2022.
Extended European Search Report for European Application No. 22160726.0, dated Nov. 30, 2022.
Extended European Search Report for European Application No. 22160752.6, dated Dec. 13, 2022.
Extended European Search Report for European Application No. 22161083.5, dated Dec. 15, 2022.
Partial European Search Report for European Application No. 22161038.9, dated Dec. 15, 2022.
Salahuddin et al., "SRAM With Buried Power Distribution to Improve Write Margin and Performance in Advanced Technology Nodes," IEEE Electron Device Letters, vol. 40, No. 8, Aug. 2019, pp. 1261-1264.
Schor, "VLSI 2018: Samsung's 2nd Gen 7nm, EUV Goes HVM," WikiChip Fuse, Aug. 4, 2018, 6 pages total.
Hoefflinger, "Chips 2020 vol. 2", The Frontiers Collection, Chapter 11, 2016, pp. 181-187.
Korean Office Action for Korean Application No. 10-2022-0029992, dated Jun. 28, 2024, with English translation.
Tong et al., "Two-terminal vertical memory cell for cross-point static random access memory applications", J. Vac. Sci. Technol. B, vol. 32, No. 2, 2014, pp. 021205-1-021205-7.
US Office Action for U.S. Appl. No. 17/395,922, dated May 23, 2024.
US Office Action for U.S. Appl. No. 17/528,481, dated May 31, 2024.
Taiwanese Office Action and Search Report for Taiwanese Application No. 111108252, dated Oct. 16, 2024.
US Office Action for U.S. Appl. No. 17/528,481, dated Nov. 4, 2024.

* cited by examiner

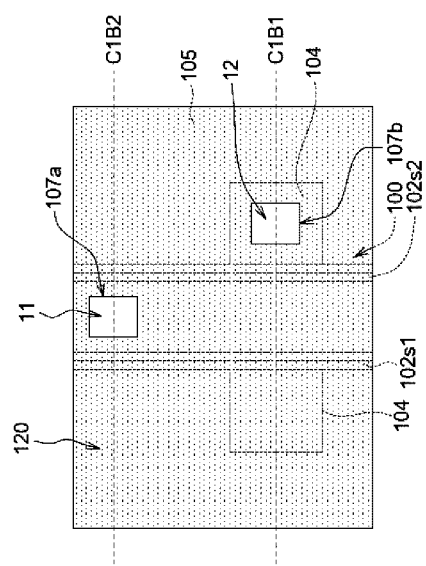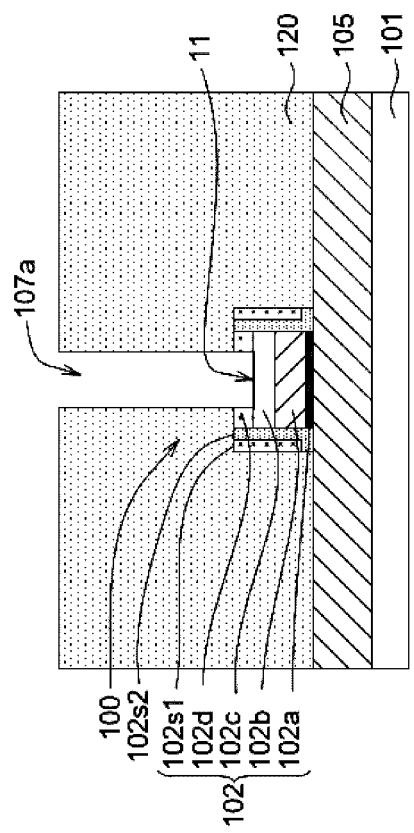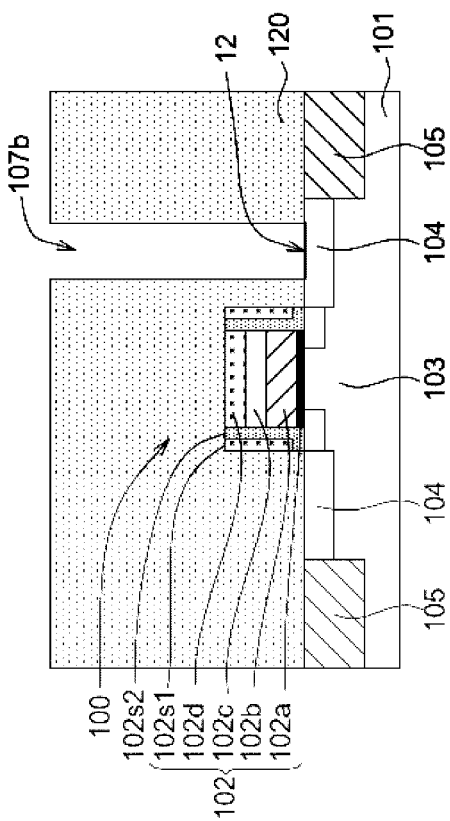

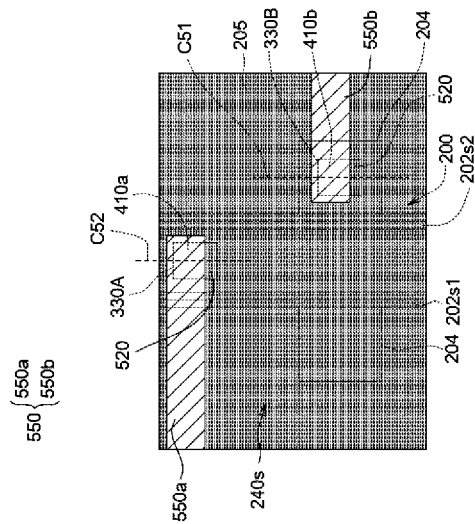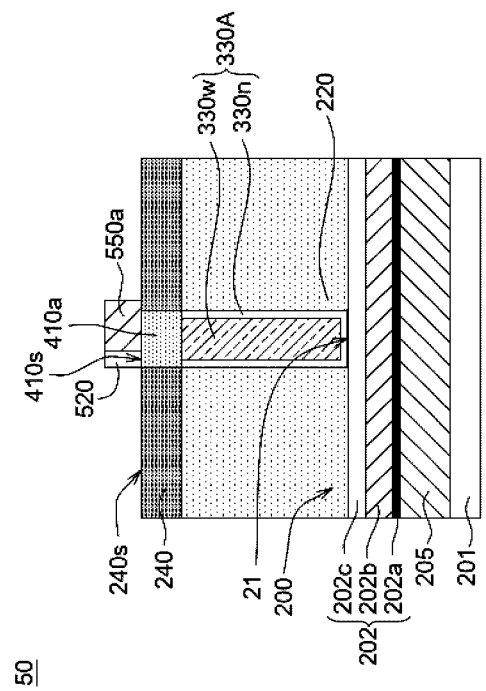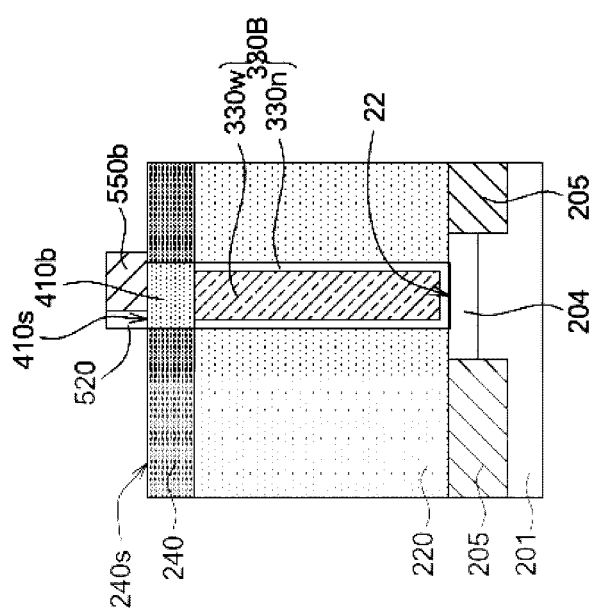

| Foundry T (technology node: nm) | 5 | 7 | 10 | 16 | |
|---|---|---|---|---|---|
| CPP (nm) | 50 | 57 | 66 | 90 | |
| Cell_Height (nm) | 180 | 240 | 360 | 576 | |
| Fin Pitch (nm) | 22.5 | 30 | 45 | 48 | |
| Foundry S (technology node: nm) | 5 | 7 | 10 | 14 | |
| CPP (nm) | 54 | 54 | NA | 78.3 | |
| Cell_Height (nm) | 216 | 243 | NA | 576 | |
| Fin Pitch (nm) | 27 | 27 | NA | 48 | |
| Foundry I (technology node: nm) | 5 | 7 | 10 | 14 | 22 |
| CPP (nm) | NA | NA | 54 | 70 | 90 |
| Cell_Height (nm) | NA | NA | 272 | 399 | 840 |
| Fin Pitch (nm) | NA | NA | 34 | 42 | NA |
| The present invention | 5 | 7 | 10 | 16 | 22 |
| CPP (nm) | 20 | 28 | 40 | 64 | 88 |
| Cell_Height (nm)(Fin number=8) | 120 | 168 | 240 | 384 | 528 |
| Fin Pitch (nm) | 15 | 21 | 30 | 48 | 66 |

FIG. 34B

INTEGRATED SCALING AND STRETCHING PLATFORM FOR OPTIMIZING MONOLITHIC INTEGRATION AND/OR HETEROGENEOUS INTEGRATION IN A SINGLE SEMICONDUCTOR DIE

CROSS REFERENCE TO RELATED APPLICATIONS

This application claims the benefit of U.S. Provisional Application No. 63/254,598, filed on Oct. 12, 2021, the benefit of U.S. Provisional Application No. 63/276,698, filed on Nov. 8, 2021, the benefit of U.S. Provisional Application No. 63/158,896, filed on Mar. 10, 2021, the contents of those U.S. Provisional Applications are incorporated herein by reference.

BACKGROUND OF THE INVENTION

1. Field of the Invention

The present invention relates to monolithic semiconductor die, and particularly to an optimized monolithic semiconductor die based on integrated scaling and stretching platform which can effectively shrink a size of the SRAM circuit and logic circuits in a monolithic semiconductor die without shrinking the minimum feature size.

2. Description of the Prior Art

IT systems are rapidly evolving in businesses and enterprises across the board, including those in factories, healthcare, and transportation. Nowadays, SOC (System on Chip) or AI (Artifactual Intelligence) is the keystone of IT systems which is making factories smarter, improving patient outcomes better, and increasing autonomous vehicle safety. Data from manufacturing equipment, sensors, machine vision systems could easily reach total 1 petabyte per day. Therefore, a HPC (High Performance Computing) SOC or AI chip is required to handle the such petabyte data.

Generally speaking, AI chips could be categorized by GPU (Graphic Processing Unit), FPGA (Field Programmable Gate Array), and ASIC (application specific IC). Originally designed to handle graphical processing applications using parallel computing, GPUs began to be used more and more often for AI training. GPU's training speed and efficiency generally is 10~1000 times larger than general purpose CPU. FPGAs have blocks of logic that interact with each other and can be designed by engineers to help specific algorithms, and is suitable for AI inference. Due to faster time to market, lower cost, and flexibility, FPGA prefers over ASIC design although it has disadvantages like larger size, slower speed, and larger power consumption. Due to the flexibility of FPGA, it is possible to partially program any portion of the FPGA depending on the requirement. FPGAs inference speed and efficiency is 10~100 times larger than general purpose CPU. On the other hand, ASICs are tailored directly to the circuitry and are generally more efficient than FPGAs. For customized ASIC, its training/inference speed and efficiency could be 10~1000 times larger than general purpose CPU. However, unlike FPGAs which are easier to customize as AI algorithms continue to evolve, ASICs are slowly becoming obsolete as new AI algorithms are developed.

No matter in GPU, FPGA, and ASICs (or other similar SOC, CPU, NPU, etc.), logic circuit and SRAM circuit are two major circuit the combination of which approximately occupy around 90% of the AI chip size. The rest 10% of the AI chip may include I/O pads circuit. Nevertheless, the scaling process/technology nodes for manufacturing AI chips are becoming increasingly necessary to train an AI machine efficiently and quickly because they offer better efficiency and performance. Improvement in integrated circuit performance and cost has been achieved largely by process scaling technology according to Moore's Law, but such scaling according to technology node ("A" or "F") or minimum feature size from 28 nm down to 3~5 nm encounter a lot of technical difficulties, so the semiconductor industry's investment costs in R&D and capital are dramatically increasing.

For example, SRAM device scaling for increased storage density, reduction in operating voltage (VDD) for lower stand-by power consumption, and enhanced yield necessary to realize larger-capacity SRAM become increasingly difficult to achieve. with miniaturization down to the 28 nm (or lower) manufacture process is a challenge. FIG. 1A shows the SRAM cell architecture, that is the six-transistor (6-T) SRAM cell. It consists of two cross-coupled inverters (PMOS pull-up transistors PU-1 and PU-2 and NMOS pull-down transistors PD-1 and PD-2) and two access transistors (NMOS pass-gate transistors PG-1 and PG-2). The high level voltage VDD is coupled to the PMOS pull-up transistors PU-1 and PU-2, and the low level voltage VSS are coupled to the NMOS pull-down transistors PD-1 and PD-2. When the word-line (WL) is enabled (i.e., a row is selected in an array), the access transistors are turned on, and connect the storage nodes (Node-1/Node-2) to the vertically-running bit-lines (BL and BL Bar). FIG. 1B shows the "stick diagram" representing the layout and connection among the 6 transistors of the SRAM. The stick diagram usually just includes active regions (vertical gray bar) and gate lines (horizontal white bar). Of course, there are still lots of contacts, on one hand directly coupled to the 6 transistors, and on the other hand, coupled to the word-line (WL), bit-lines (BL and BL Bar), high level voltage VDD, and low level voltage VSS, etc.

Some of the reasons for the dramatically increase of the total area of the SRAM cell represented by $\lambda^2$ or $F^2$ when the minimum feature size decreases could be described as follows. The traditional 6T SRAM has six transistors which are connected by using multiple interconnections, which has its first interconnection layer M1 to connect the gate-level ("Gate") and the diffusion-level of the Source-region and the Drain-region (called generally as "Diffusion") of the transistors. There is a need to increase a second interconnection layer M2 and/or a third interconnection layer M3 for facilitating signal transmission (such as the word-line (WL) and/or bit-lines (BL and BL Bar)) without enlarging the die size by only using M1, then a structure Via-1, which is composed of some types of the conductive materials, is formed for connecting M2 to M1. Thus, there is a vertical structure which is formed from the Diffusion through a Contact (Con) connection to M1, i.e. "Diffusion-Con-M1". Similarly, another structure to connect the Gate through a Contact structure to M1 can be formed as "Gate-Con-M1". Additionally, if a connection structure is needed to be formed from an M1 interconnection through a Via1 to connect to an M2 interconnection, then it is named as "M1-Via1-M2". A more complex interconnection structure from the Gate-level to the M2 interconnection can be described as "Gate-Con-M1-Via1-M2". Furthermore, a stacked interconnection system may have an "M1-Via1-M2-Via2-M3" or "M1-Via1-M2-Via2-M3-Via3-M4" structure, etc. Since the Gate and the Diffusion in two access transistors (NMOS pass-gate transistors PG-1 and PG-2, as shown in FIG. 1A) shall be connected to the word-line (WL) and/or bit-lines (BL and BL Bar) which will be arranged in the second interconnection layer M2 or the third interconnection layer M3, in traditional SRAM such metal connections must go through interconnection layer M1 first. That is, the state-of-the-art interconnection system in SRAM may not allow the Gate or Diffusion directly connect to M2 without bypassing the M1 structure. As results, the necessary space between one M1 interconnection and the other M1 interconnection will increase the die size and in some cases the wiring connections may block some efficient channeling intention of using M2 directly to surpass M1 regions. In addition, there is difficult to form a self-alignment structure between Via1 to Contact and at the same time both Via1 and Contact are connected to their own interconnection systems, respectively.

Additionally, in traditional ST SRAM cell, at least there are one NMOS transistor and one PMOS transistor located respectively inside some adjacent regions of p-substrate and n-well which have been formed next to each other within a close neighborhood, a parasitic junction structure called n+/p/n/p+ parasitic bipolar device is formed with its contour starting from the n+ region of the NMOS transistor in the p-well to the neighboring n-well and further up to the p+ region of the PMOS transistor, as shown in FIG. 2A. There are significant noises occurred on either n+/p junctions or p+/n junctions, an extraordinarily large current may flow through this n+/p/n/p+ junction abnormally which can possibly shut down some operations of CMOS circuits and to cause malfunction of the entire chip. Such an abnormal phenomenon called Latch-up is detrimental for CMOS operations and must be avoided. One way to increase the immunity to Latch-up which is certainly a weakness for CMOS is to increase the distance from n+ region to the p+ region. Thus, the increase of the distance from n+ region to the p+ region to avoid Latch-up issue will also enlarge the size of the SRAM cell.

Even miniaturization of the manufacture process down to the 28 nm or lower (so called, "minimum feature size", "$\lambda$", or "F"), due to the above mentioned issues, such as interference among the size of the contacts, among layouts of the metal wires connecting the word-line (WL), (BL and BL Bar), high level voltage VDD, and low level voltage VSS, etc., the total area of the SRAM cell represented by $\lambda^2$ or $F^2$ dramatically increases when the minimum feature size decreases, as shown in FIG. 2B (cited from J. Chang et al., "15.1 A 5 nm 135 Mb SRAM in EUV and High-Mobility-Channel FinFET Technology with Metal Coupling and Charge-Sharing Write-Assist Circuitry Schemes for High-Density and Low-VMIN Applications," 2020 IEEE International Solid-State Circuits Conference—(ISSCC), 2020, pp. 238-240).

Similar situation happens to logic circuit scaling. Logic circuit scaling for increased storage density, reduction in operating voltage (Vdd) for lower stand-by power consumption, and enhanced yield necessary to realize larger-capacity logic circuit become increasingly difficult to achieve. Standard cells are commonly used and basic elements in logic circuit. The standard cell may comprise basic logical function cells (such as, inverter cell, NOR cell, and NAND cell. Similarly, even miniaturization of the manufacture process down to the 28 nm or lower, due to the interference among the size of the contacts and layouts of the metal wires, the total area of the standard cell represented by $\lambda^2$ or $F^2$ dramatically increases when the minimum feature size decreases. FIG. 3A shows the "stick diagram" representing the layout and connection among PMOS and NMOS transistors of one semiconductor company's (Samsung) 5 nm (UHD) standard cell. The stick diagram majorly illustrates active regions (horizontal bar) and gate lines (vertical white bar). Hereinafter, the active region could be named as "fin". Of course, there are still lots of contacts, on one hand directly coupled to the PMOS and NMOS transistors, and on the other hand, coupled to the input terminal, the output terminal, high level voltage Vdd, and low level voltage VSS (or ground "GND"), etc. Especially, each transistor includes two active regions or fins (marked by horizontal darker gray bar) to form the channel of the transistor, such that the V/L ratio could be maintained within an acceptable range.

The area size of the inverter cell is equal to X×Y, wherein X=2×Cpp, Y=Cell_Height, Cpp is the distance of Contacted Poly Pitch (Cpp). It is noticed that, some active regions or fins (marked by horizontal lighter gray bar, called "dummy fins") are not utilized in PMOS/NMOS of this standard cell, the potential reason of which is likely related to the latch-up issue between the PMOS and NMOS. Thus, the latch-up distance between the PMOS and NMOS in FIG. 3A is 3×Fp, wherein Fp is the fin pitch. Based on the available data regarding Cpp (54 nm) and Cell_Height (216 nm) in the Samsung 5 nm (UHD) standard cell, the cell area can be calculated by X×Y equal to 23328 nm$^2$ (or 933.12$\lambda^2$, wherein Lambda ($\lambda$) is the minimum feature size as 5 nm). FIG. 3B illustrates the Samsung 5 nm (UHD) standard cell and the dimensions thereof. As shown in FIG. 3B, the latch-up distance between PMOS and NMOS is 15$\lambda$, Cpp is 10.8$\lambda$, and cell Height is 43.2$\lambda$.

The scaling trend regarding area size (2 Cpp×cell Height) v. different process technology node for three foundries could be shown in FIG. 3C. As the technology node decreases (such as, from 22 nm down to 5 nm), it is clear that the conventional standard cell (2 Cpp×Cell_Height) area size in term of $\lambda^2$ increases dramatically. In the conventional standard cell, the smaller the technology node, the higher the area size in term of $\lambda^2$. Such dramatic increase $\lambda^2$, no matter in SRAM or logic circuit, may be caused by the difficulty to proportionally shrink the size of gate contact/source contact/drain contact as $\lambda$ decreases, the difficulty to proportionally shrink the latch-up distance between the PMOS and NMOS, and the interference in metal layers as $\lambda$ decreases, etc.

From another point of view, any SOC, AI, NPU (Network Processing Unit), GPU, CPU, FPGA etc. currently they are using monolithic integration to put more circuits as many as possible. But, as shown in FIG. 4A, maximizing die area of each monolithic die will be limited by the maximum reticle size of the lithography steppers which is hard to expand because of state-of-the-art existing photolithography exposure tools. For example, as shown in FIG. 4B, current i193 and EUV lithography steppers have a maximum reticle size, thus, a monolithic SOC die has a Scanner Maximum Field Area (SMFA) of 26 mm by 33 mm, or 858 mm$^2$ (https://en.wikichip.org/wiki/mask). However, for AI purpose, the high-end consumer GPU seem to run in the 500-600 mm$^2$. As a result, it's getting harder or impossible to make two or more major function blocks such as GPU and FPGA (for example) on a single monolithic die within the limitation of the SMFA. Also since the most widely used 6-Transistor CMOS SRAM cells are quite large to increase the eSRAM size enough for both major blocks, too. Additionally, the external DRAM capacity needs to be expanded, but the discrete PoP (Package on Package, eg. HBM to SOC) or POD (Package DRAM on SOC Die) is still constrained by difficulties of achieving desired performance of worse die-to-chip or package-to-chip signal interconnections.

Thus, there is a need to propose a optimized Monolithic/Heterogeneous integration structure for a single semiconductor die, even without shrinking the technology node or minimum feature size λ, to optimize the dimension of standard cell/SRAM cell in a monolithic SOC die within the limitation of the SMFA and solve the above-mentioned problems such that more powerful and efficient SOC or AI single chip in the near future could come true.

SUMMARY OF THE INVENTION

An embodiment of the present invention provides a first monolithic die, the first monolithic die comprises: a first schematic circuit manufactured based on a first technology node; wherein a die area of the first monolithic die is smaller than a die area of a second monolithic die with a second schematic circuit made based on the first technology node; and the first schematic circuit is the same as the second schematic circuit; wherein the first schematic circuit is a SRAM circuit, a logic circuit, a combination of SRAM and logic circuit, or a major function block circuit.

According to another aspect of the invention, the second schematic circuit occupies an area between 20%~90% of the die area of the second monolithic die.

According to another aspect of the invention, the first schematic circuit occupies $Ynm^2$ in the first monolithic die and the second schematic circuit occupies $Xnm^2$ in the second monolithic die, and X>Y.

According to another aspect of the invention, Y is between 20%~90% of X.

Yet another embodiment of the present invention is to provide a first monolithic die, the first monolithic die comprises: a first schematic circuit formed in the first monolithic die; and a second schematic circuit formed in the first monolithic die; wherein the first monolithic die has a first scanner maximum field area, and the first schematic circuit occupies a first portion of the first scanner maximum field area and the second schematic circuit occupies a second portion of the first scanner maximum field area; wherein the scanner maximum field area of the first monolithic die is the same as a second scanner maximum field area of a second monolithic die, the second monolithic die has the first schematic circuit, and an area of the first schematic circuit in the second monolithic die is between 50%~90% of the second scanner maximum field area of the second monolithic die.

According to another aspect of the invention, the first schematic circuit is a SRAM circuit, a combination of a SRAM circuit and a logic circuit, or a major function block circuit.

According to another aspect of the invention, the first schematic circuit is selected from a group consisting of GPU, CPU, TPU, NPU, and FPGA.

According to another aspect of the invention, the first scanner maximum field area or the second scanner maximum field area is not greater than 26 mm by 33 mm or 858 $mm^2$.

Yet another embodiment of the present invention is to provide a first monolithic die, the first monolithic die comprises: a first schematic circuit manufactured by performing a predetermined manufacture steps based on a first technology node; wherein a die area of the first monolithic die is smaller than a die area of a second monolithic die with a second schematic circuit which is made based on the first technology node without performing the predetermined manufacture steps.

According to another aspect of the invention, the first schematic circuit is the same as the second schematic circuit.

According to another aspect of the invention, the second schematic circuit occupies an area between 20%~90% of the die area of the second monolithic die.

According to another aspect of the invention, the first schematic circuit occupies $Ynm^2$ in the first monolithic die and the second schematic circuit occupies $Xnm^2$ in the second monolithic die, and X>Y.

According to another aspect of the invention, wherein Y is between 20%~90% of X.

According to another aspect of the invention, wherein the first schematic circuit is a SRAM circuit, a logic circuit, a combination of SRAM and logic circuit, or a major function block circuit.

Yet another embodiment of the present invention is to provide a monolithic die, the monolithic die comprises: a first processing unit circuit formed in the monolithic die, the first processing unit circuit with a plurality of a first logic core circuits, and each first logic core circuit corresponding to a first cache memory; and a second processing unit circuit formed in the monolithic die, the second processing unit circuit with a plurality of a second logic core circuits, and each second logic core circuit corresponding to a second cache memory; wherein a scanner maximum field area of the monolithic die is defined by a specific technology node.

According to another aspect of the invention, the scanner maximum field area of the monolithic die is not greater than 26 mm by 33 mm, or 858 $mm^2$.

According to another aspect of the invention, a major function performed by the first processing unit circuit is different from a major function performed by the second processing unit circuit.

According to another aspect of the invention, the first processing unit circuit or the second processing unit circuit is selected from a group consisting of GPU, CPU, TPU, NPU, and FPGA.

According to another aspect of the invention, the monolithic die further comprises a third cache memory, wherein the third cache memory is configurable and utilized by the first processing unit circuit and the second processing unit circuit during operation of the monolithic die.

According to another aspect of the invention, the first cache memory, the second cache memory, and the third cache memory are made of SRAM.

Yet another embodiment of the present invention is to provide a monolithic die, the monolithic die comprises; a first processing unit circuit formed in the monolithic die, the first processing unit circuit with a plurality of a first logic core circuits, and each first logic core circuit corresponding to a first cache memory; and a second processing unit circuit formed in the monolithic die, the second processing unit circuit with a plurality of a second logic core circuits, and each second logic core circuit corresponding to a second cache memory; wherein a major function performed by the first processing unit circuit is different from a major function performed by the second processing unit circuit.

According to another aspect of the invention, the first processing unit circuit or the second processing unit circuit is selected from a group consisting of GPU, CPU, TPU, NPU, and FPGA.

According to another aspect of the invention, the monolithic die further comprises a third cache memory, wherein the third cache memory is shared and utilized by the first processing unit circuit and the second processing unit circuit during operation of the monolithic die.

Yet another embodiment of the present invention is to provide a monolithic die, the monolithic die comprises: a first processing unit circuit formed in the monolithic die, the first processing unit circuit formed with a plurality of a first logic core circuits, and each first logic core circuit corresponding to a low level cache memory; and a high level cache memory utilized by the first processing unit circuit; wherein a sum of a size of all of the low level cache memory and a size of the high level cache memory is at least 64 MB.

According to another aspect of the invention, a scanner maximum field area of the monolithic die is defined by a photolithography exposure tool utilized for a technology processing node.

According to another aspect of the invention, the scanner maximum field area of the monolithic die is not greater than 26 mm by 33 mm or 858 mm$^2$.

According to another aspect of the invention, the low level cache memory includes a L1 cache and a L2 cache, and a size of L2 cache is greater than a size of the L1 cache.

According to another aspect of the invention, the high level cache memory includes a L3 cache shared and utilized by the plurality of the first logic core circuits.

According to another aspect of the invention, the monolithic die further comprises a second processing unit circuit formed in the monolithic die, the second processing unit circuit with a plurality of a second logic core circuits, and each second logic core circuit corresponding to a second cache memory; wherein the high level cache memory includes a L4 cache shared and utilized by the first processing unit circuit and the second processing unit circuit.

According to another aspect of the invention, the L4 cache is shared and utilized by the first processing unit circuit and the second processing unit circuit according to a setting of a mode register.

Yet another embodiment of the present invention is to provide a manufacture method for a monolithic die with a set of CMOS circuit, the manufacture method comprises the following steps: based on a conventional technology node, performing a first set of steps to redefine a dimension of a plurality of transistors in the set of CMOS circuit of the monolithic die; and based on the conventional technology node, performing a second set of steps to interconnect the plurality of transistors to other metal layers in the monolithic die; wherein a new size of the monolithic die made by the first set of steps and the second set of steps is smaller than an original size of another monolithic die with the same set of CMOS circuit which is made based on the conventional technology node without performing the first set of steps and the second set of steps.

According to another aspect of the invention, the new size of the monolithic die made by the first set of steps and the second set of steps is less than 50% of the original size of the another monolithic die.

According to another aspect of the invention, the new size of the monolithic die made by the first set of steps and the second set of steps is less than 35% of the original size of the another monolithic die when the conventional technology node is 5 nm.

Yet another embodiment of the present invention is to provide a manufacture method for a monolithic die with a scanner maximum field area defined by a conventional technology node, the manufacture method comprises the following steps: based on the conventional technology node, performing a first set of steps to redefine a dimension of a plurality of transistors in the monolithic die; and based on conventional technology node, performing a second set of steps to interconnect the plurality of transistors to other metal layers in the monolithic die; wherein a volume of SRAM in the monolithic die made by the first set of steps and the second set of steps is greater than that in the monolithic die which is made based on the conventional technology node without performing the first set of steps and the second set of steps.

According to another aspect of the invention, the monolithic die with the scanner maximum field area defined by the conventional technology node has a first processing unit circuit and a second processing unit circuit, and a major function performed by the first processing unit circuit is different from a major function performed by the second processing unit circuit.

Yet another embodiment of the present invention is to provide a platform to reconfigure memory architecture of a chip system, wherein the chip system comprises a first monolithic die to be connected to a first DRAM memory with a first predetermined volume, the first monolithic die includes a first logic circuit and a first SRAM memory. The platform comprises a second monolithic die to be connected to a second DRAM memory with a second predetermined volume, wherein the second monolithic die includes a second logic circuit and a second SRAM memory. Wherein the first monolithic die has a scanner maximum field area based on a targeted technology node and the second monolithic die has the scanner maximum field area based on the targeted technology node; wherein the first logic circuit is the same as the second logic circuit, and the area of the first logic circuit in the first monolithic die is greater than the area of the second logic circuit in the second monolithic die; wherein the volume of the first SRAM memory is smaller than the volume of the second SRAM memory, such that the second predetermined volume of the second DRAM memory is smaller than the first predetermined volume of the first DRAM memory.

According to another aspect of the invention, the second DRAM memory is external to the second monolithic die, the second DRAM memory and the second monolithic die are enclosed in a single package. Moreover, the second DRAM memory is an embedded DRAM chip. Furthermore, the first DRAM memory is external to the first monolithic die, the first DRAM memory and the first monolithic die are enclosed in another single package. Moreover, the first DRAM memory is an embedded DRAM chip.

According to another aspect of the invention, the sum of the area of the first logic circuit and the area of the first SRAM memory occupies at least 80%~90% of the scanner maximum field area of the first monolithic die, and the sum of the area of the second logic circuit and the area of the second SRAM memory occupies at least 80%~90% of the scanner maximum field area of the second monolithic die. Wherein, the second DRAM memory is an embedded DRAM chip external to the second monolithic die, and the second DRAM memory and the 5 second monolithic die are enclosed in a single package.

The advantages and spirits of the invention may be understood by the following recitations together with the appended drawings. These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 20A~20C, 21A~21C, 22A~22C, and 23A~23C are a series top views and cross-sectional views illustrating the manufacture method for forming a device having a transistor structure according to one embodiment of the present disclosure.

FIGS. 24D~24F are a top view and cross-sectional views illustrating another device having a transistor structure according to yet another embodiment of the present disclosure.

FIG. 34B shows the Cpp, fin pitch and Cell_Height across different technology nodes from three different foundries and the present invention.

DETAILED DESCRIPTION

As previously mentioned, in currently conventional SRAM cell or logic cell, even miniaturization of the minimum feature size or technology node is down to the 28 nm or lower, the size of transistor could not be diminished proportionally. Hereinafter, "technology node" means the specific semiconductor manufacturing process announced by foundries (such as N5, N7 announced by Taiwan Semiconductor Manufacturing Company Limited), or related data published by third parties (such as, wikichip, https://en.wikichip.org/). Different nodes often imply different circuit generations and architectures. Generally, the smaller the technology node means the smaller the feature size, producing smaller transistors which are both faster and more power-efficient. The term of "minimum feature size" is synonym of the term "technology node". The terms of "contacted poly pitch" (or Cpp) and "fin pitch" are well defined in the semiconductor industry. "Fin width" means the bottom width of the fin structure of FinFet or Tri-gate transistor.

First of all, the present invention discloses a miniaturized transistor structure in which the linear dimensions of the source, the drain and the gate of the miniaturized transistor are precisely controlled, and the linear dimension can be as small as the minimum feature size ($\lambda$). Therefore, when two adjacent transistors are connected together through the drain/source, the distance between the edges of the gates of the two adjacent transistors could be as small as $2\lambda$. Additionally, a linear dimension for a contact hole for the source, the drain and the gate could be less than $\lambda$, such as $0.6\lambda \sim 0.8\lambda$.

Figure 5:
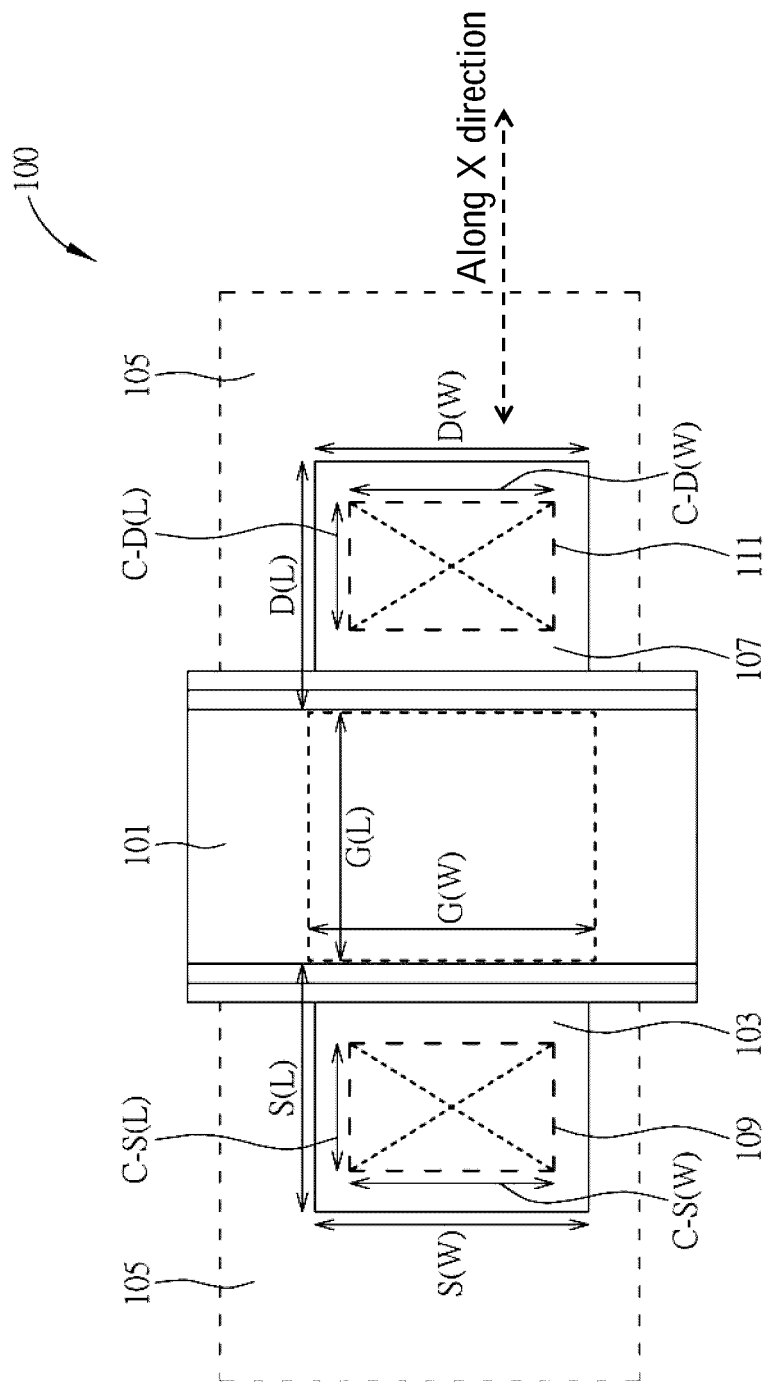
FIG. 5 is a diagram illustrating a top view of a miniaturized metal-oxide-semiconductor field-effect transistor (mMOSFET) according to the present invention.

FIG. 5 is an example of a miniaturized metal oxide semiconductor field effect transistor (mMOSFET) 100 according to the present invention. As shown in FIG. 5, the mMOSFET 100 includes: (1) a gate structure 101 has a length G(L) and a width G(W), (2) on a left-hand side of the gate structure 101, a source 103 has a length S(L) which is a linear dimension from an edge of the gate structure 101 to an edge of an isolation region 105 and a width S(W), (3) on a right-hand side of the gate structure 101, a drain 107 has a length DM which is a linear dimension from the edge of the gate structure 101 to the edge of the isolation region 105 and a width D(W), (4) at a center of the source 103, a contact-hole 109 formed by a self-alignment technology has length and width of an opening labeled as C-S(L) and C-S(W), respectively, and (5) similarly at a center of the drain 107, a contact hole 111 formed by the self-alignment technology has length and width of an opening labeled as C-D(L) and C-D(W), respectively. The length G(L), the length D(L), and the length S(L) could be precisely controlled as small as the minimum feature size $\lambda$. Furthermore, the length and width of an opening labeled as C-S(L) and C-S(W) or the length and width of an opening labeled as D-S(L) and D-S(W) could be less than $\lambda$, such as $0.6\lambda \sim 0.8\lambda$.

The following briefly describes the manufacture process for the aforesaid mMOSFET 100. The detailed description for the structure of the mMOSFET 100 and the manufacture process thereof is presented in the U.S. patent application Ser. No. 17/138,918, filed on Dec. 31, 2020 and entitled: "MINIATURIZED TRANSISTOR STRUCTURE WITH CONTROLLED DIMENSIONS OF SOURCE/DRAIN AND CONTACT-OPENING AND RELATED MANUFACTURE METHOD", and the whole content of the U.S. patent application Ser. No. 17/138,918 is incorporated by reference herein.

Figure 6:
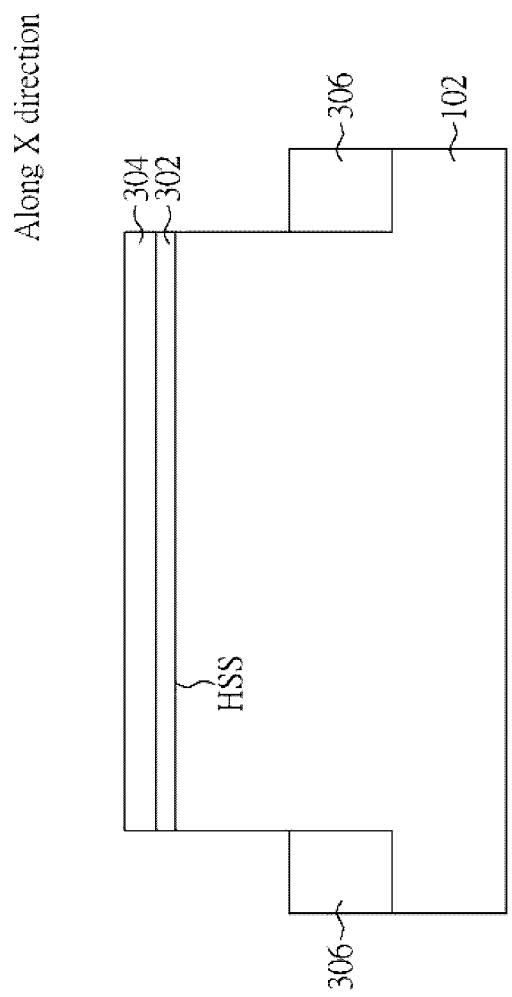
FIG. 6 is a diagram illustrating a cross-section of pad-oxide layer, the pad-nitride layer on the substrate, and the STI-oxide1 formed in the substrate.

As shown in FIG. 6, a pad-oxide layer 302 is formed and a pad-nitride layer 304 is deposited on the substrate 102. The active region of the mMOSFET is also defined and remove parts of silicon material outside the active region to create the trench structure. An oxide-1 layer is deposited in the trench structure and etched back to form a shallow trench isolation (STI-oxide1) 306 below the original horizontal surface of the silicon substrate ("HSS").

Figure 7:
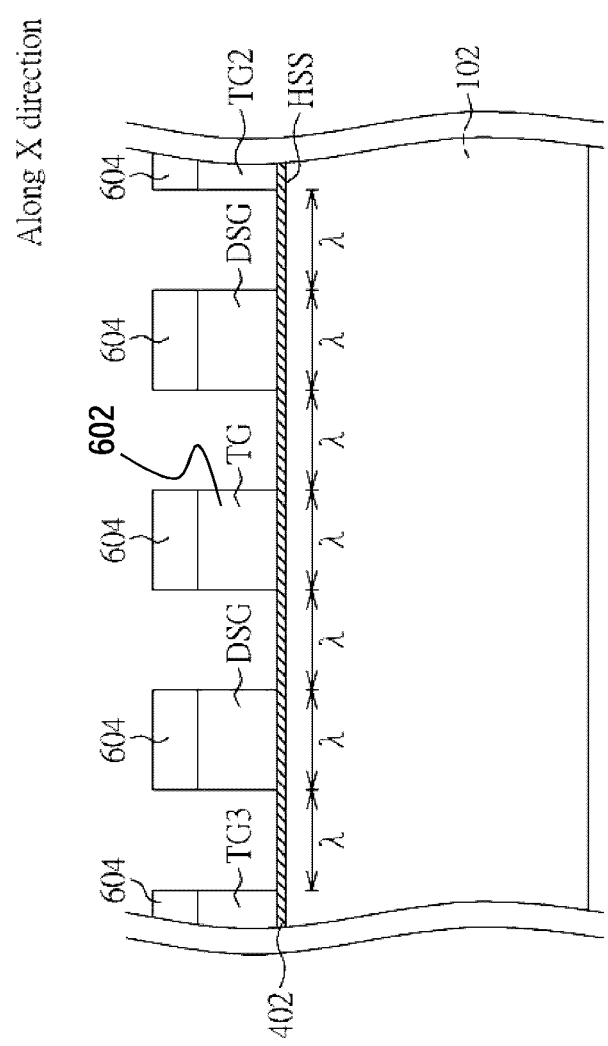
FIG. 7 is a diagram illustrating the true gate (TG) and the dummy shield gate (DSG) formed on above the active region.

The pad-oxide layer 302 and the pad-nitride layer 304 are removed, and a dielectric insulator 402 is formed over the HSS. Then, a gate layer 602 and a nitride layer 604 are deposited above the HSS, and the gate layer 602 and the nitride layer 604 are etched to form a true gate (TG) of the mMOSFET and dummy shield gates (DSG) with a desired linear distance to the true gate, as shown in FIG. 7. As shown in FIG. 7, the length of the true gate is and the dummy shield gate is $\lambda$, the length of the dummy shield gate is also $\lambda$, and the distance between the edges of the true gate and the dummy shield gate is $\lambda$ as well. Of course, for relaxation purpose, those lengths and distance could be greater than $\lambda$ depending on the requirement.

Figure 8:
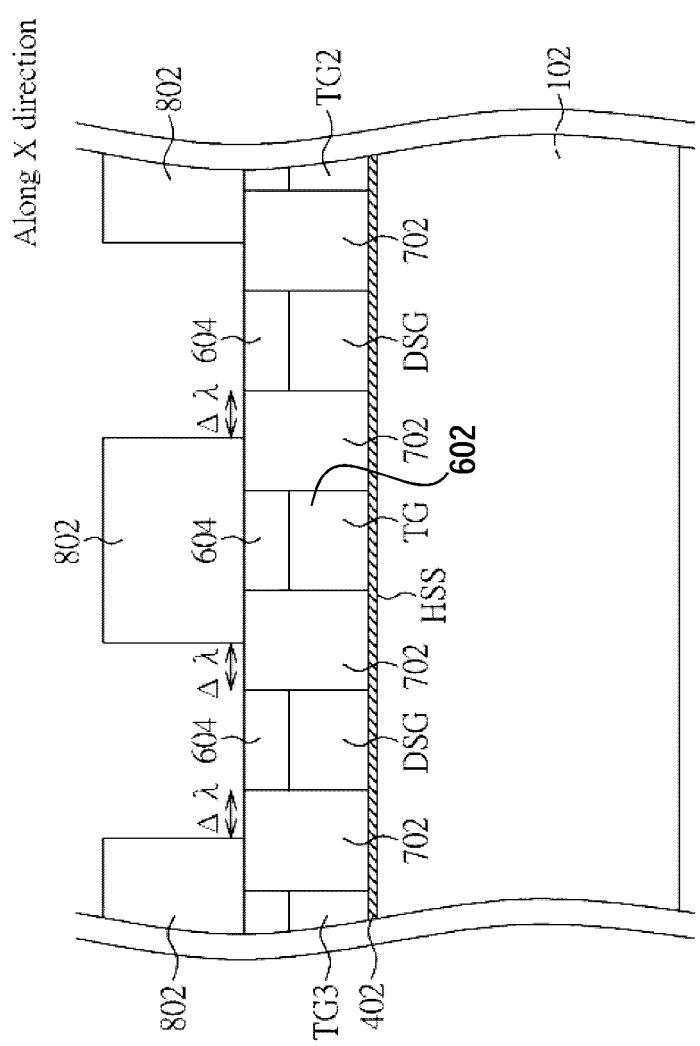
FIG. 8 is a diagram illustrating the spin-on dielectrics (SOD) being deposited, and a well-designed gate mask layer being deposited and etched.
Figure 9:
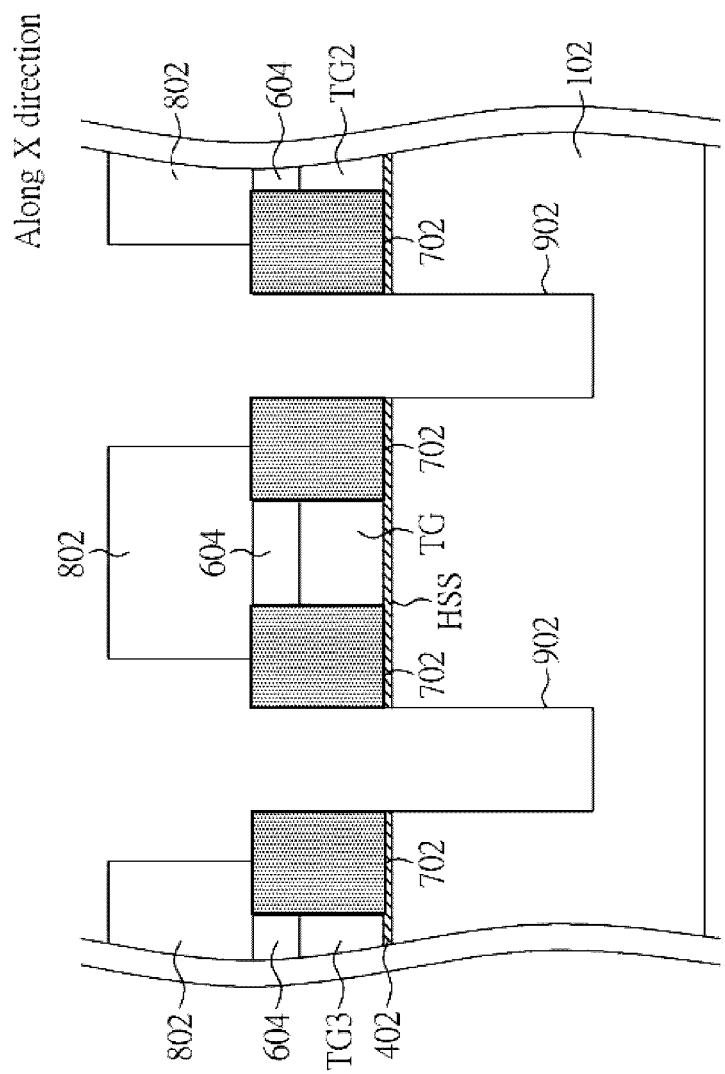
FIG. 9 is a diagram illustrating the nitride layer above the dummy shield gate (DSG), the DSG, portion of the dielectric insulator corresponding to the DSG, and the p-type substrate 102 corresponding to the DSG are removed.

Then, deposit a spin-on dielectrics (SOD) 702, and then etch back the SOD 702. Form a well-designed gate mask layer 802 by the photolithographic masking technique, as shown in FIG. 8. Thereafter, utilize the anisotropic etching technique to remove the nitride layer 604 above the dummy shield gate (DSG), and then remove the gate layer of the DSG, portion of the dielectric insulator 402 corresponding to the DSG, and the p-type substrate 102 corresponding to the DSG, as shown in FIG. 9.

Figure 10:
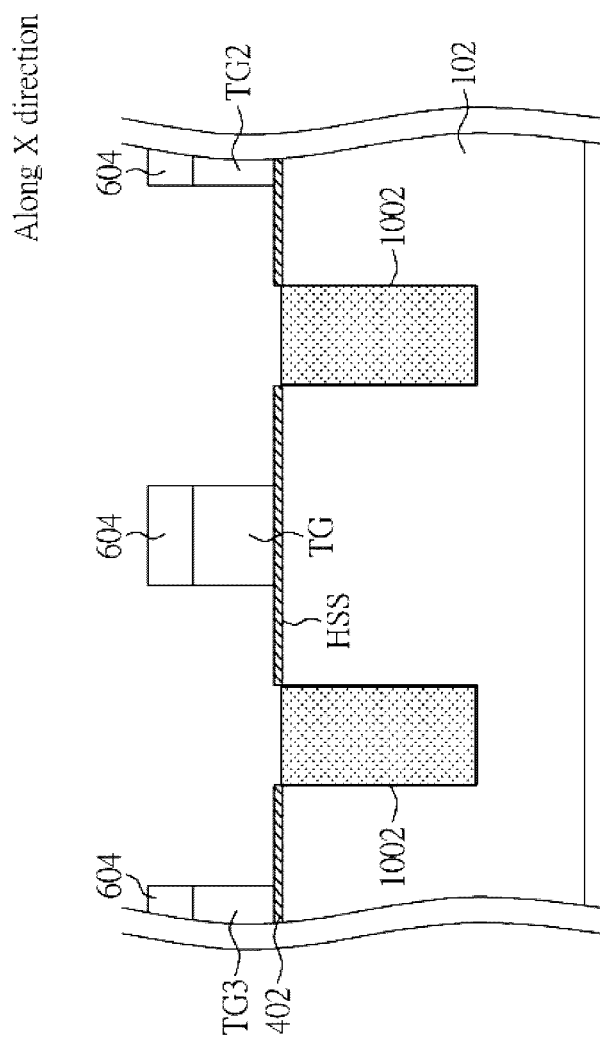
FIG. 10 is a diagram illustrating the gate mask layer being removed, the SOD being etched, and an oxide-2 layer being deposited to form a STI-oxide2.
Figure 11:
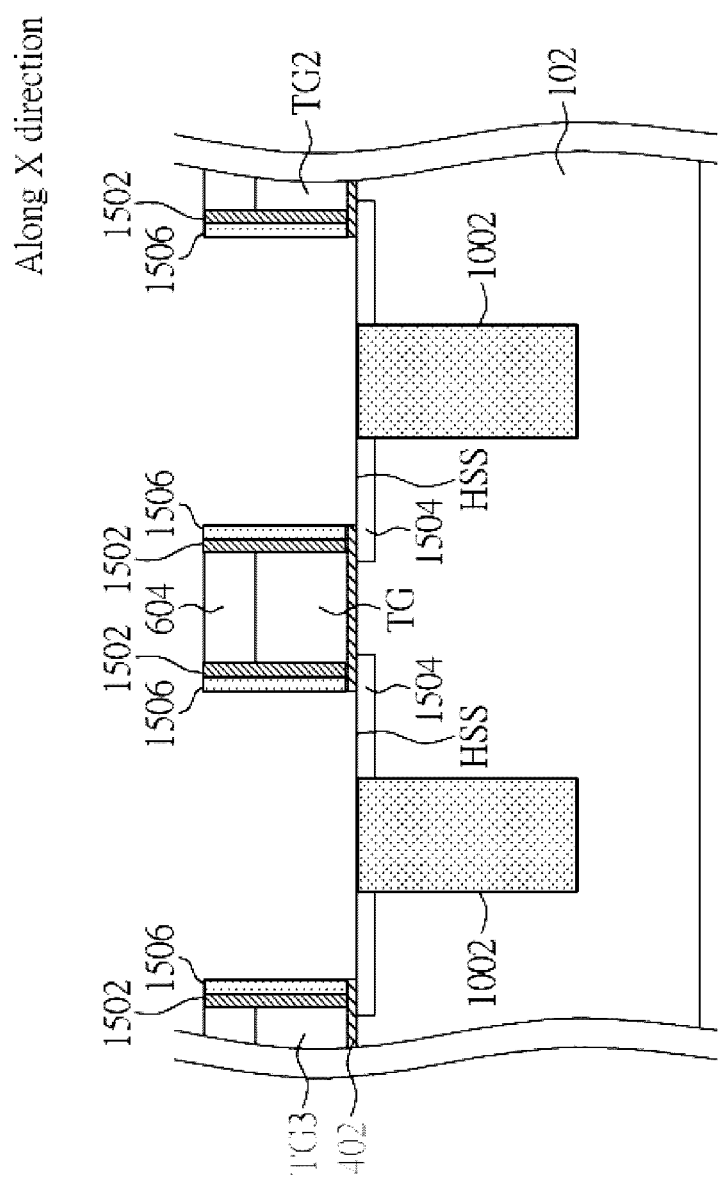
FIG. 11 is a diagram illustrating the oxide-3 layer being deposited and etched to form the oxide-3 spacer, the lightly Doped drains (LDDs) being formed in the p-type substrate, the nitride layer being deposited and etched back to form the nitride spacer, and the dielectric insulator being removed.

Furthermore, remove the gate mask layer 802, etch the SOD 702, and deposit a STI-oxide-2 1002 and then etch back, as shown in FIG. 10. Then, deposit and etch back an oxide-3 layer to form an oxide-3 spacer 1502, form the lightly doped drains (LDDs) 1504 in the p-type substrate 102, deposit and etch back a nitride layer to form a nitride spacer 1506, and remove the dielectric insulator 402, as shown in FIG. 11.

Figure 12:
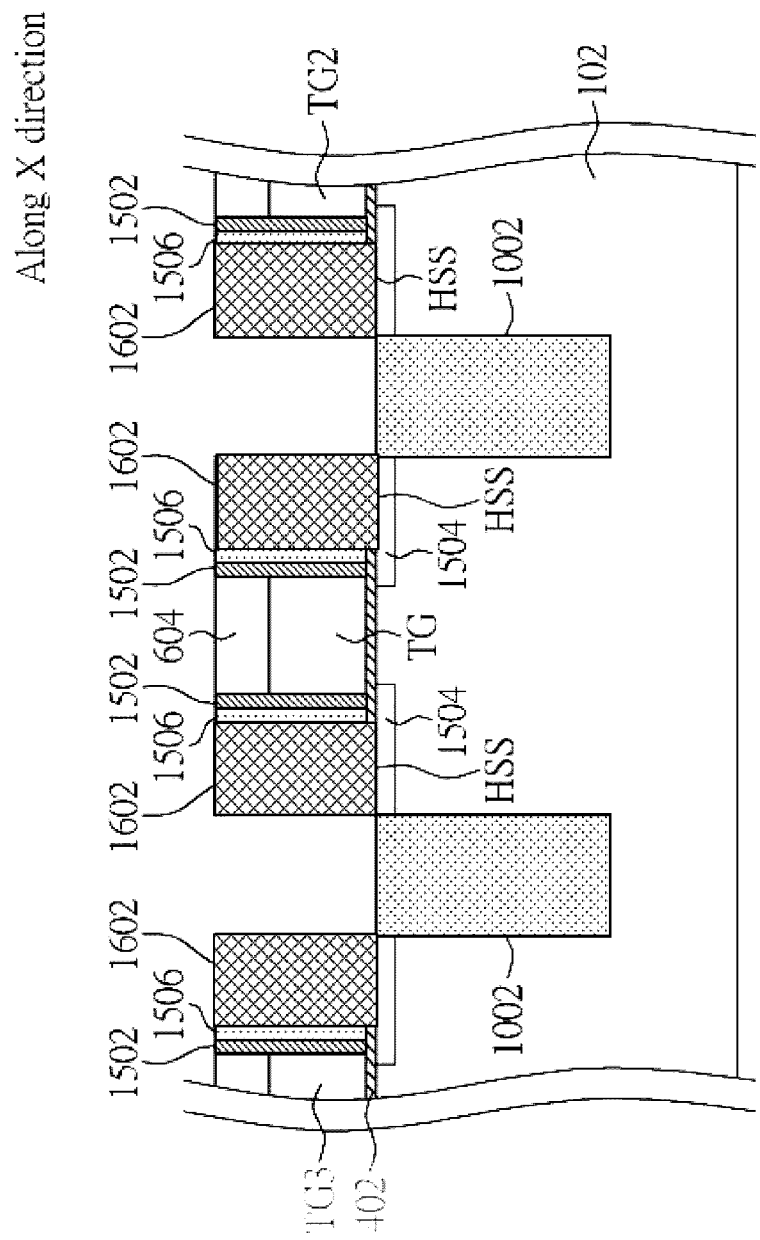
FIG. 12 is a diagram illustrating the intrinsic silicon electrode being grown by the selective epitaxy growth (SEG) technique.
Figure 13:
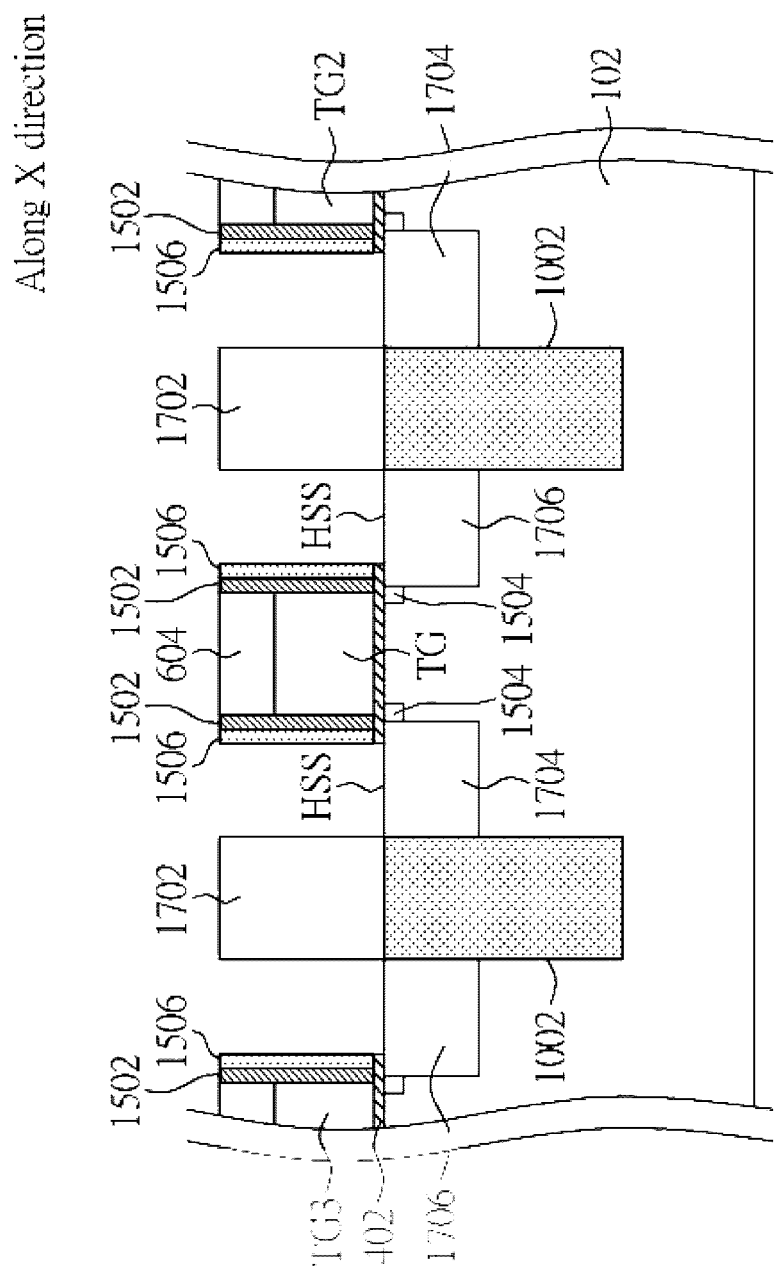
FIG. 13 is a diagram illustrating the CVD-STI-oxide3 layer being deposited and etched back, the intrinsic silicon electrode being removed, and the source (n+ source) and the drain (n+ drain) of the mMOSFET being formed.
Figure 14:
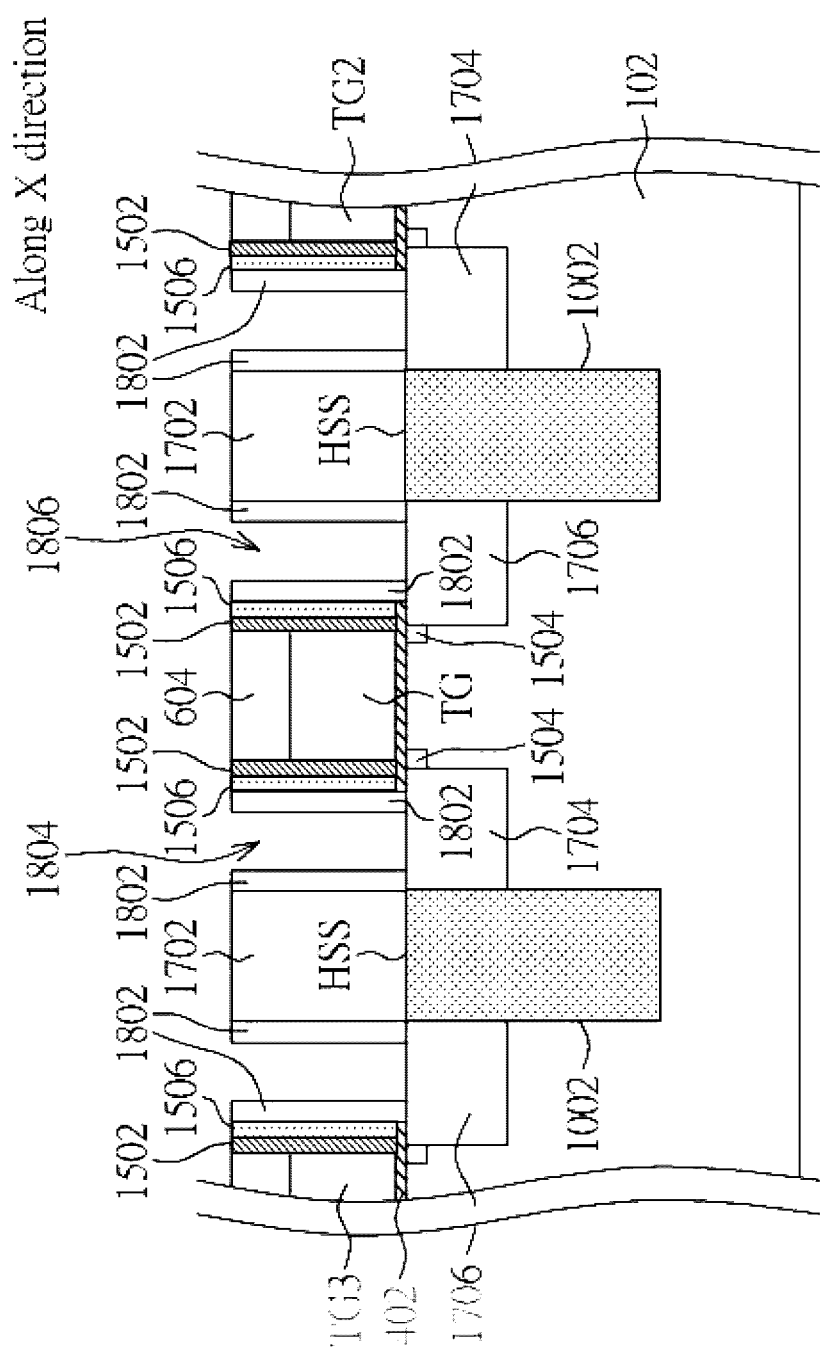
FIG. 14 is a diagram illustrating the oxide spacer being deposited and etched to form the contact-hole openings.

Moreover, utilize a selective epitaxy growth (SEG) technique to grow intrinsic silicon electrode 1602, as shown in FIG. 12. Then deposit and etch back a CVD-STI-oxide3 layer 1702, remove the intrinsic silicon 1602, and form a source region (n+ source) 1704 and a drain region (n+ drain) 1706 of the mMOSFET, as shown in FIG. 13. Since the source region (n+ source) 1704 and a drain region (n+ drain) 1706 are formed between the true gate (TG) and the CVD-STI-oxide3 layer 1702 the location of which is originally occupied by the dummy shield gate (DSG), thus, the length and width of the source region (n+ source) 1704 (or a drain region (n+ drain) 1706) is as small as $\lambda$. The opening of the source region (n+ source) 1704 (or a drain region (n+ drain) 1706) could be less than $\lambda$, such as $0.8\lambda$. Such openings could be shrunk if further oxide spacer 1802 is formed, as shown in FIG. 14.

Figure 15A:
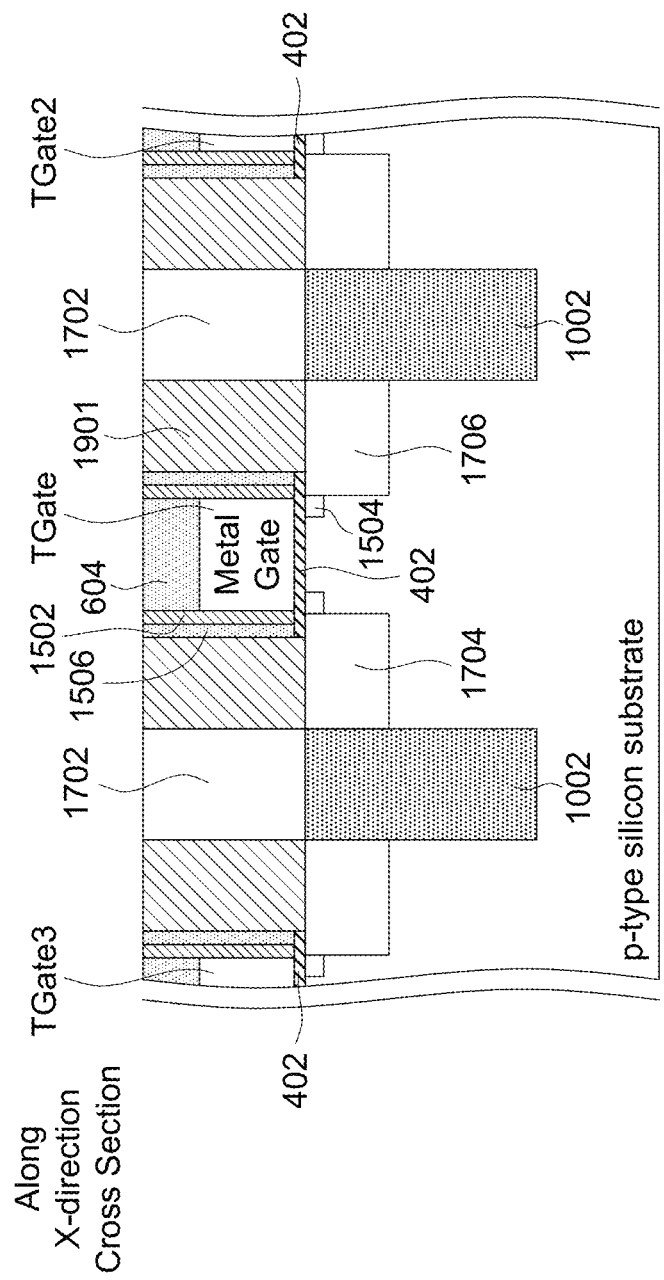
FIG. 15A is a diagram illustrating a layer of SOD is deposited to fill the vacancies on the substrate, and use CMP to make the surface flat.
Figure 15B:
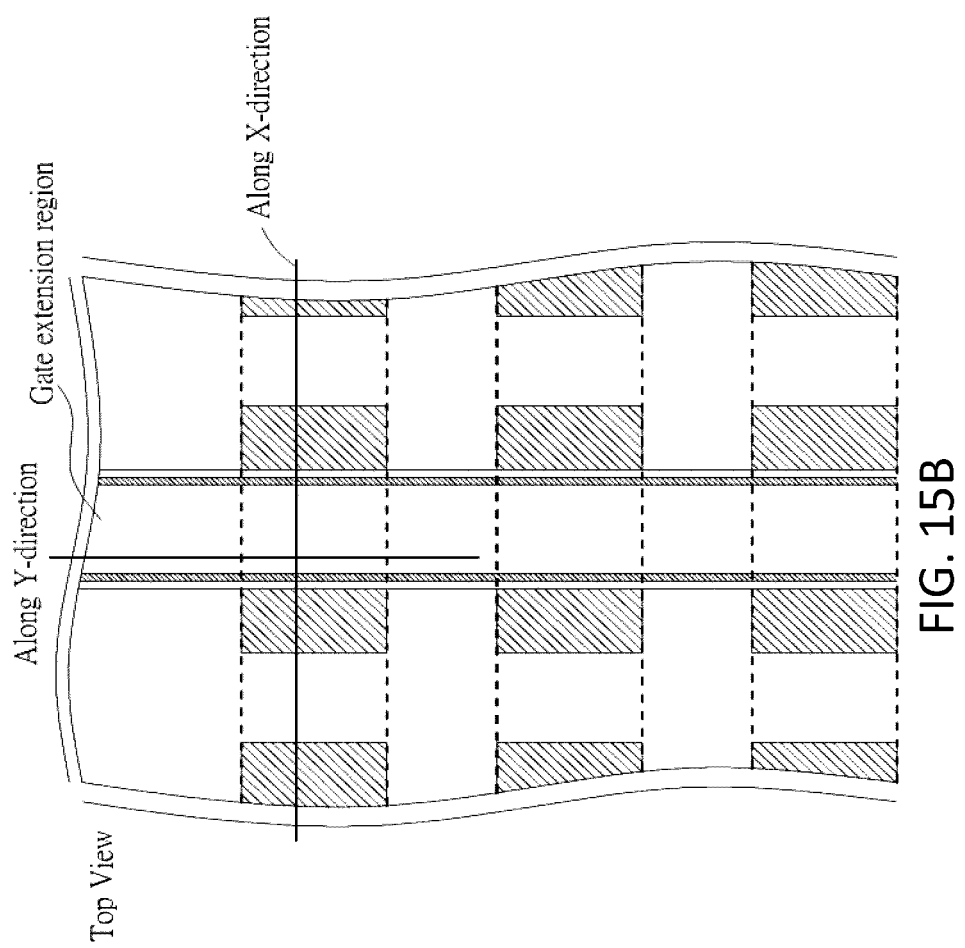
FIG. 15B is the top view of the FIG. 15A.

Additionally, the new miniaturized transistor makes the first metal interconnection (M1 layer) directly connect Gate, Source and/or Drain regions through self-aligned miniaturized contacts without using a conventional contact-hole-opening mask and/or an Metal-0 translation layer for M1 connections. Following FIG. 13, a layer of SOD 1901 is deposited to fill the vacancies on the substrate, including the openings of the source region (n+ source) 1704 (or a drain region (n+ drain) 1706). Then use CMP to make the surface flat, as shown in FIG. 15A. FIG. 15B is the top view of the FIG. 15A and shows multiple fingers in horizontal direction.

Figure 16:
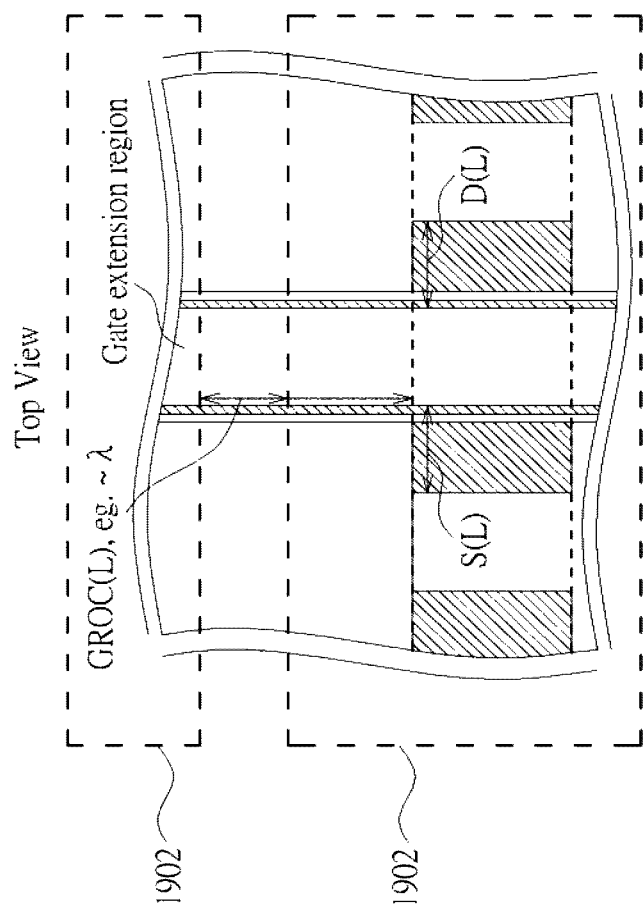
FIG. 16 is a diagram illustrating the photo resistance layer formed over the structure in FIG. 15B.
Figure 17:
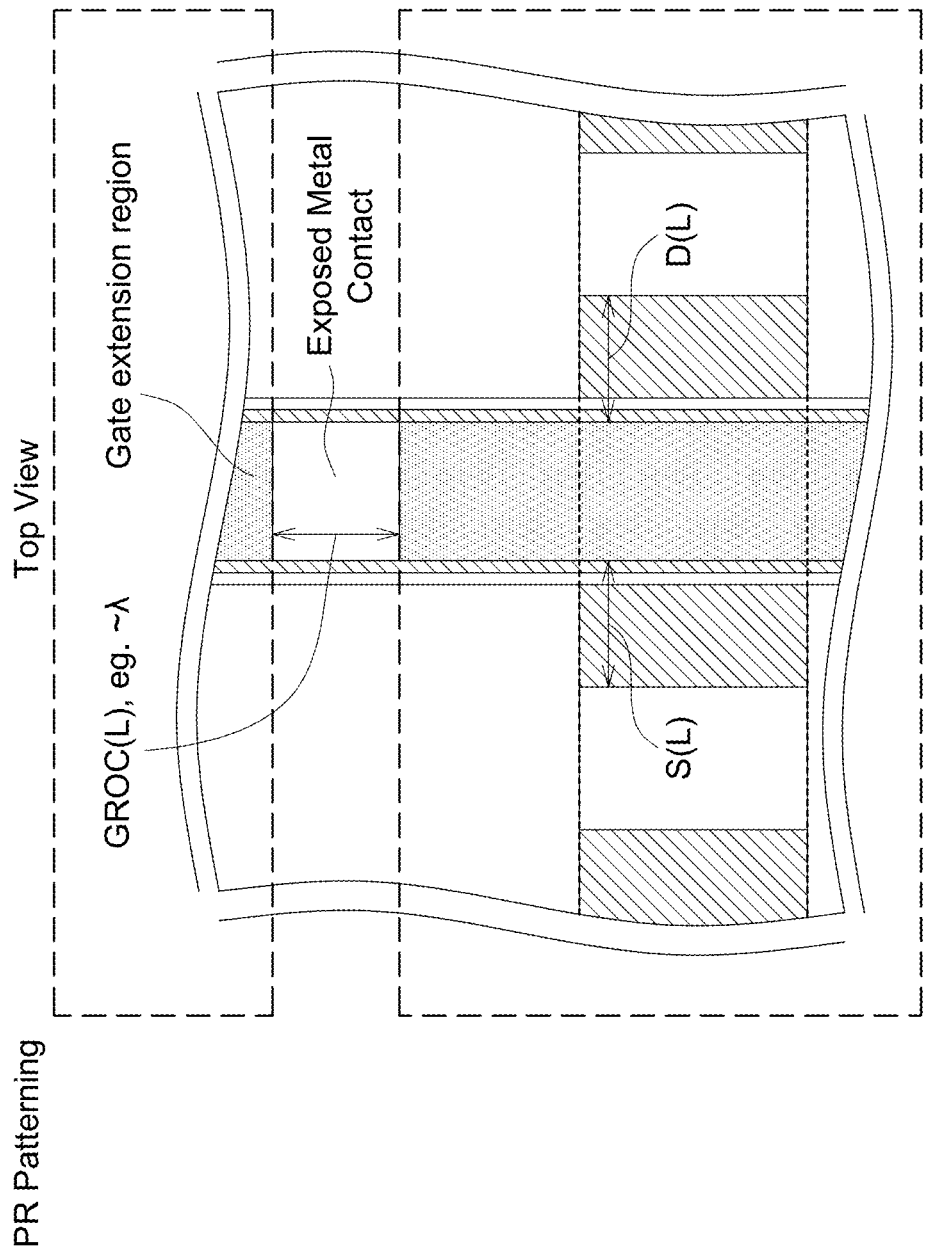
FIG. 17 is a diagram illustrating an anisotropic etching technique to remove the Nitride-cap layer within the exposed gate extension region to reveal the conductive Metal-gate layer.

Furthermore, use a well-designed mask and carry out a photo resistance layer 1902 which results in some stripe pattern along the X-axis in FIG. 15(*b*) with a separate space of the length GROC(L) to expose the area of gate extension region along the Y-axis in FIG. 15(*b*), then the result is shown as a top view in FIG. 16. The most aggressive design rules with GROC(L)=λ, as shown in FIG. 16. Then use an anisotropic etching technique to remove the Nitride-cap layer within the exposed gate extension region to reveal the conductive Metal-gate layer (FIG. 17).

Figure 18A:
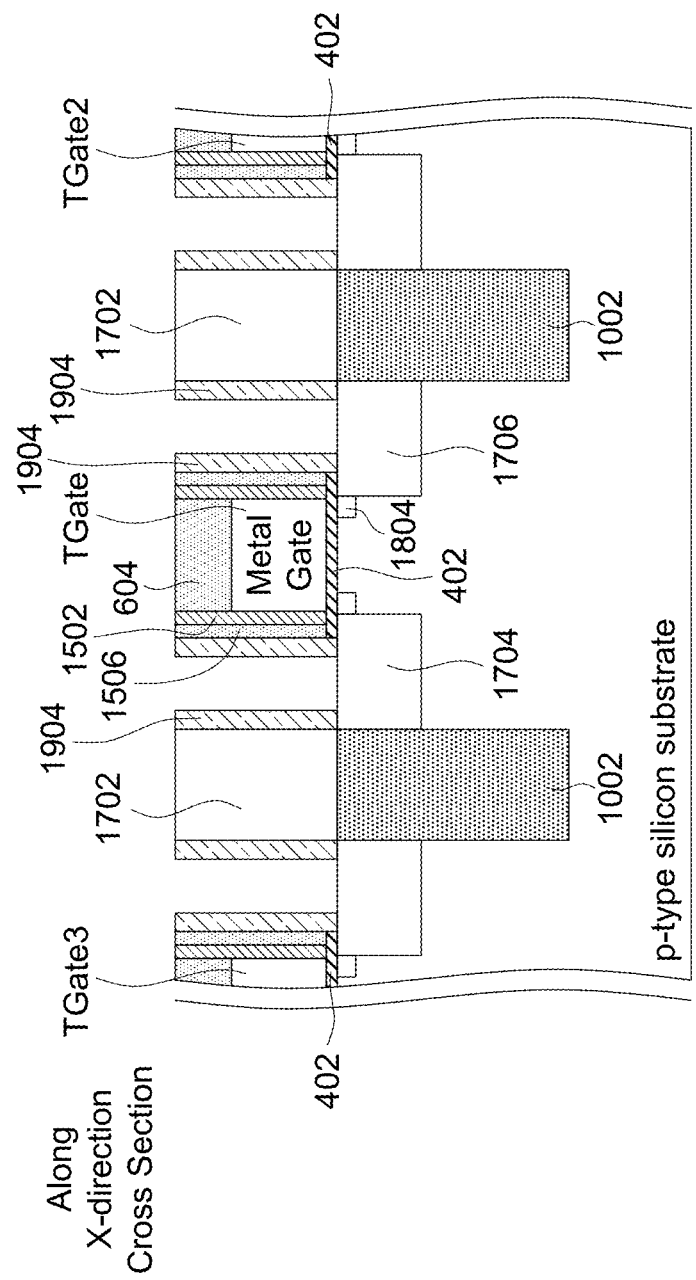
FIG. 18A is a diagram illustrating the photo resistance layer and the SOD layers being removed to form opening regions on top of both the source region and the drain region, and the spacers being formed.
Figure 18B:
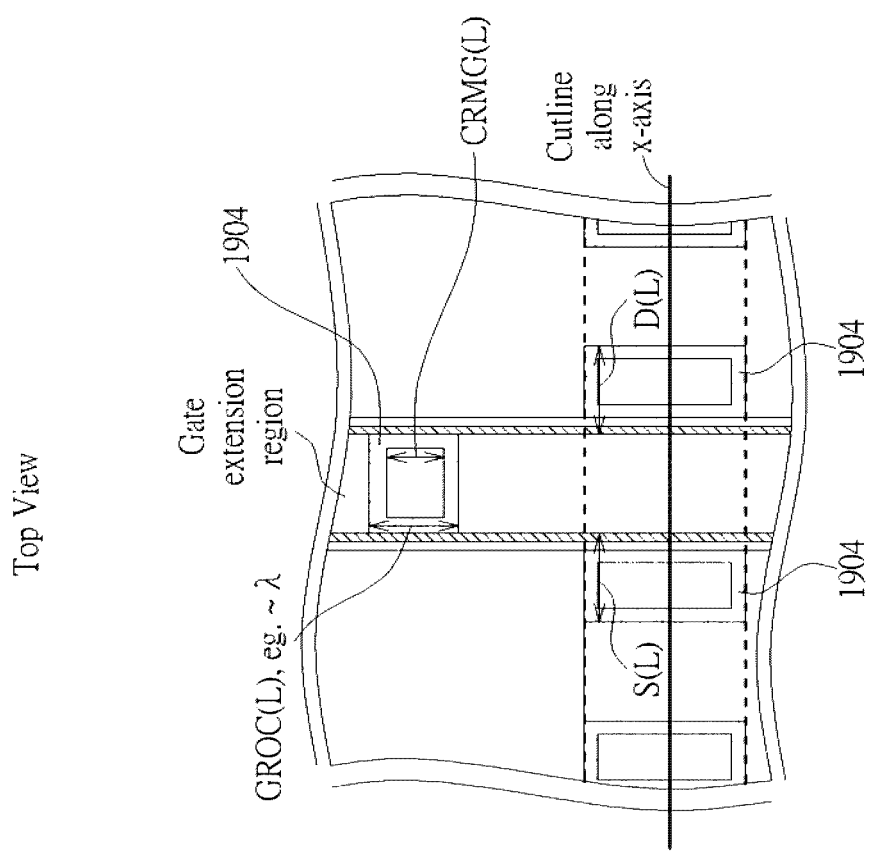
FIG. 18B is the top view of the FIG. 18A.

Thereafter, remove photo resistance layer 1902, and then remove the SOD layers 1901 so that those opening regions on top of both the source region 1704 and the drain region 1706 are revealed again. Then deposit a layer of Oxide 1904 with well-designed thickness and then use an anisotropic etching technique to form spacers on the four sidewalls in opening regions of the source region 1704 and the drain region 1706 and the exposed gate extension region 1903. Therefore, a natural built-up contact-hole opening is formed in the exposed gate extension region, the source region 1704 and the drain region 1706, respectively. FIG. 18A shows the cross section of such transistor structure, FIG. 18B shows top view of such a transistor structure in FIG. 18A. The vertical length CRMG(L) of the opening in the exposed gate extension region 1903 is smaller than the length GROC(L) which could be λ.

Figure 19A:
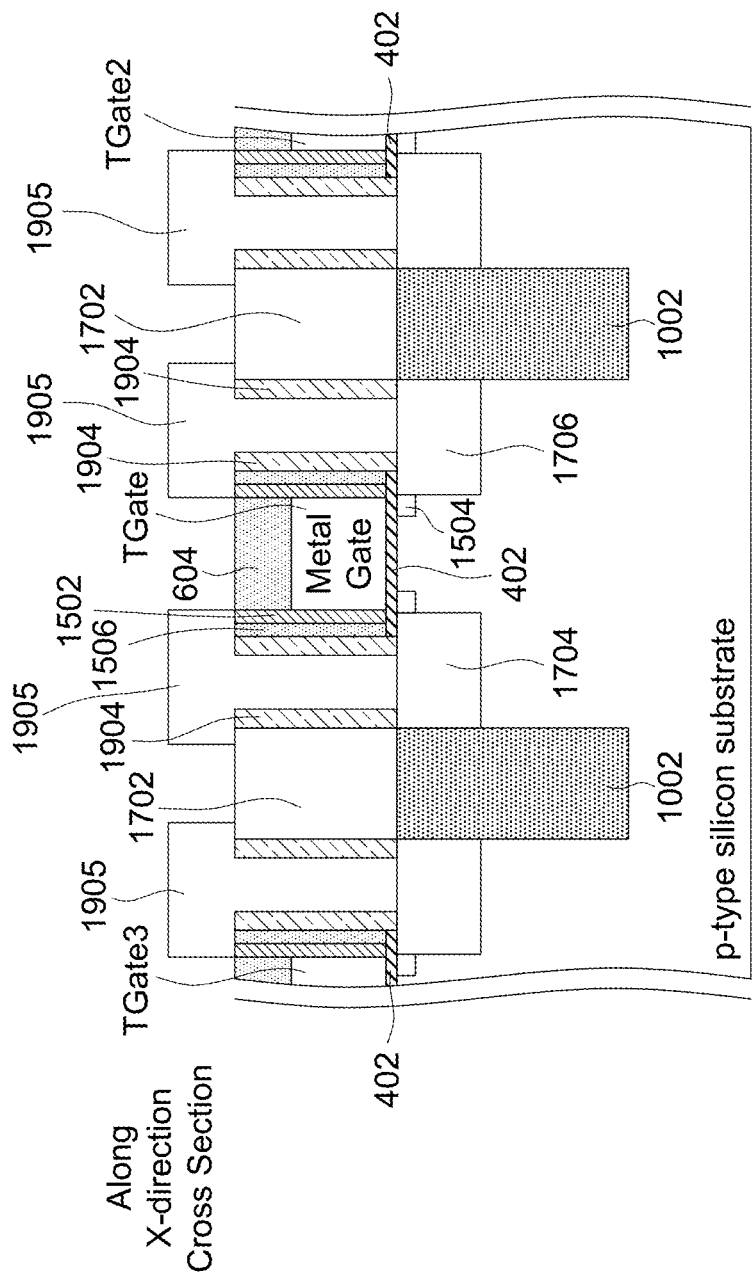
FIG. 19A is a diagram illustrating the layer of Metal-1 interconnection networks being formed.
Figure 19B:
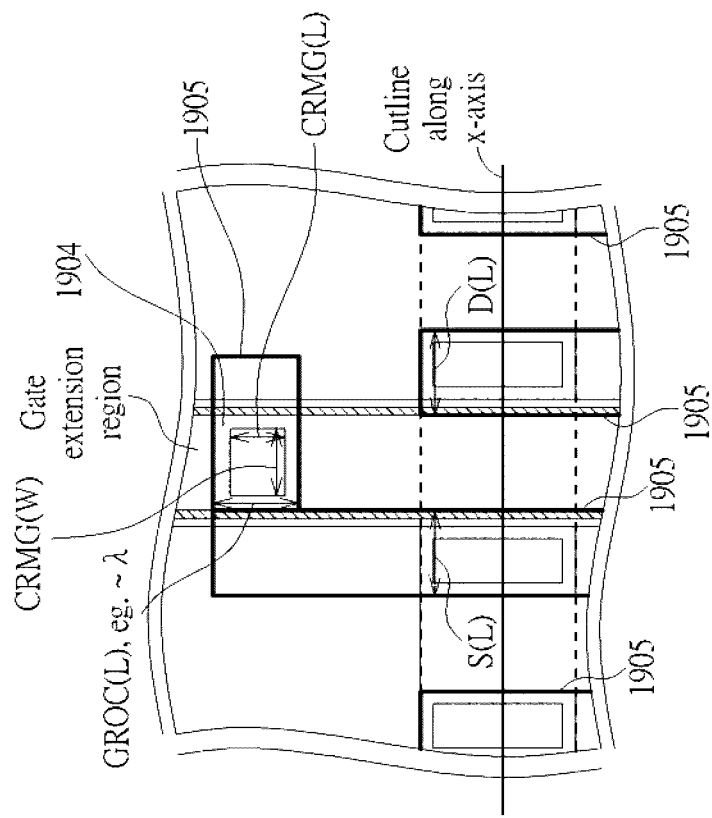
FIG. 19B is the top view of the FIG. 19A, in which the gate is connected to the source region through the Metal-1 layer.

Finally, form a layer of Metal-1 1905 which has the well-designed thickness to fill in the holes of all the aforementioned contact-hole openings and result in a smooth planar surface following the topography of the wafer surface. Then use a photolithographic masking technique to create all the connections among those contact-hole openings respectively to achieve the necessary Metal-1 interconnection networks, as shown in FIG. 19A. FIG. 19B is the top view of the mMOSFET shown in FIG. 19A. So this Metal-1 layer completes the tasks of achieving both the contact-filling and the plug-connection to both Gate and Source/Drain functions as well as a direct interconnection function of connecting all transistors. There is no need to use an expensive and very rigidly controlled conventional contact-hole mask and carrying on the subsequent very difficult process of drilling the contact-hole openings, especially which should be the most difficult challenges in further scaling down the horizontal geometries of billions of transistors. In addition, it eliminates making both a metal plug into the contact-hole openings and a CMP process to achieve a Metal stud with complex integrated processing step (eg. as definitely required for some leading-edge technology of creating a Metal-Zero structure).

Moreover, the traditional SRAM cell or standard cell may not allow the Gate or Diffusion directly connect to M2 without bypassing the M1 structure (or not allow M1 connecting to M3 without bypassing the M2 structure, or M1 connecting to Mx without bypassing the M2~Mx-1 structure or etc.) The present invention discloses a new interconnection structure in which either Gate or Diffusion (Source/Drain) areas to be directly connected to the M2 interconnection layer without a transitional layer M1 in a self-alignment way through one vertical conductive plug being composed of Contact-A and Vial-A which are respectively formed during the construction phases of making Contact and Vial in the other locations on the same die. As results, the necessary space between one M1 interconnection and the other M1 interconnection and blocking issue in some wiring connections will be reduced. The following briefly describes a new interconnection structure in which the Gate and Diffusion (Source/Drain) areas is directly connected to the M2 interconnection layer without a transitional layer M1 in a self-alignment way.

FIGS. 20A~20C shows the cross sections and the top view of a transistor up to its constructed phase of making multiple opening-holes on top of both gate extension region and Diffusion region, wherein FIG. 20A is a top view of the constructed phase of the transistor, and FIGS. 20B and 20C are two cross sections of the constructed phase of the transistor along cutline C1B1 and C1B2 in FIG. 20A, respectively. As shown in FIGS. 20B and 20C, the transistor structure 100 is formed and limited by a shallow trench isolator (STI) 105. The transistor structure 100 has a gate terminal 102, a transistor channel region 103 beneath the gate terminal 102 and source/drain regions 104. The gate terminal 102 comprises a gate dielectric layer 102*a*, a gate conduction layer 102*b* formed over the gate dielectric layer 102*a* and a silicon region (or a seed region) 102*c* formed over the gate conduction layer 102*b*. The silicon region 102*c* can be made of polysilicon or amorphous silicon. The gate terminal 102 further includes a capping layer (e.g. a nitride layer) over the top of the silicon region 102*c* and further includes at least one spacer (e.g, including a nitride spacer 102*s*1 and a thermal oxide spacer 102*s*2) over the sidewalls of the gate dielectric layer 102*a*, the gate conduction layer 102*b* and the silicon region 102*c*. The first dielectric layer 120 is formed on the semiconductor substrate 101 at least covering the active area of the transistor structure 100 including the gate terminal 102 and the source/drain regions 104 as well as the STI 105.

A plurality of open holes (such as the open holes 107*a* and 107*b* are formed in the first dielectric layer 120 to reveal the top portion 11 of the silicon 102*c* region and the top portion 12 of the s source/drain regions 104. In some embodiments, the open holes 107*a* and 107*b* are formed by a photolithography process to remove portions of the first dielectric layer 120 to exposed the portion the silicon region 102*c* and the silicon region of the drain terminal of the source/drain regions 104. In one example, each of the open holes 107*a* and 107*b* could be a size equal to a minimum feature size (e.g. a critical size of the transistor structure 100 of the device 10). Of course, the size of the open holes 107*a* and 107*b* could be larger than the minimum feature size. The bottoms of the open holes 107*a* and 107*b* (i.e. the revealed top portion 11 and the revealed top portion 12) are made of materials with either polycrystalline/amorphous silicon or crystalline silicon with heavily doped concentrations having high conductivity, respectively. The exposed silicon region 102*c* of the gate terminal and the exposed silicon region of the source/drain terminal are seed regions for the selective epitaxy growth technique (SEG) to grow pillars based on the seed regions.

Figure 21A:
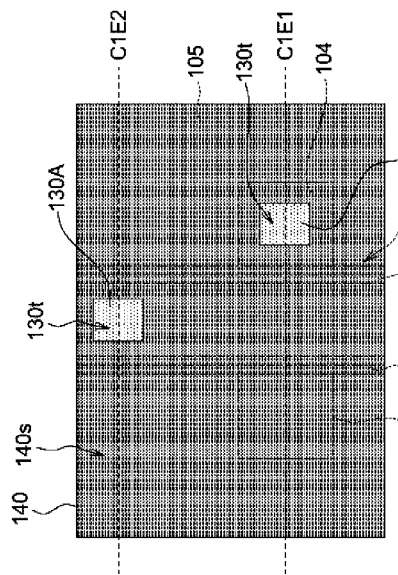
Figure 21C:
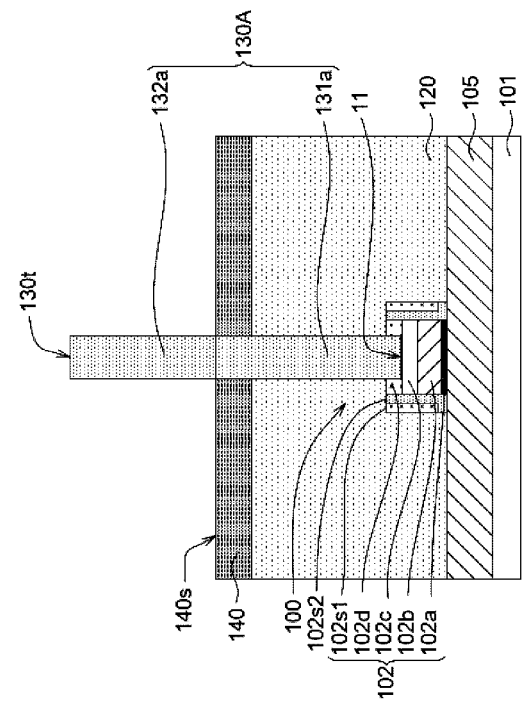
Figure 21B:
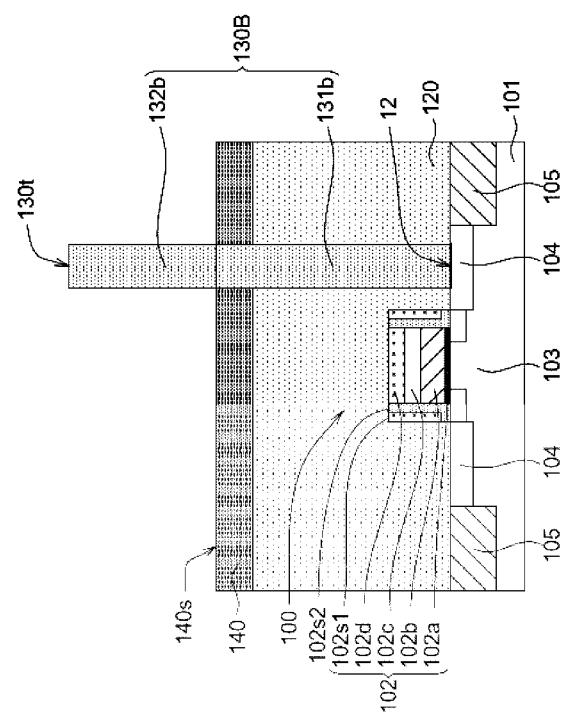

Then, as shown in FIGS. 21A~21C, heavily doped conductive silicon plugs (or the conductor pillars) are grown by SEG based on the revealed top portion 11 and the revealed top portion 12, to form the first conductor pillar portion 131*a* and the third conductor pillar portion 131*b*. A first dielectric sub-layer 140 is then formed over the first dielectric layer 120 to make the top surface 140*s* of the first dielectric sub-layer 140 substantially coplanaring with the top surfaces of the first conductor pillar portion 131*a* and the third conductor pillar portion 131*b*. Those "Exposed Heads" (or the expose top surface) of the first conductor pillar portion 131*a* and the third conductor pillar portion 131*b* can be used as seed portion for the subsequent SEG process. Furthermore, each of the first conductor pillar portions 131a and the third conductor pillar portion 131b has a seed region or seed pillar in the upper portion thereof, and such seed region or seed pillar could be used for the following selective epitaxy growth. Subsequently, a second conductor pillar portion 132a is formed on the first conductor pillar 131a by a second selective epitaxy growth; and a fourth conductor pillar portion 132b is formed on the third conductor pillar portion 131b. FIG. 21A is a top view illustrating a structure after the second conductor pillar portion 132a and the fourth conductor pillar portion 132b are formed on the first conductor pillar portions 131a and the third conductor pillar portion 131b, according to one embodiment of the present disclosure. FIG. 21B is a cross-sectional view taken along the cutting line C1E1 as depicted in FIG. 21A, FIG. 21B is a cross-sectional view taken along the cutting line C1E2 as depicted in FIG. 21A.

Figure 22A:
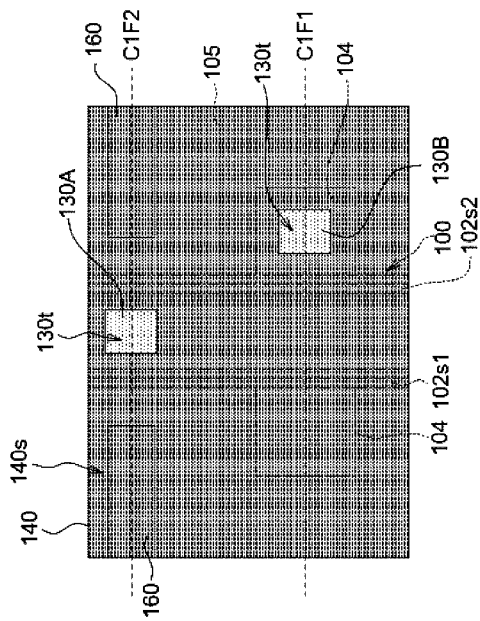
Figure 22C:
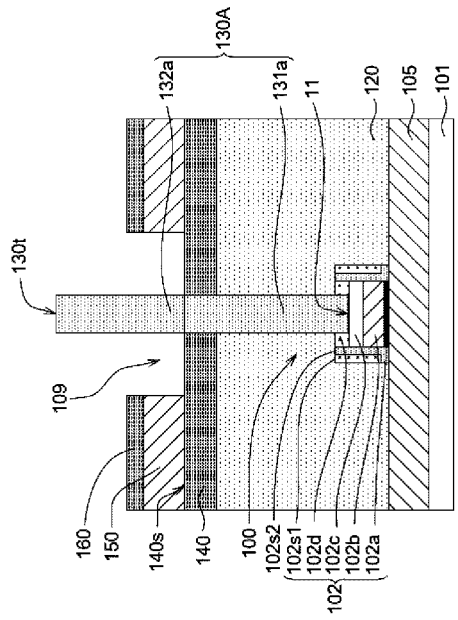
Figure 22B:
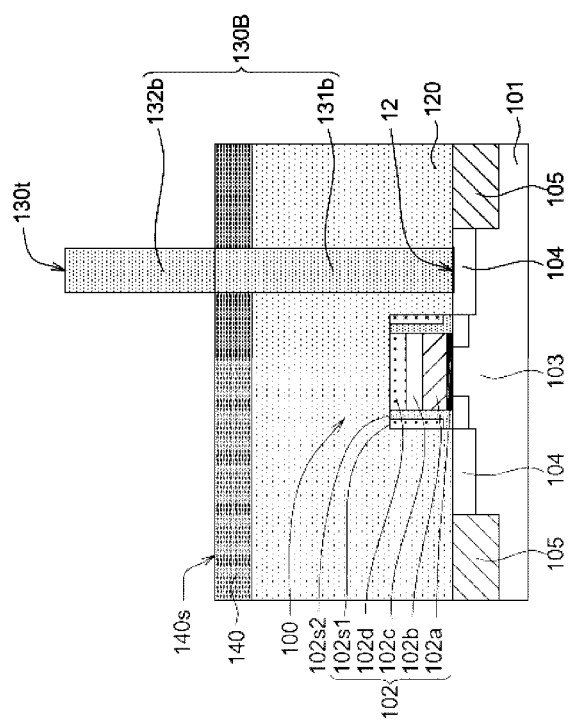

Furthermore, as shown in FIGS. 22A~22C, a first conduction layer 150, such as copper (Cu), Aluminum (Al), tungsten (W) or other suitable conductive material, can be deposited on the top surface 140s of the first dielectric sub-layer 140. A second dielectric sub-layer 160 is then deposited on the first conduction layer 150. The first conduction layer 150 and the second dielectric sub-layer 160 are patterned to define an opening hollow 109, wherein the first conductor pillar 130A penetrates through the opening hollow 109 without contacting the first conduction layer 150 and the second dielectric sub-layer 160. FIG. 22A is a top view illustrating a structure after the first conduction layer 150 and the second dielectric sub-layer 160 are formed over the first dielectric layer 120 according to one embodiment of the present disclosure. FIG. 22B is a cross-sectional view taken along the cutting line C1F1 as depicted in FIG. 22A. FIG. 22C is a cross-sectional view taken along the cutting line C1F2 as depicted in FIG. 22A.

Figure 23A:
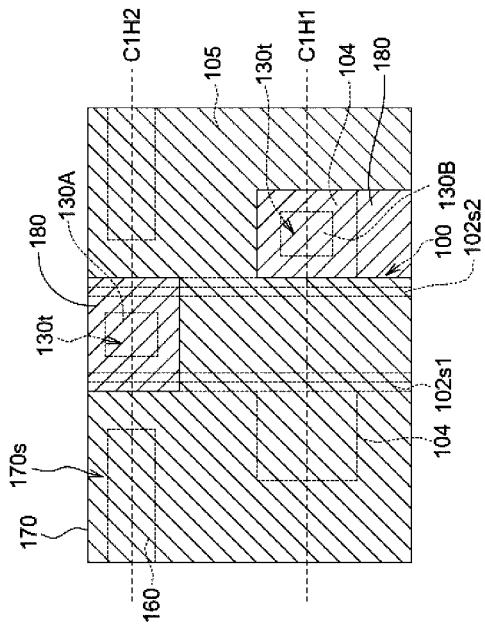
Figure 23C:
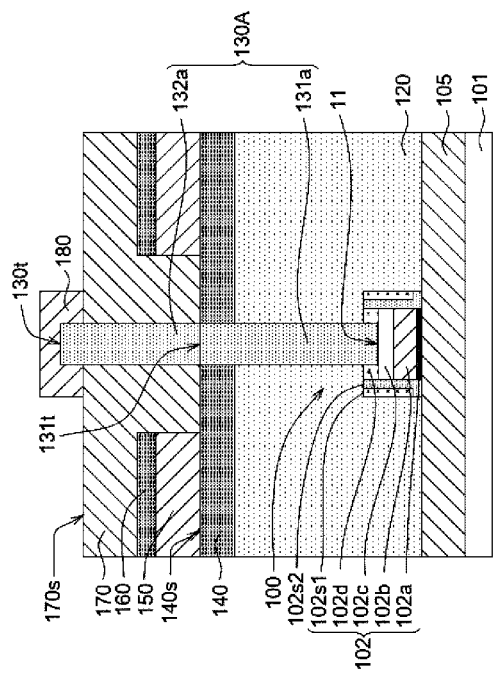
Figure 23B:
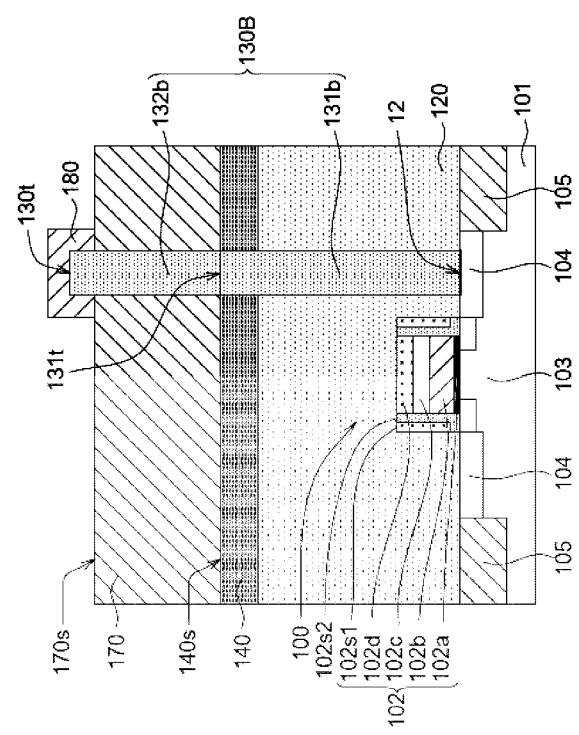

Moreover, as shown in FIGS. 23A~23C, the upper dielectric layer 170 is deposited to cover the second dielectric sub-layer 160 and the first dielectric sub-layer 140 to fill in the opening hollow 109. A top surface 170s of the upper dielectric layer 170 is lower than the top surface 130t of the first conductor pillar 130A (including the first conductor pillar portion or sub-pillar 131a and the second conductor pillar portion or sub-pillar 132a) and the second conductor pillar 130B (including the third conductor pillar portion or sub-pillar 131b and the fourth conductor pillar portion or sub-pillar 132b). An upper conduction layer 180 is then formed over the upper dielectric layer 170; wherein the first conductor pillar 130A connects to the upper conduction layer 180 but disconnects from the first conduction layer 150. In this example, FIG. 23A is a top view illustrating a structure after the conduction layer 180 is formed over the over the upper dielectric layer 170 according to one embodiment of the present disclosure. FIG. 23A is a top view, FIG. 23B is a cross-sectional view taken along the cutting line C1H1 as depicted in FIG. 23A. FIG. 23C is a cross-sectional view taken along the cutting line C1H2 as depicted in FIG. 23A.

As mentioned, each of the exposed silicon region 102c of the gate terminal and the exposed silicon region of the source/drain terminal has seed regions for the selective epitaxy growth technique (SEG) to grow pillars based on the seed regions. Furthermore, each of the first conductor pillar portions 131b and the third conductor pillar portion 131b also has a seed region or seed pillar in the upper portion thereof, and such seed region or seed pillar could be used for the following selective epitaxy growth. This embodiment could also be applied to allows M1 interconnection (a kind of conductive terminal) or conduction layer to be directly connected to the MX interconnection layer (without connecting to the conduction layers M2, M3, . . . MX-1) in a self-alignment way through one vertical conductive or conductor plug, as long as there is a seed portion or seed pillar on the upper portion of the conductive terminal and the conductor pillar portions configured for following selective epitaxy growth technique. The seed portion or seed pillar is not limited to silicon, and any material which could be used as a seed configured for following selective epitaxy growth is acceptable.

Figure 24A:
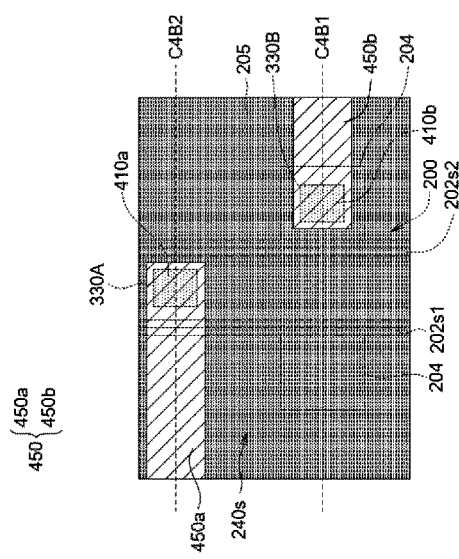
FIGS. 24A~24C are a top view and cross-sectional views illustrating another device having a transistor structure according to yet another embodiment of the present disclosure.
Figure 24C:
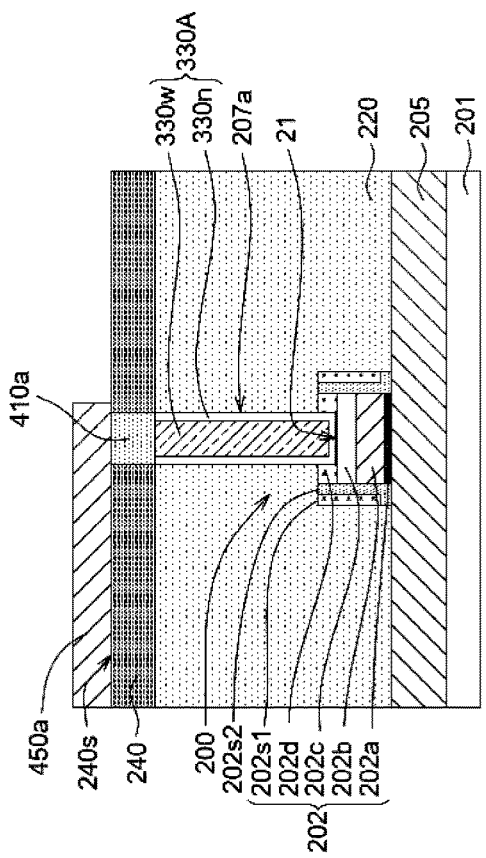
Figure 24B:
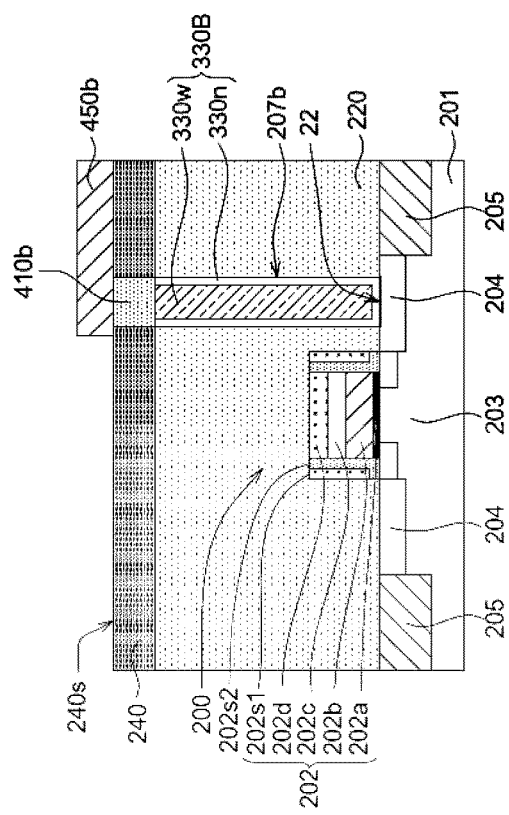

The conductor pillar could be a metal conductor pillar, or could be a composite conductor pillar with metal conductor pillar and a seed portion or seed pillar on the upper portion thereof. As shown in FIGS. 24A~24C, the highly dapped N+ poly silicon pillars 131a, 132a, 131b, 132b in FIGS. 23A~23C could be removed and replaced by tungsten pillars 330w, the TiN layer 330n, and the highly doped silicon pillar. As shown in FIGS. 24B~24C, a first conductor pillar includes a metal pillar portion 330A (which includes tungsten pillars 330w and the TiN layer 330n) and a highly doped silicon pillar portion 410a, and a second conductor pillar includes a metal pillar portion 330B (which includes tungsten pillars 330w and the TiN layer 330n) and a highly doped silicon pillar 410b. The highly doped silicon pillars 410a and 410b are the seed region or seed pillar of the conductor pillar configured for following metal connection, as shown in FIGS. 24B and 24C the first conduction layer 450 is formed over the first dielectric sub-layer 240 and electrically connected to the highly doped silicon pillars 410a and 410b. Moreover, the highly doped silicon pillars 410a and 410b are the seed region or seed pillar of the conductor pillar configured for following SEG processes to grow another silicon pillars thereon. In this example, FIG. 24A is a top view, FIG. 243 is a cross-sectional view taken along the cutting line C4B1 as depicted in FIG. 24A. FIG. 24C is a cross-sectional view taken along the cutting line C4B2 as depicted in FIG. 24A. In this way, a conductor pillar could include the tungsten pillars and the first highly doped silicon pillar, that is, the conductor pillar has a seed region or seed pillar in the upper portion thereof.

The conductor pillar could have a seed region or seed pillar in the upper portion thereof, a borderless contact is fulfilled since the highly doped silicon pillars 410a and 410b are the seed region or seed pillar of the conductor pillar configured for following SEG processes to grow another silicon pillars thereon. As shown in FIGS. 24D~24F, even if the width of the metal conduction layer (such as, the first metal sub-layer 550a or the second metal sub-layer 550b) is the same as that of the underneath contact plug (which may be as small as minimum feature size), then the photolithographic masking Misalignment tolerance can cause that the metal conduction layer 550a or 550b cannot fully cover the contact (as shown in FIGS. 24E and 24F), though there is no worry about the resistance between the metal conduction layer and contact may be too high due to shortages of contact areas. The invention here is that further using SEG to grow some extra highly doped silicon material (side pillars 520) to attach the vertical walls of the metal conduction layers 550a and 550b. In this example, FIG. 24D is a top view, FIG. 24E is a cross-sectional view taken along the cutting line C51 as depicted in FIG. 24D. FIG. 24F is a cross-sectional view taken along the cutting line C52 as depicted in FIG. 24D.

Additionally, the present invention discloses a new CMOS structure in which the n+ and p+ regions of the source and drain regions in the NMOS and PMOS transistors respectively are fully isolated by insulators, such insulators would not only increase the immunity to Latch-up issue, but also increase the isolation distance into silicon substrate to separate junctions in NMOS and PMOS transistors so that the surface distance between junctions can be decreased (such as 3A), so is the size of the SRAM cell or standard cell. The following briefly describes a new CMOS structure in which the n+ and p+ regions of the source and drain regions in the NMOS and PMOS transistors respectively are fully isolated by insulators. The detailed description for the new combination structure of the PMOS and MNOS is presented in the U.S. patent application Ser. No. 17/318,097, field on May 12, 2021 and entitled "COMPLEMENTARY MOSFET STRUCTURE WITH LOCALIZED ISOLATIONS IN SILICON SUBSTRATE TO REDUCE LEAKAGES AND PREVENT LATCH-UP", and the whole content of the U.S. patent application Ser. No. 17/318,097 is incorporated by reference herein.

Figure 25A:
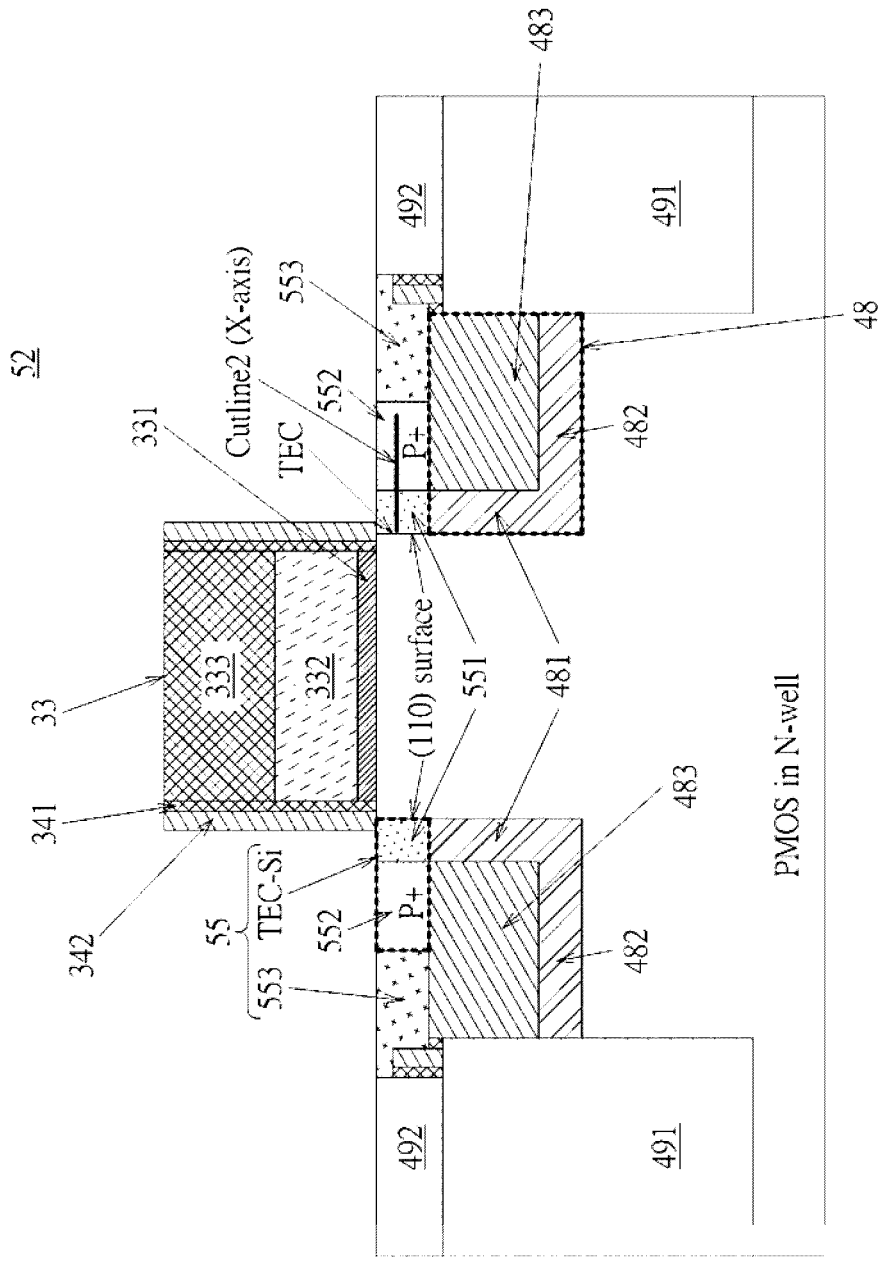
FIGS. 25A and 25B are diagrams illustrating the cross section of the PMOS transistor and the NMOS transistor used in the SRAM cell, respectively.
Figure 25B:
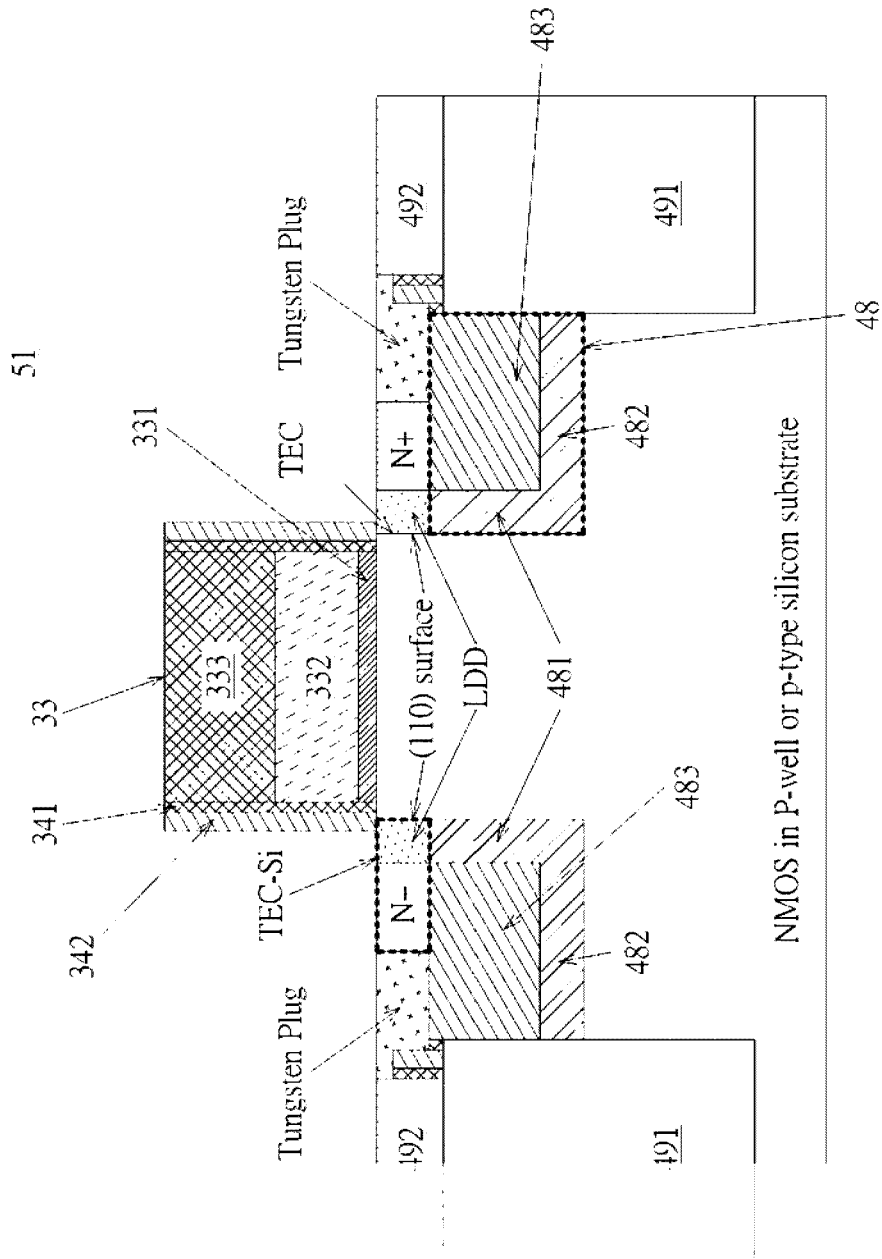

Please refer to FIGS. 25A and 25B. FIG. 25A is a diagram illustrating a cross section of the PMOS transistor 52, and FIG. 25B is a diagram illustrating a cross section of the NMOS transistor 51. The gate structure 33 comprising a gate dielectric layer 331 and gate conductive layer 332 (such as gate metal) is formed above the horizontal surface or original surface of the semiconductor substrate (such as silicon substrate). A dielectric cap 333 (such as a composite of oxide layer and a Nitride layer) is over the date conductive layer 332. Furthermore, spacers 34 which may include a composite of an oxide layer 341 and a Nitride layer 342 is used to over sidewalls of the gate structure 33. Trenches are formed in the silicon substrate, and all or at least part of the source region 35 and drain region 36 are positioned in the corresponding trenches, respectively. The source (or drain) region in the PMOS transistor 32 may include P+ region or other suitable doping profile regions (such as gradual or stepwise change from P− region and P+ region). Furthermore, a localized isolation 48 (such as nitride or other high-k dielectric material) is located in one trench and positioned under the source region, and another localized isolation 48 is located in another trench and positioned under the drain region. Such localized isolation 48 is below the horizontal silicon surface (HSS) of the silicon substrate and could be called as localized isolation into silicon substrate (LISS) 48. The LISS 48 could be a thick Nitride layer or a composite of dielectric layers. For example, the localized isolation or LISS 48 could comprise a composite localized isolation which includes an oxide layer (called Oxide-3V layer 481) covering at least a portion sidewall of the trench and another oxide layer (Oxide-3B layer 482) covering at least a portion bottom wall of the trench. The Oxide-3V layer 481 and Oxide-3B layer 482 could be formed by thermal oxidation process. The composite localized isolation 48 further includes a nitride layer 483 (called as Nitride-3) being over the Oxide-3B layer 482 and contacting with the Oxide-3V layer 481. It is mentioned that the nitride layer 483 or Nitride-3 could be replaced by any suitable insulation materials as long as the Oxide-3V layer remains most as well as being designed. Furthermore, the STI (Shallow Trench Isolation) region in FIGS. 25A and 25B could comprise a composite STI 49 which includes a STI-1 layer 491 and a STI-2 layer 492, wherein the STI-1 layer 491 and a STI-2 layer 492 could be made of thick oxide material by different process, respectively.

Moreover, the source (or drain) region in FIGS. 25A and 25B could comprise a composite source region 55 and/or drain region 56. For example, as shown in FIG. 25(a), in the PMOS transistor 52, the composite source region 55 (or drain region 56) at least comprises a lightly doped drain (LDD) 551 and a heavily P+ doped region 552 in the trench. Especially, it is noted that the lightly doped drain (LDD) 551 abuts against an exposed silicon surface with a uniform (110) crystalline orientation. The exposed silicon surface has its vertical boundary with a suitable recessed thickness in contrast to the edge of the gate structure, which is labeled in FIG. 25A as TEC (Thickness of Etched-away Transistor-body Well-Defined to be the Sharp Edge of Effective Channel Length). The exposed silicon surface is substantially aligned with the gate structure. The exposed silicon surface could be a terminal face of the channel of the transistor.

The lightly doped drain (LDD) 551 and the heavily P+ doped region 552 could be formed based on a Selective Epitaxial Growth (SEG) technique (or other suitable technology which may be Atomic Layer Deposition ALD or selective growth ALD-SALD) to grow silicon from the exposed TEC area which is used as crystalline seeds to form new well-organized (110) lattice across the LISS region which has no seeding effect on changing (110) crystalline structures of newly formed crystals of the composite source region 55 or drain region 56. Such newly formed crystals (including the lightly doped drain (LDD) 551 and the heavily P+ doped region 552) could be named as TEC-Si, as marked in FIG. 25A. In one embodiment, the TEC is aligned or substantially aligned with the edge of the gate structure 33, and the length of the LDD 551 is adjustable, and the sidewall of the LDD 551 opposite to the TEC could be aligned or substantially aligned with the sidewall of the spacer 34. Similarly, the TEC-Si (including the LDD region and the heavily N+ doped region) of the composite source/drain region for the NMOS transistor 51 is shown in FIG. 25B. The composite source (or drain) region could further comprise some Tungsten (or other suitable metal materials) plugs 553 formed in a horizontal connection to the TEC-Si portion for completion of the entire source/drain regions, as shown in FIGS. 25A and 25B. As shown in FIG. 25A, the active channel current flowing to future Metal interconnection such as Metal-1 layer is gone through the LDD 551 and heavily-doped conductive region 552 to Tungsten 553 (or other metal materials) which is directly connected to Metal-1 by some good Metal-to-Metal Ohmic contact with much lower resistance than the traditional Silicon-to-Metal contact.

Figure 26A:
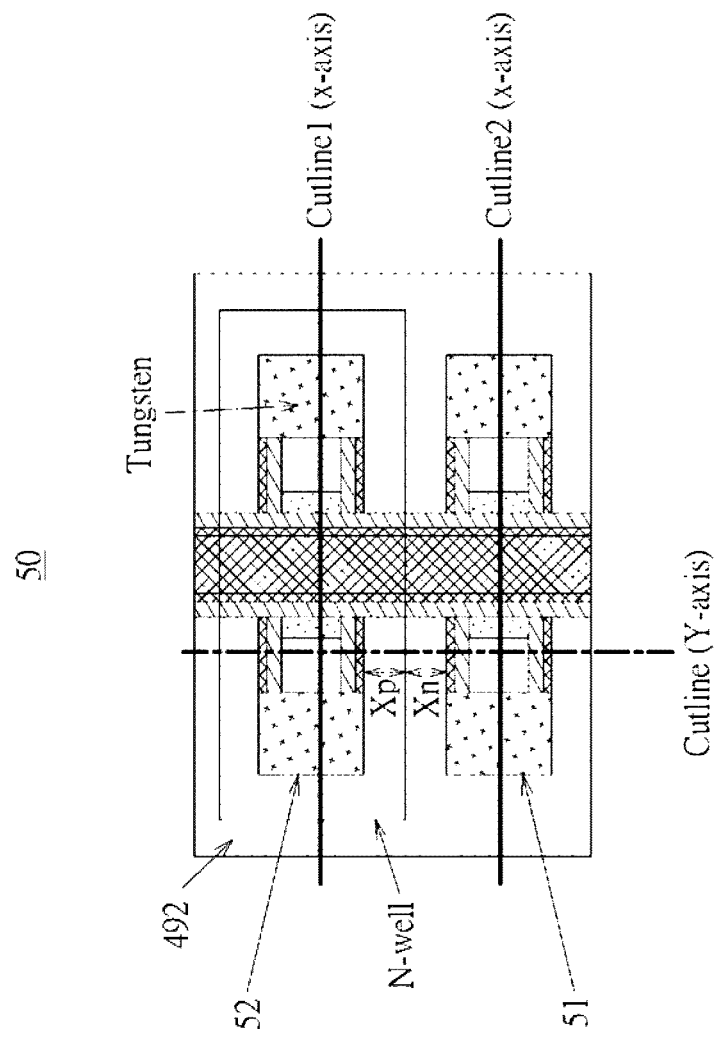
FIG. 26A is a top view diagram illustrating a combination structure of the new PMOS 52 and new NMOS 51 shown in FIGS. 25A and 25B.
Figure 26B:
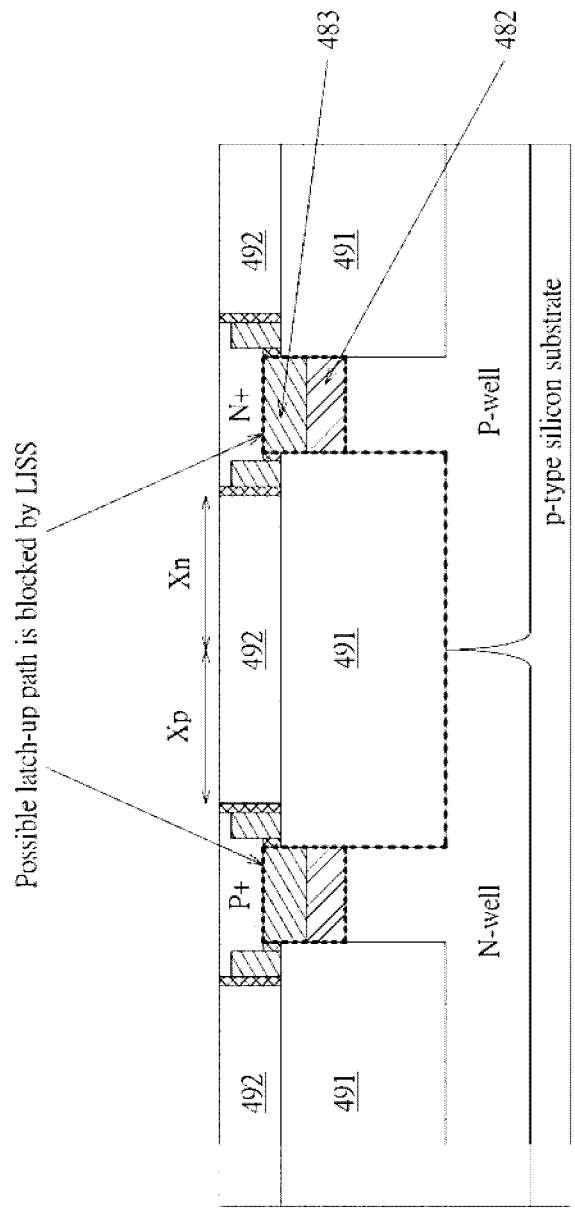
FIG. 26B is a diagram illustrating a cross section of the combination of the new PMOS 52 and new NMOS 51 along the cutline (Y-axis) in FIG. 26A.
Figure 27:
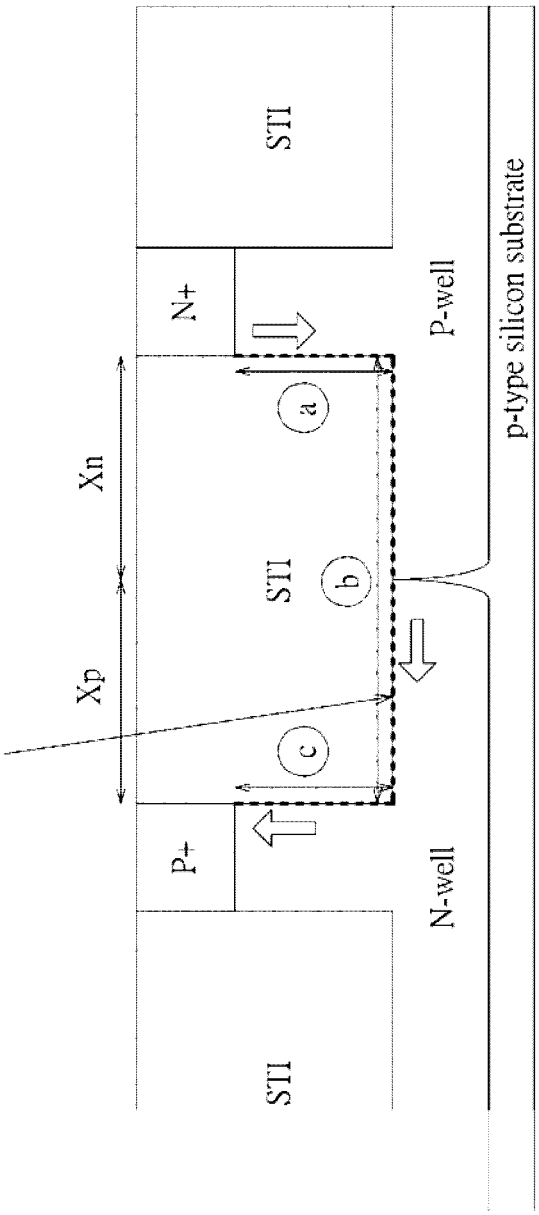
FIG. 27 is a diagram illustrating a cross section of one combination of the traditional PMOS transistor and NMOS transistor.

One combination structure of the new PMOS 52 and new NMOS 51 is shown in FIG. 26A which is a top view, and FIG. 26B is a diagram illustrating a cross section of the combination of the new PMOS 52 and new NMOS 51 along the outline (Y-axis) in FIG. 26A. As shown in FIG. 26B, there exists a composite localized isolation (or the LISS 48) between the bottom of the P+ source/drain region of the PMOS and the n-type N-well, so is another composite localized isolation (or the LISS 48) between the bottom of the N+ source/drain region of the NMOS and the p-type P-well or substrate. The advantage is clearly shown that the bottom of the n+ and p+ regions are fully isolated by insulators in this newly invented CMOS structure shown in FIG. 26B, that is, the possible latch-up path from the bottom of the P+ region of the PMOS to the bottom of the N+ region of the NMOS is totally blocked by the LISS. On the other hand, in the traditional CMOS structure the n+ and p+ regions are not fully isolated by insulators as shown in FIG. 27, the possible Latch-up path exists from the n+/p junction through the p-well/n-well junction to the n/p+ junction includes the length ⓐ, the length ⓑ, and the length ⓒ (FIG. 27). Thus, from device layout point of view, the reserved edge distance $(X_n + X_p)$ between NMOS and PMOS in FIG. 26B could be smaller than that in FIG. 27. For example, the reserved edge distance $(X_n+X_p)$ could be around 2~5λ, such as 3λ.

Figure 28A:
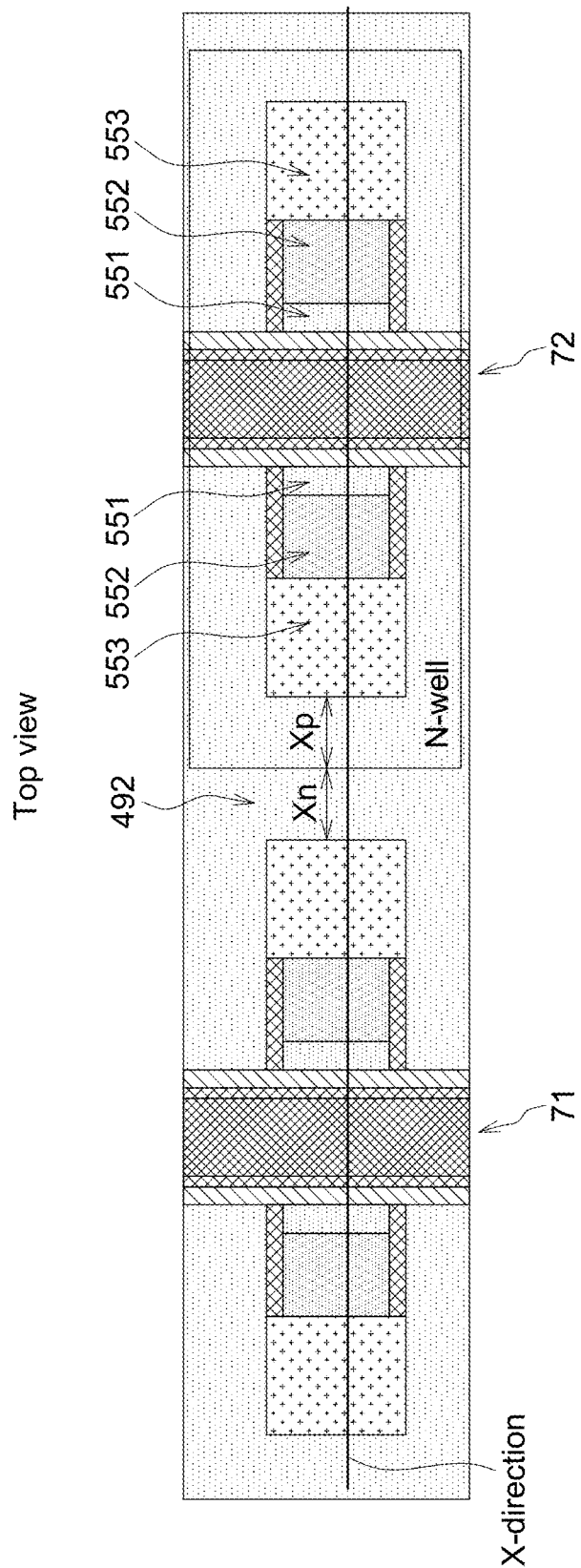
FIG. 28A is a top view diagram illustrating another combination structure of the new PMOS 52 and new NMOS 51 shown in FIGS. 25A and 25B.
Figure 28B:
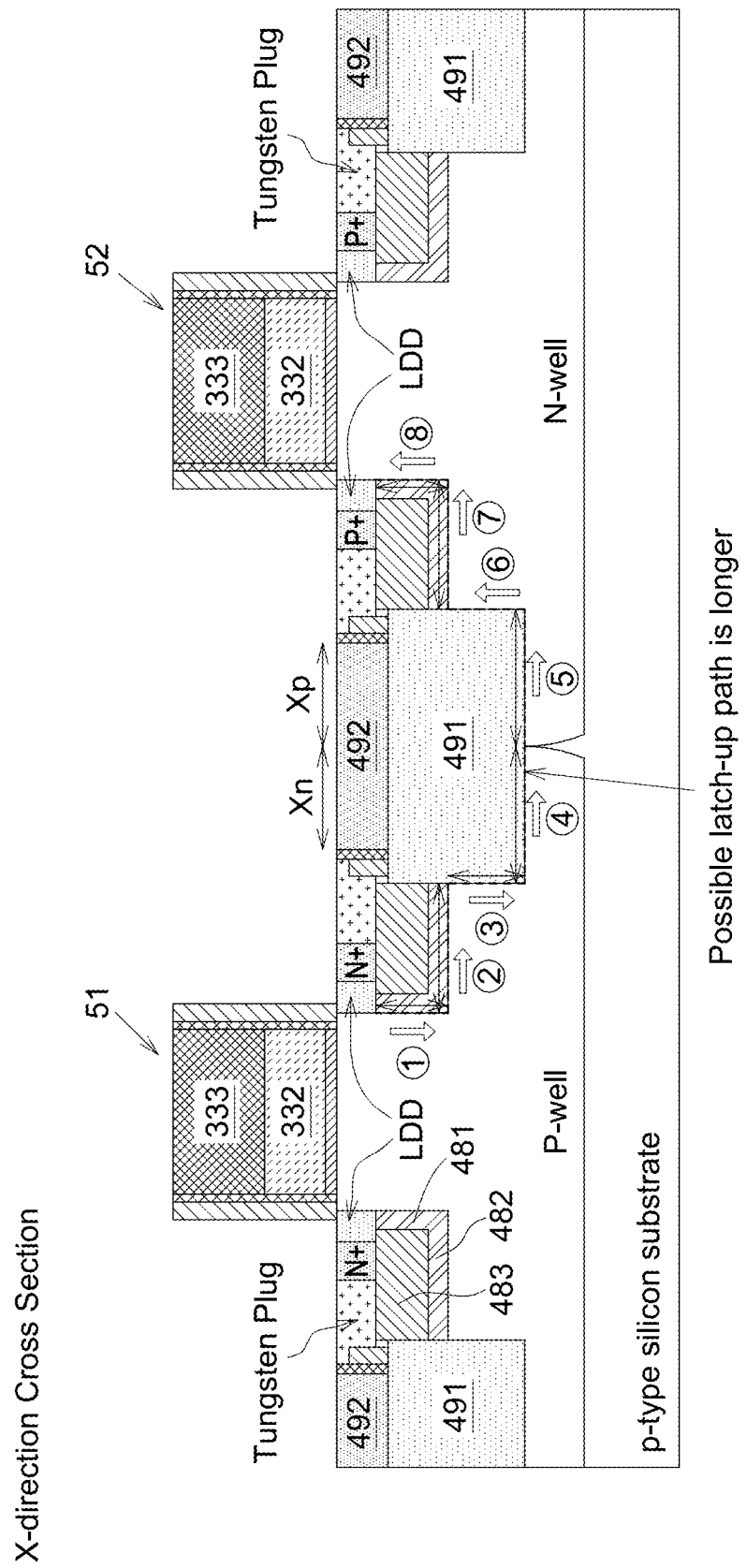
FIG. 28B is a diagram illustrating a cross section of the combination of the new PMOS 52 and new NMOS 51 along the cutline (X-axis) in FIG. 28A.
Figure 29:
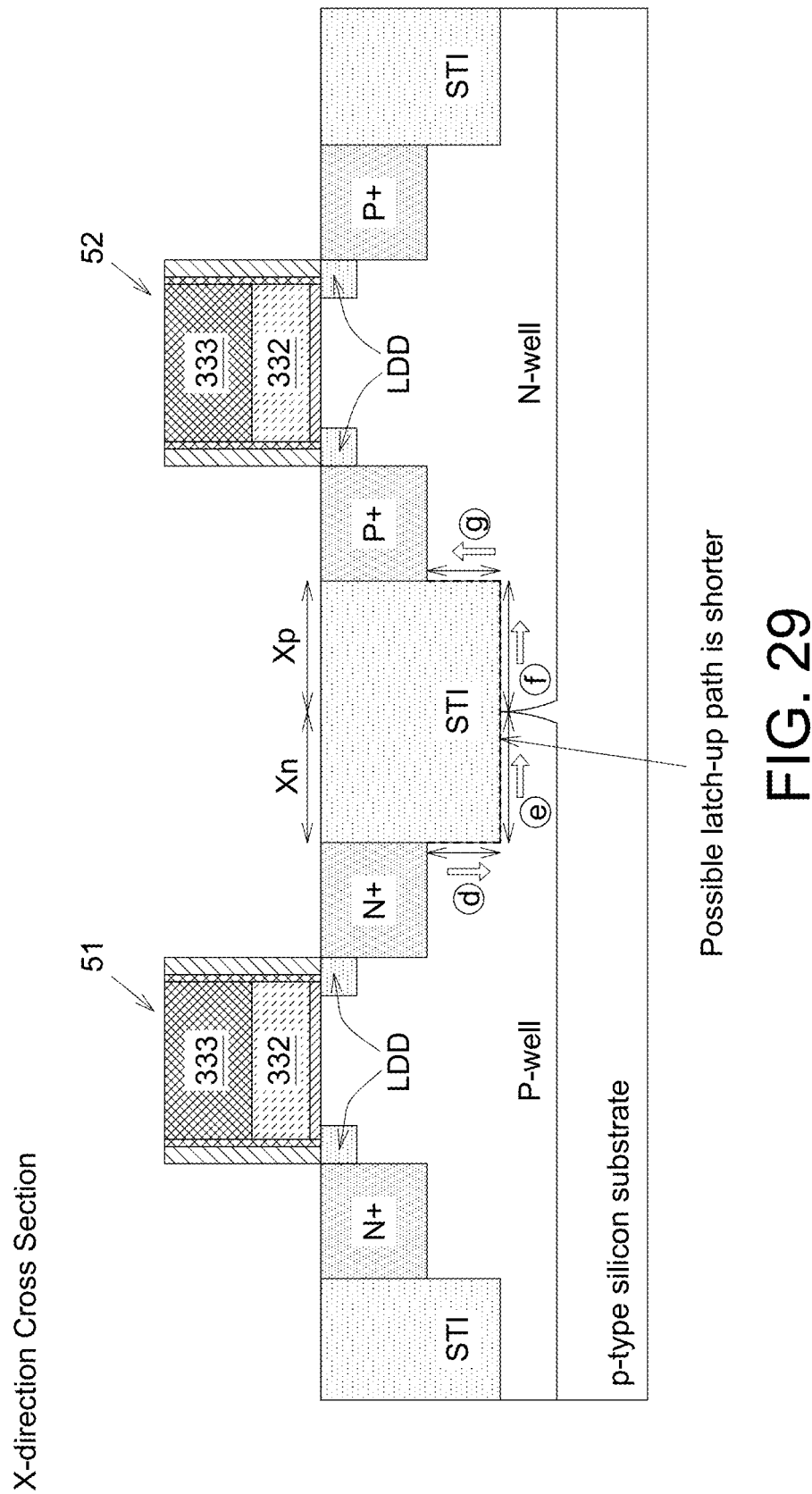
FIG. 29 is a diagram illustrating a cross section of another combination of the traditional PMOS and NMOS transistor.

The other combination structure of the new PMOS 52 and new NMOS 51 is shown in FIG. 28A which is a top view, and FIG. 28B is a diagram illustrating a cross section of the combination of the new PMOS 52 and new NMOS 51 along the outline (X-axis) in FIG. 28A. As shown in FIG. 28B, it results in a much longer path from the n+/p junction through the p-well (or p-substrate)/n-well junction to the n/p+ junction. The possible Latch-up path from the LDD-n/p junction through the p-well/n-well junction to the n/LDD-p junction includes the length ①, the length ② (the length of the bottom wall of one LISS region), the length ③, the length ④, the length ⑤, the length ⑥, the length ⑦ (the length of the bottom wall of another LISS region), and the length ⑧ marked in FIG. 28B. On the other hand, in traditional CMOS structure which combines PMOS and NMOS structure shown in FIG. 29, the possible Latch-up path from the n+/p junction through the p-well/n-well junction to the n/p+ junction just includes the length ⓓ, the length ⓔ the length ⓕ and the length ⓖ (as shown in FIG. 29). Such possible Latch-up path of FIG. 28B is longer than that in FIG. 29. Therefore, from device layout point of view, the reserved edge distance $(X_n+X_p)$ between NMOS and PMOS in FIG. 28B could be smaller than that in FIG. 29. For example, the reserved edge distance $(X_n+X_p)$ could be around 2~5λ, such as 3λ.

Figure 30:
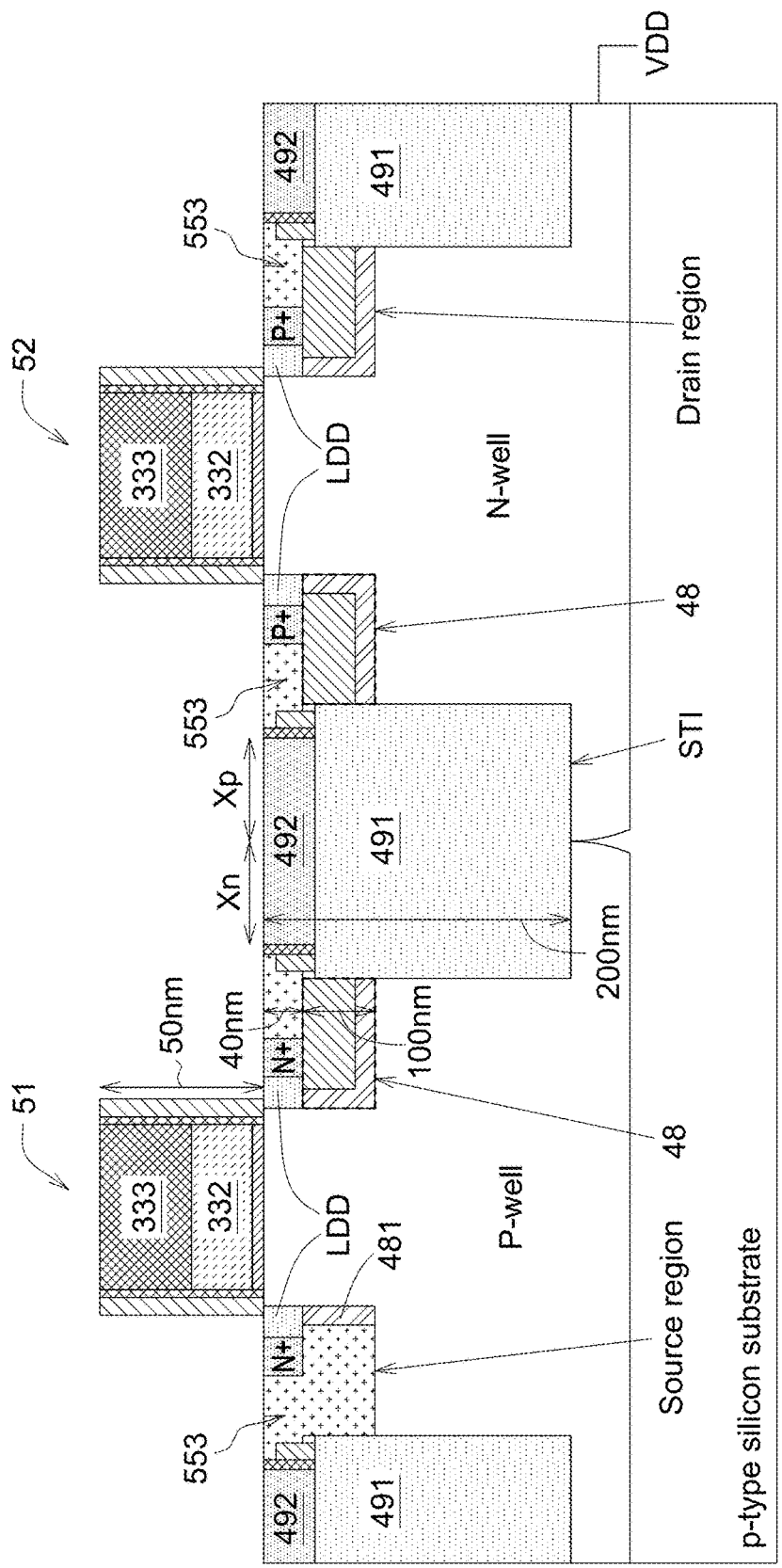
FIG. 30 is a top view diagram illustrating another combination structure of the PMOS and NMOS transistors used in the new SRAM cell.

Furthermore, in currently available SRAM cell and standard cell, the metal wires for high level voltage VDD and low level voltage VSS (or Ground) are distributed above the original silicon surface of the silicon substrate, and such distribution will interfere with other metal wires for the word-line (WL), bit-lines (BL and BL Bar), or other connection metal lines if there is no enough spaces among those metal wires. The present invention discloses a new SRAM structure in which the metal wires for high level voltage VDD and/or the low level voltage VSS could be distributed under the original silicon surface of the silicon substrate, thus, the interference among the size of the contacts, among layouts of the metal wires connecting the word-line (WL), bit-lines (BL and BL Bar), high level voltage VDD, and low level voltage VSS, etc. could be avoided even the size of the SRAM cell is shrunk. As shown in FIG. 30, in the drain region of the PMOS 52, the Tungsten or other metal materials 553 is directly coupled to the Nwell which is electrically coupled to VDD. On the other hand, in the source region of the NMOS 51, the Tungsten or other metal materials 553 is directly coupled to the Pwell or P-substrate which is electrically coupled to Ground. Thus, the openings for the source/drain regions which are originally used to electrically couple the source/drain regions with metal layer 2 or metal layer 3 for VDD or Ground connection could be omitted in the new SRAM cell and standard cell. The detailed description for the structure of the aforesaid structure and the manufacture process thereof is presented in the U.S. patent application Ser. No. 16/991,044, filed on Aug. 12, 2020 and entitled: "TRANSISTOR STRUCTURE AND RELATED INVERTER", and the whole content of the U.S. patent application Ser. No. 16/991,044 is incorporated by reference herein.

To sum up, at least there are following advantages in the new SRAM cell and standard cell:

(1) The linear dimensions of the source, the drain and the gate of the transistors in the SRAM are precisely controlled, and the linear dimension can be as small as the minimum feature size, Lamda (λ). Therefore, when two adjacent transistors are connected together through the drain/source, the length dimension of the transistor would be as small as 3λ, and the distance between the edges of the gates of the two adjacent transistors could be as small as 2λ. Of course, for tolerance purpose, the length dimension of the transistor would be around 3λ~6λ or larger, the distance between the edges of the gates of the two adjacent transistors could be 3λ~5λ or larger.

(2) The first metal interconnection (M1 layer) directly connect Gate, Source and/or Drain regions through self-aligned miniaturized contacts without using a conventional contact-hole-opening mask and/or an Metal-0 translation layer for M1 connections.

(3) The Gate and/or Diffusion (Source/Drain) areas are directly connected to the M2 interconnection layer without connecting the M1 layer in a self-alignment way. Therefore, the necessary space between one M1 interconnection and the other M1 interconnection and blocking issue in some wiring connections will be reduced. Furthermore, same structure could be applied to a lower metal layer is directly connected to an upper metal layer by a conductor pillar, but the conductor pillar is not electrically connected to any middle metal layer between the lower metal layer and the upper metal layer.

(4) The n+ and p+ regions of the source and drain regions in the NMOS and PMOS transistors respectively are fully isolated by insulators, such insulators would not only increase the immunity to Latch-up issue, but also increase the isolation distance into silicon substrate to separate junctions in NMOS and PMOS transistors so that the surface distance between junctions can be decreased (such as between 3~10λ, such as 6 or 8λ).

(5) The metal wires for high level voltage VDD and/or the low level voltage VSS in the SRAM cell and standard cell could be distributed under the original silicon surface of the silicon substrate, thus, the interference among the size of the contacts, among layouts of the metal wires connecting the word-line (WL), bit-lines (BL and BL Bar), high level voltage VDD, and low level voltage VSS, etc. could be avoided even the size of the SRAM cell or the standard cell is shrunk. Moreover, the openings for the source/drain regions which are originally used to electrically couple the source/drain regions with metal layer 2 or metal layer 3 for VDD or Ground connection could be omitted in the new SRAM cell and standard cell.

Figure 1A:
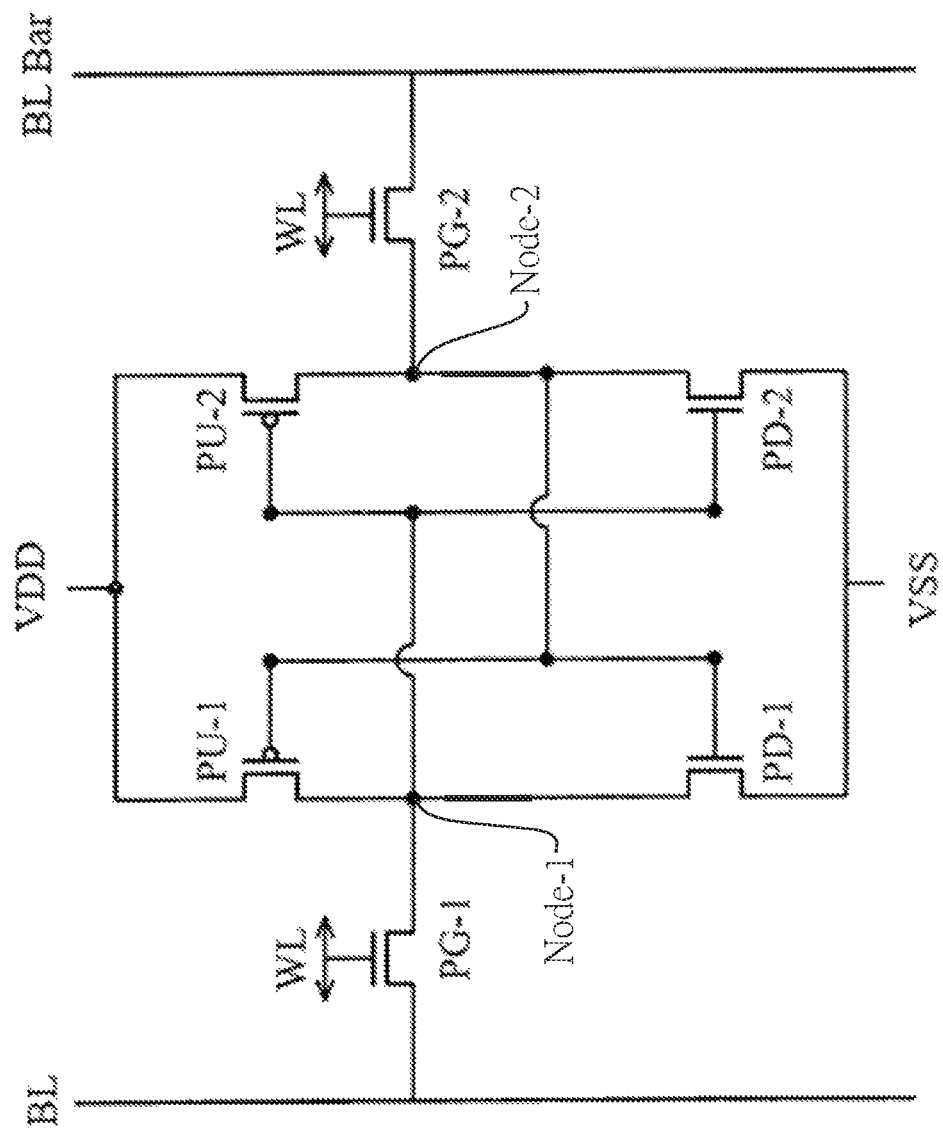
FIG. 1A is a schematic diagram for a regular 6T SRAM.
Figure 1B:
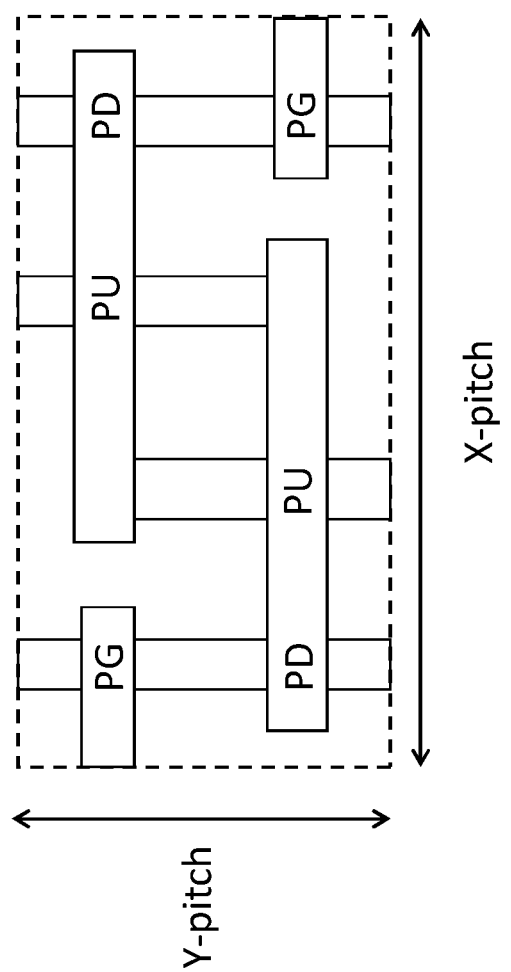
FIG. 1B is a stick diagram corresponding to the 6T SRAM in FIG. 1A, in which active regions are corresponding to the vertical bars and gate lines are corresponding to the horizontal bars.
Figure 31A:
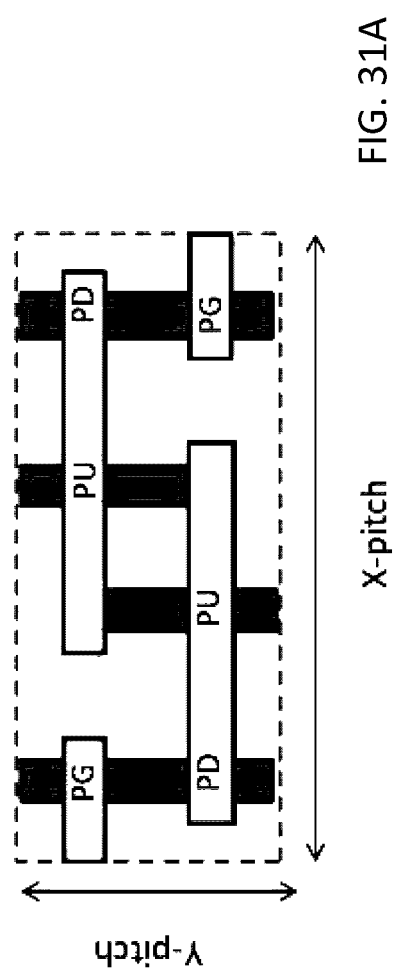
FIG. 31A a diagram illustrating the "stick diagram" as shown in FIG. 2.
Figure 31B:
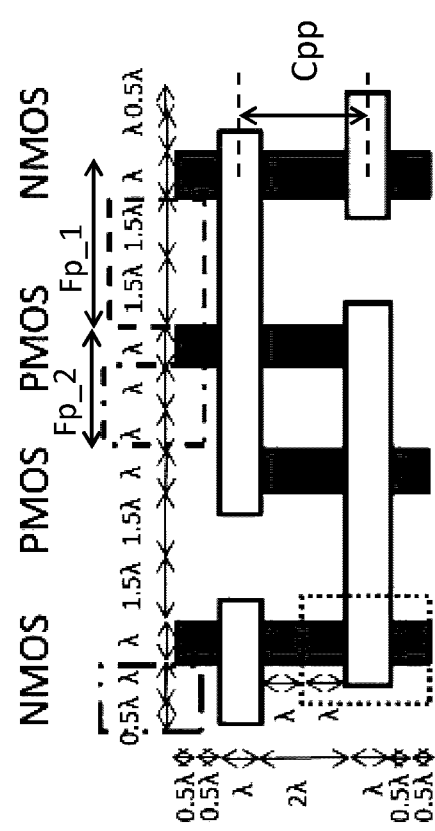
FIG. 31B is a stick diagram of the new 6T SRAM with dimension.

FIG. 31A is a copy of FIG. 1B shows the "stick diagram" representing the layout and connection among the 6 transistors of the SRAM, and FIG. 31B is a stick diagram of the new 6T SRAM with dimension according to the advantages of the present invention. As shown in FIG. 31B, the dimension of the transistor would be as small as 3λ (marked by dot rectangle), and the distance between the edges of the gates of the two adjacent transistors could be as small as 2λ. Furthermore, the isolation distance into silicon substrate to separate junctions in NMOS and PMOS transistors can be decreased as small as 3λ (marked by dash rectangle). The isolation distance into silicon substrate to separate junctions in two PMOS transistors can be decreased between 1.5~2.5λ, such as small as 2λ (marked by one dot-dash rectangle). Further showing in FIG. 31B is that, the Cpp is as small as 3λ, and two fin pitches, Fp_1 and Fp_2 are as small as 4λ and 3λ, respectively.

In FIG. 31B, the dimension of the active region (vertical line) can be as small as λ, so is the gate line (horizontal line).

Furthermore, in FIG. 31(b), for the transistor in the upper left corner which is corresponding to the PG transistor in FIG. 31A, in order to avoid the interference between two contact holes which will be formed later in the action region and the gate region respectively, the horizontal distance between the edge of the active region and the boundary of the SRAM cell or bit cell will be 1.5λ (marked by two dots-dash rectangle). So is the transistor in the bottom right corner of FIG. 31B which is corresponding to another PG transistor in FIG. 31A. Thus, for the stick diagram in FIG. 31B, the horizontal length (x-direction) of the SRAM cell is 15λ, and the vertical length (y-direction) of the SRAM cell or bit cell is 6λ. Therefore, the total area of the SRAM cell or bit cell of the FIG. 31B is as small as $90\lambda^2$.

Figure 31C:
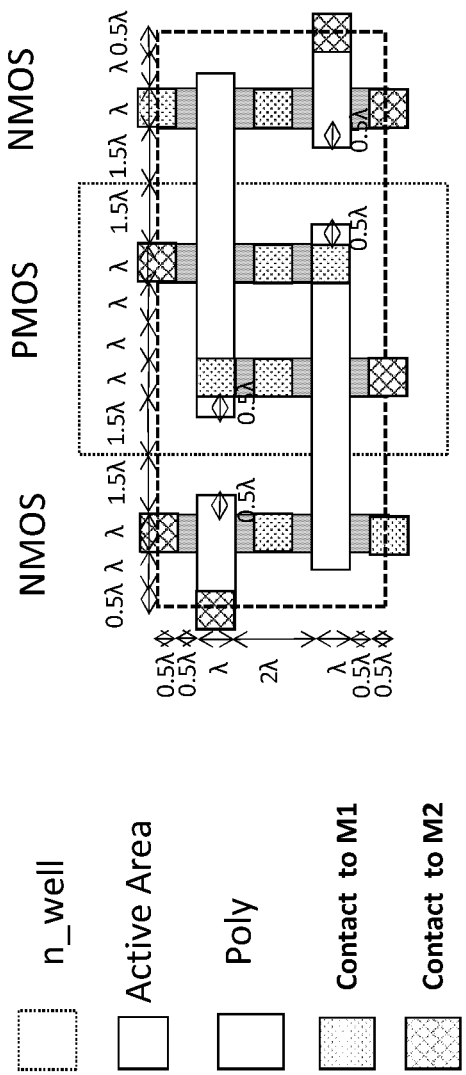
FIG. 31C is a stick diagram of the new 6T SRAM with contacts according to the present invention.

As shown in FIG. 31C, in the proposed SRAM cell, some source/drain contacts (for connection to the metal 1 layer) could be formed in the active regions. The size of the source/drain contact could be as small as λ×λ, no matter the size of the technology node or (or minimum feature size). Similarly, some source/drain contacts and gate contact (for direct connection to the metal 2 layer without connecting metal 1 layer, as explained previously) could be formed on the gate or Poly line, and the size of the gate contact could be as small as λ×λ as well.

Figure 32:
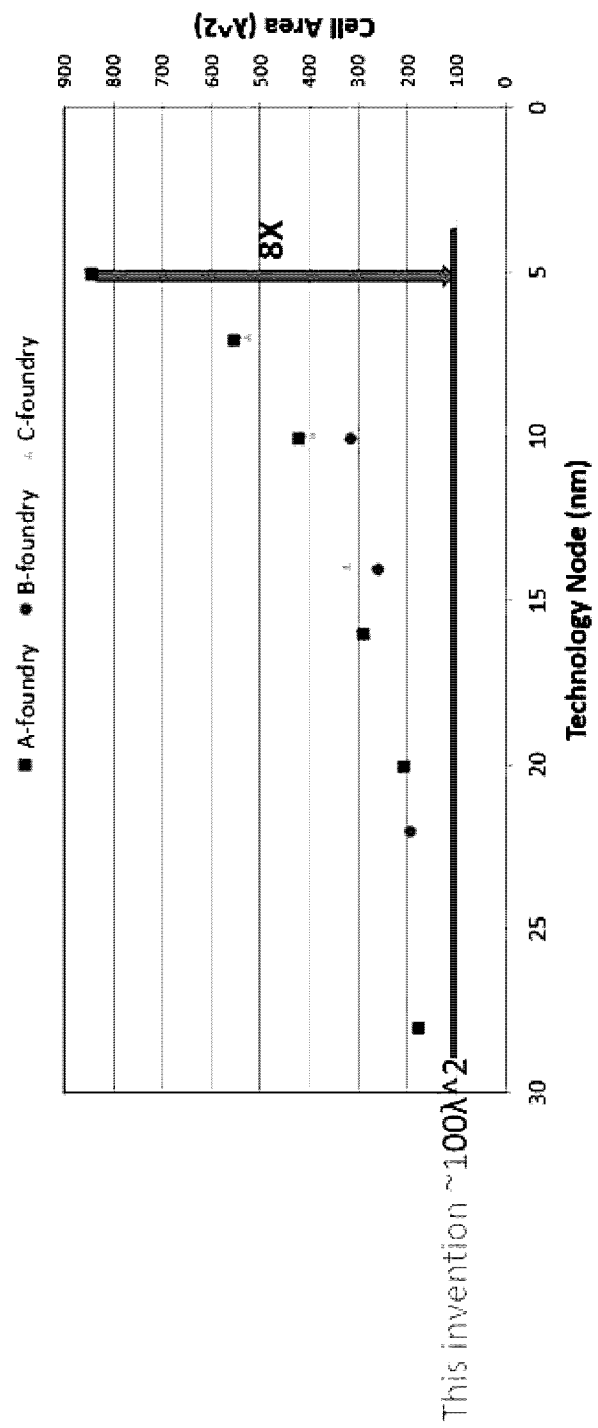
FIG. 32 shows the SRAM cell area (in term $\lambda^2$) across different technology nodes from three different foundries A, B, and C and the present invention.

FIG. 32 shows the SRAM cell area (in term $\lambda^2$) across different technology nodes from three different foundries A, B, and C (data collected from published literatures). Moving toward smaller feature size technology, the larger SRAM cell size (in term $\lambda^2$) can be observed. With the designs described in the present invention and their derivative designs, the SRAM cell area across different technology nodes can stay flat or less sensitive to the technology nodes, that is from technology node of 28 nm to technology node of 5 nm, the SRAM cell area according to the present invention can maintain within the range of $84\lambda^2 \sim 102\lambda^2$. Using technology node or minimum feature size=5 nm as an example, the area of the new proposed SRAM cell could be around $100\lambda^2$, which is almost one eighth (⅛) of the area of the conventional 5 nm SRAM cell shown in FIG. 32.

Of course, it is not necessary to utilize all improved technologies proposed in the new SRAM cell structure of the present invention, only one of the proposed technologies is enough to reduce the area of the SRAM cell structure, as compared with the transitional SRAM cell. For example, the shrinking area of active region (or just connecting gate/source/drain contact ("CT") to second metal layer) according to the present invention may cause the area of the SRAM within the range of $84\lambda^2 \sim 700\lambda^2$ at technology node of 5 nm, within the range of $84\lambda^2 \sim 450\lambda^2$ at technology node of 7 nm, within the range of $84\lambda^2 \sim 280\lambda^2$ at technology node from 10 nm to more than 7 nm, within the range of $84\lambda^2 \sim 200\lambda^2$ at technology node from 20 nm to more than 10 nm, and within the range of $84\lambda^2 \sim 150\lambda^2$ at technology node from 28 nm to more than 20 nm. For example, shrinking area of active region could cause the area of the SRAM within the range of $160\lambda^2 \sim 240\lambda^2$ (or more, if additional tolerance is required) at technology node of 5 nm, and cause the area of the SRAM within the range of $107\lambda^2 \sim 161\lambda^2$ (or more, if additional tolerance is required) at technology node of 16 nm.

Figure 2A:
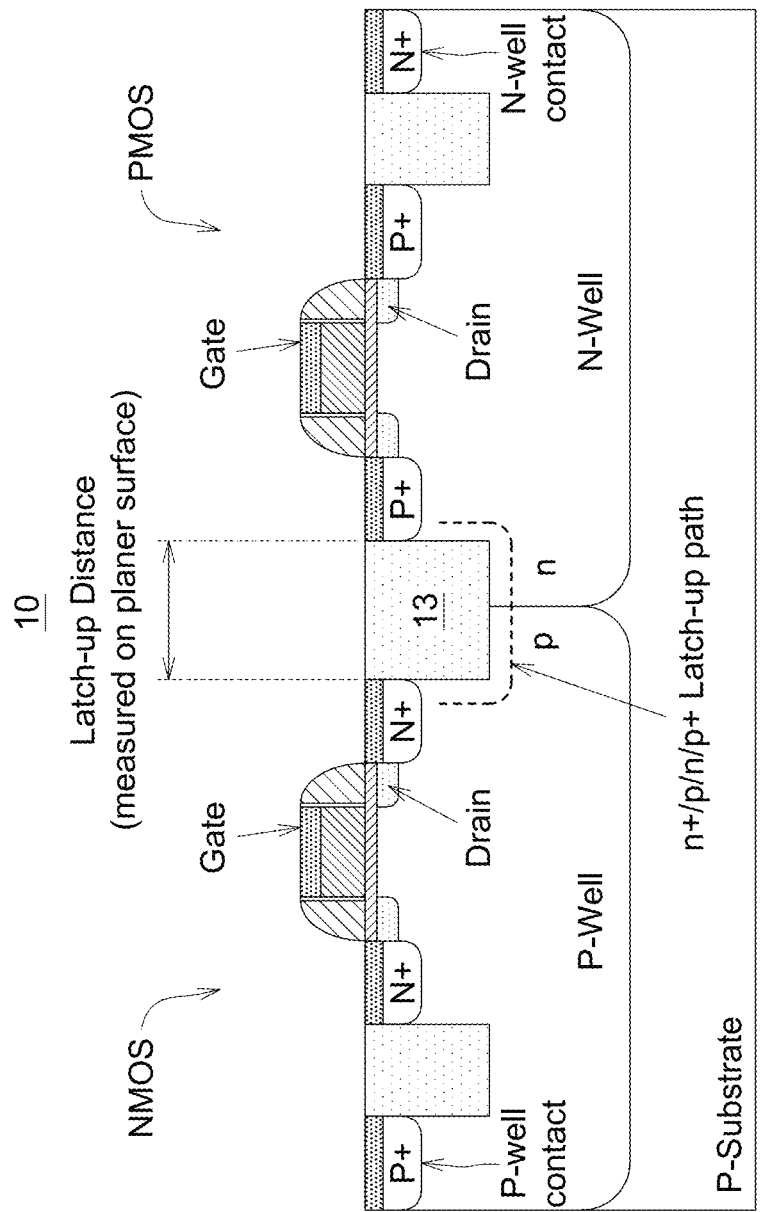
FIG. 2A is a diagram illustrating a diagram illustrating a cross section of a traditional NMOS and PMOS structure.
Figure 2B:
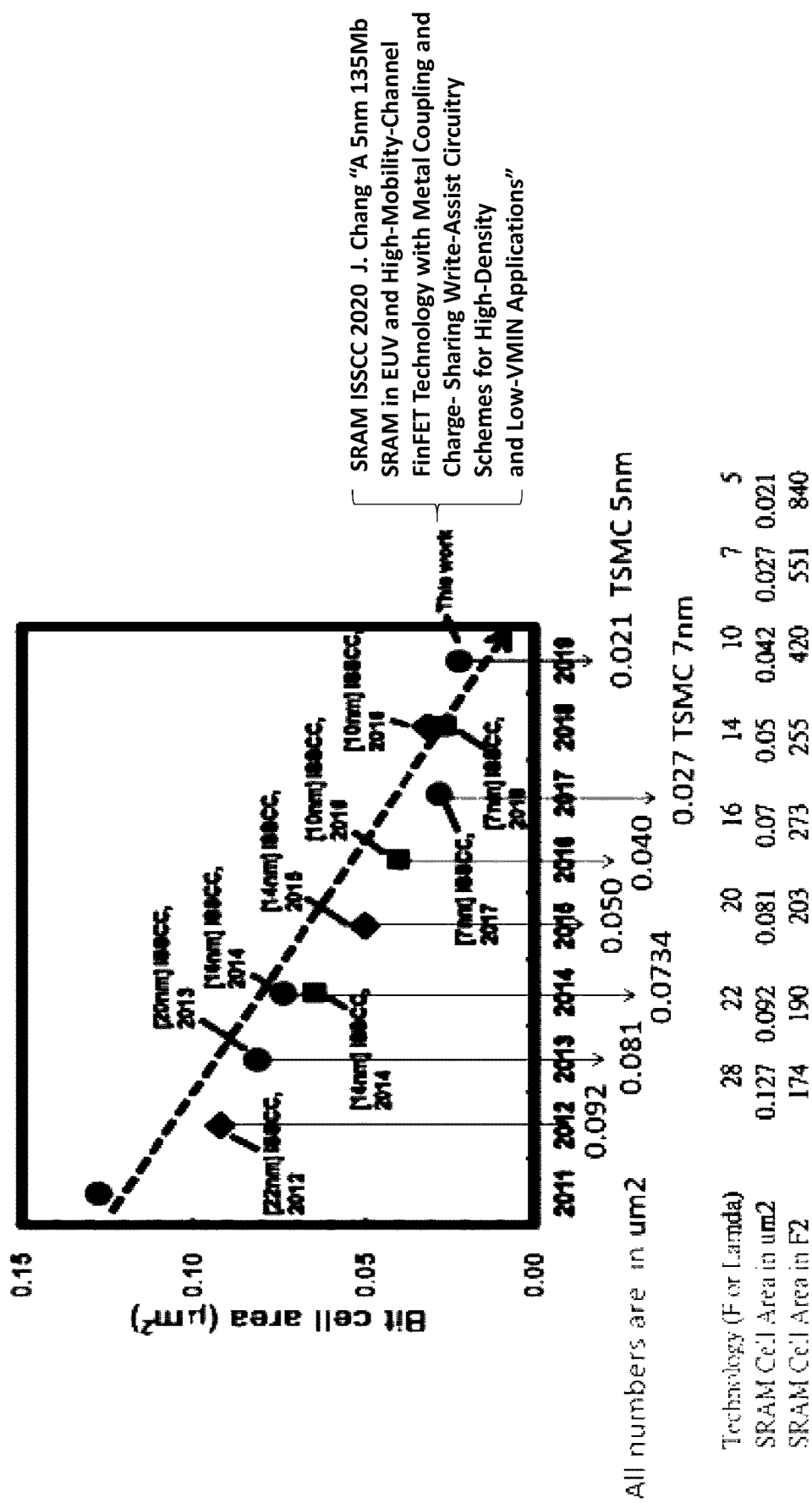
FIG. 2B is a diagram illustrating the total area of the SRAM cell in terms of $\lambda^2$ (or $F^2$) for different process dimension $\lambda$ (or F) according to the currently available manufacture processes.
Figure 3A:
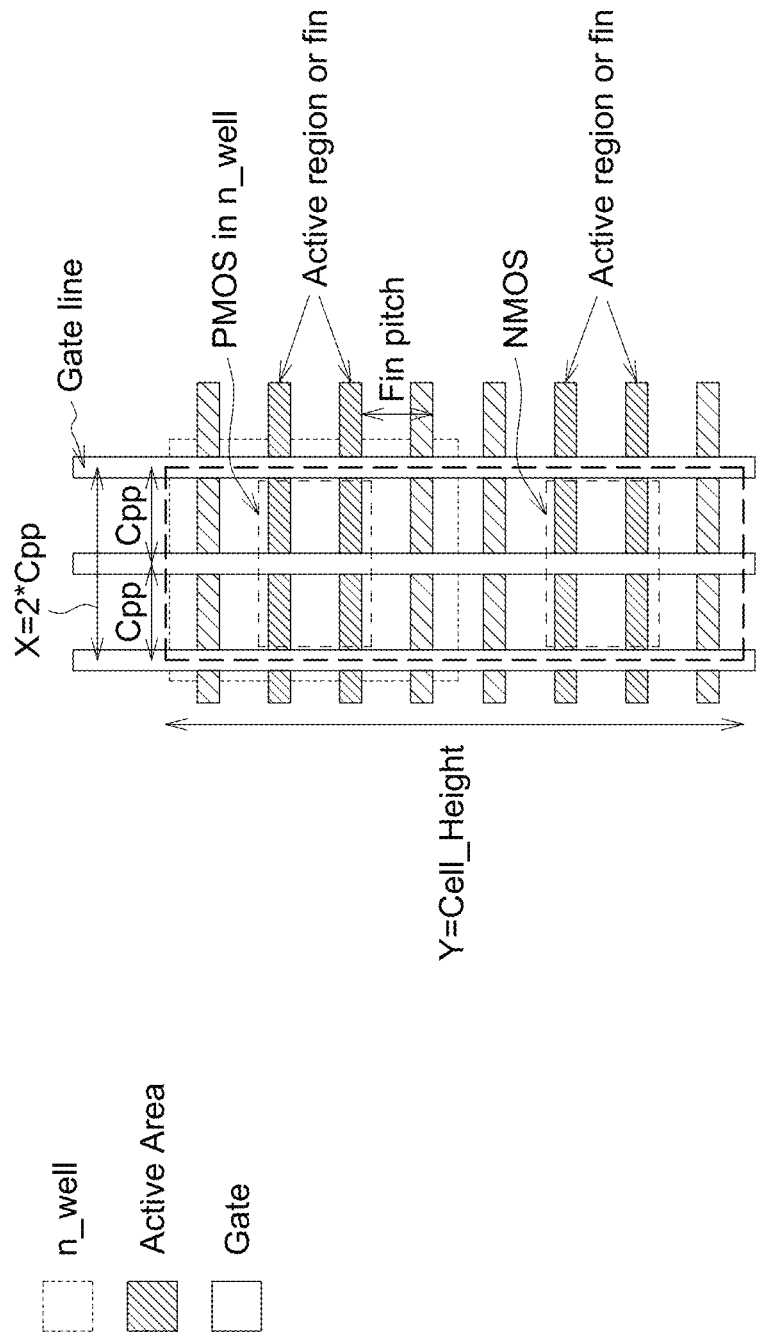
FIG. 3A illustrates a stick diagram representing the layout and connection among PMOS and NMOS transistors of a standard cell.
Figure 3B:
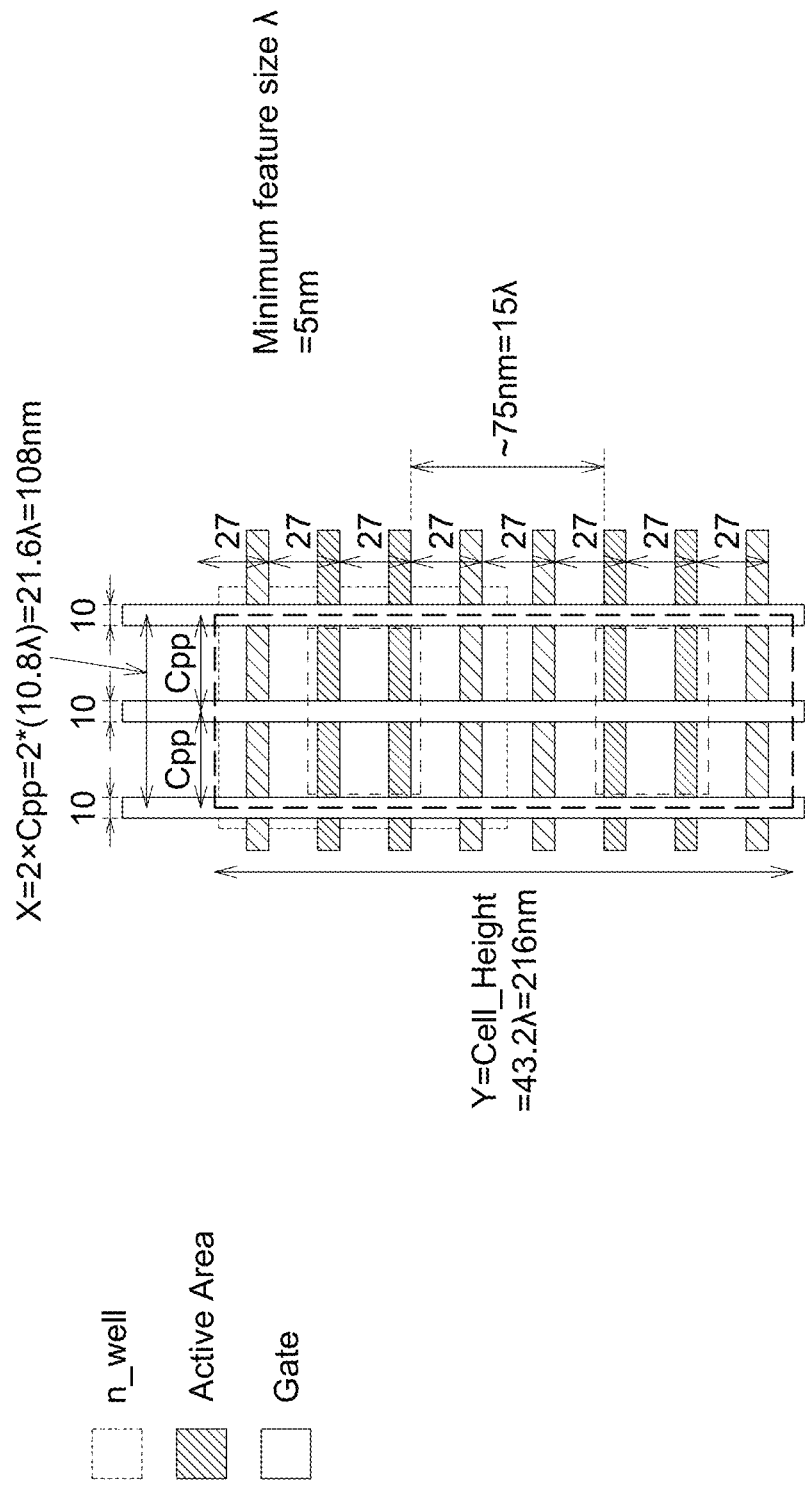
FIG. 3B illustrates a stick diagram representing the layout and connection among PMOS and NMOS transistors of a standard cell with dimension information.
Figure 3C:
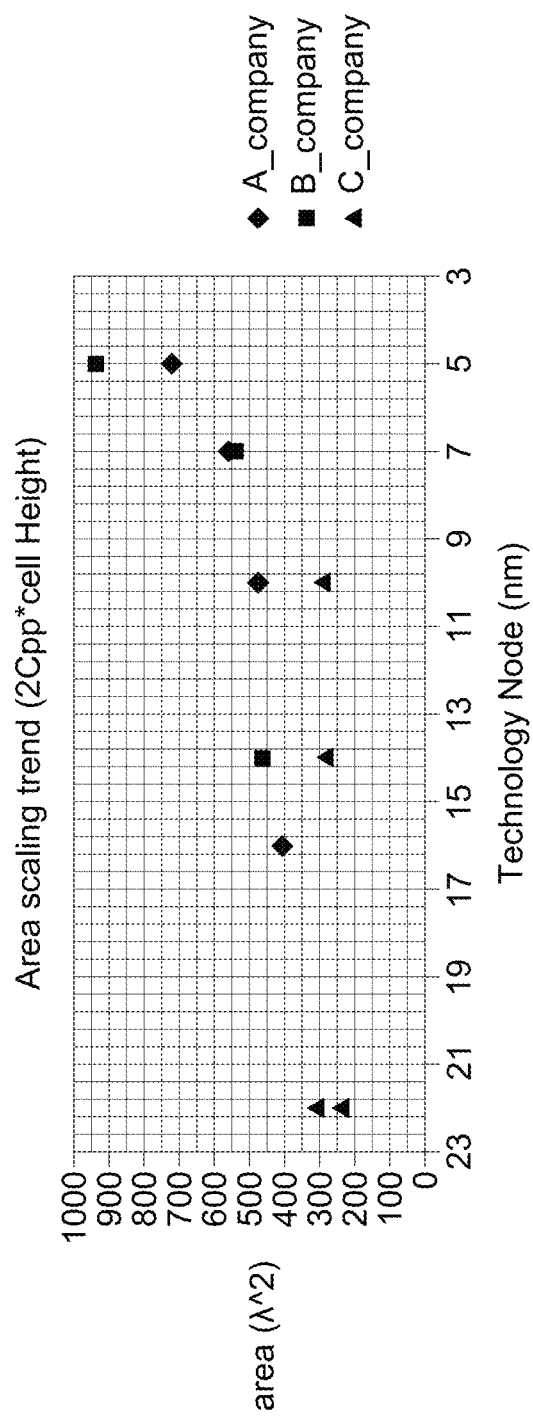
FIG. 3C. illustrates the scaling trend regarding area size v. different process technology node for three foundries.
Figure 4A:
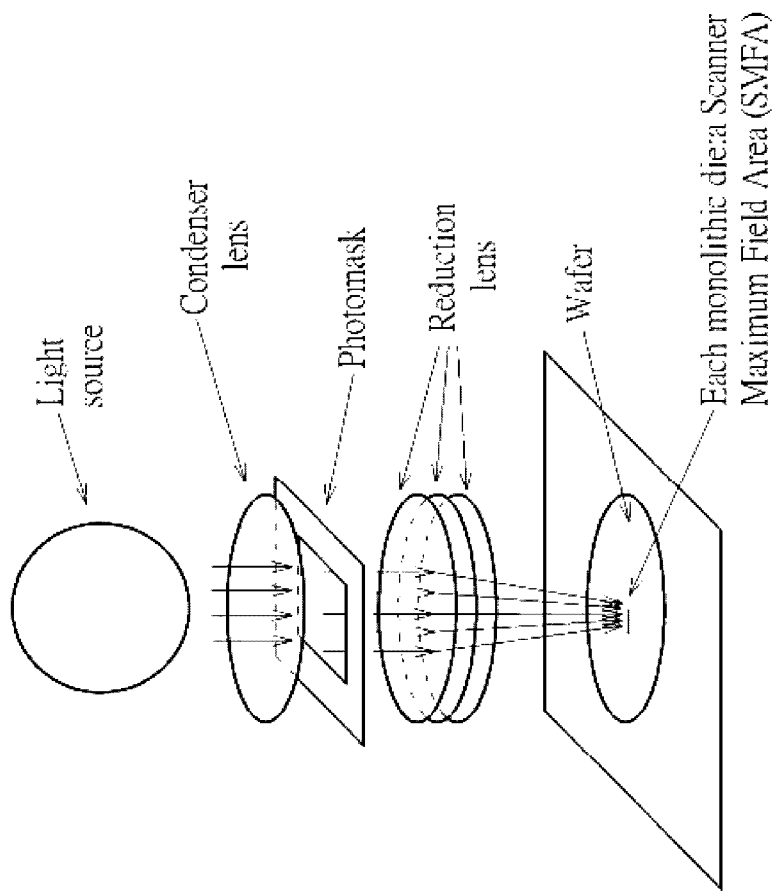
FIG. 4A and FIG. 4B are diagrams illustrating a monolithic SOC die with a Scanner Maximum Field Area (SMFA) which is limited by the maximum reticle size of the lithography steppers.
Figure 4B:
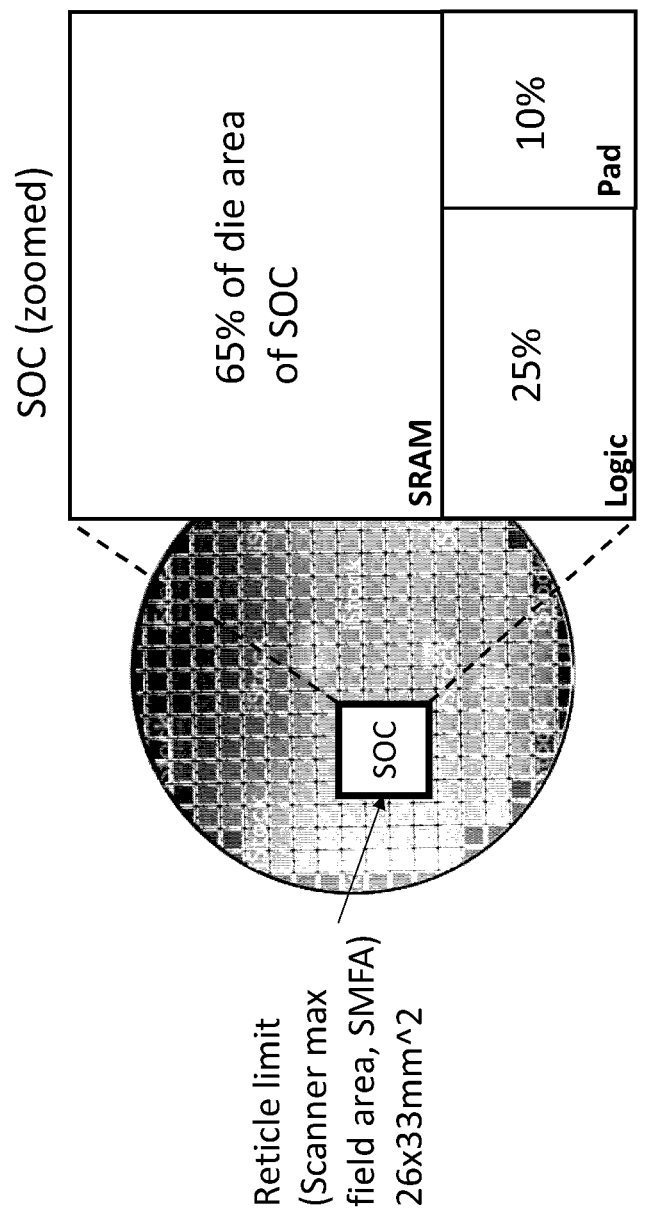

Compared with the conventional area of SRAM ($\lambda^2$) shown in FIG. 2B, the linear dimension of the present invention could be 0.9 (or smaller, such as 0.85, 0.8, or 0.7) times the linear dimension of the conventional SRAMs of FIG. 3, and then the area of the present invention could be at least 0.81 (or smaller, such as 0.72, 0.64, or 0.5) times the area of the conventional SRAMs of FIG. 2B. Thus, in another embodiment, the area of the SRAM cell is within the range of $84\lambda^2 \sim 672\lambda^2$ when the minimum feature size is 5 nm. The area of the SRAM cell is within the range of $84\lambda^2 \sim 440\lambda^2$ when the minimum feature size is 7 nm. The area of the SRAM cell is within the range of $84\lambda^2 \sim 300\lambda^2$ when the minimum feature size is between 10 nm to more than 7 nm. The area of the SRAM cell is within the range of $84\lambda^2 \sim 204\lambda^2$ when the minimum feature size is between 16 nm to more than 10 nm. The area of the SRAM cell is within the range of $84\lambda^2 \sim 152\lambda^2$ when the minimum feature size is between 22 nm to more than 16 nm. The area of the SRAM cell is within the range of $84\lambda^2 \sim 139\lambda^2$ when the minimum feature size is between 28 nm to more than 22 nm.

Similarly, the above-mentioned transistor, CMOS, latch-up design and/or interconnection structure could be applied to logic circuit in which the standard cells are basic element. The new standard cell (cell area: 2 Cpp×Cell_Height) is proposed in FIGS. 33A and 33B, wherein Cpp could be as small as 4λ, and Cell_Height could be as small as 24λ. It is noticed that, in FIG. 33A, two active fins are used in the PMOS and NMOS, respectively. However, the fin pitch could be as small as 3λ. The width for active region or fin could be as small as λ, so is the width of the gate line (or poly line). Those dimensions are easily formed no matter the size of the currently available technology node (or minimum feature size). Therefore, the cell area of the proposed standard cell (2 Cpp×Cell_Height) is $192\lambda^2$.

Figure 33A:
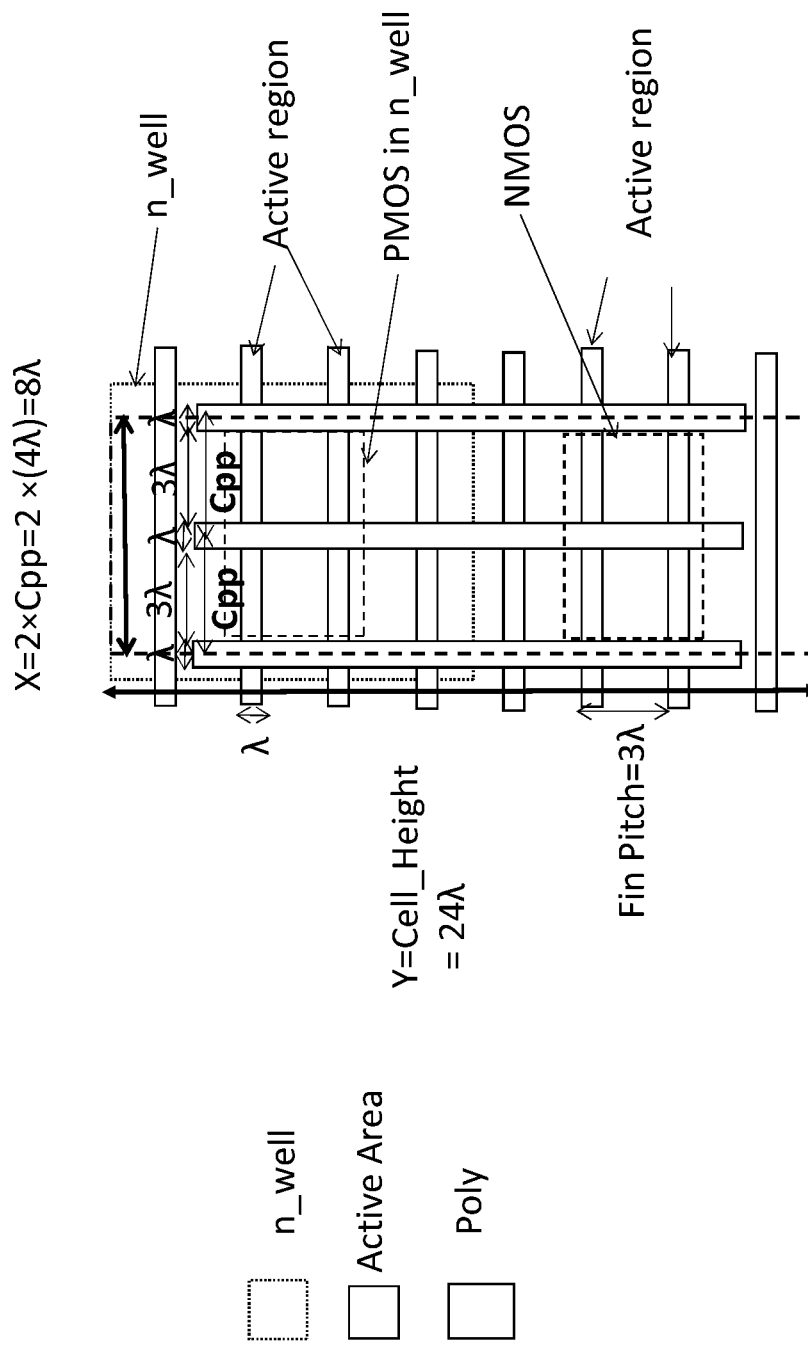
FIG. 33A is a stick diagram of the new 6T SRAM with dimension.
Figure 33B:
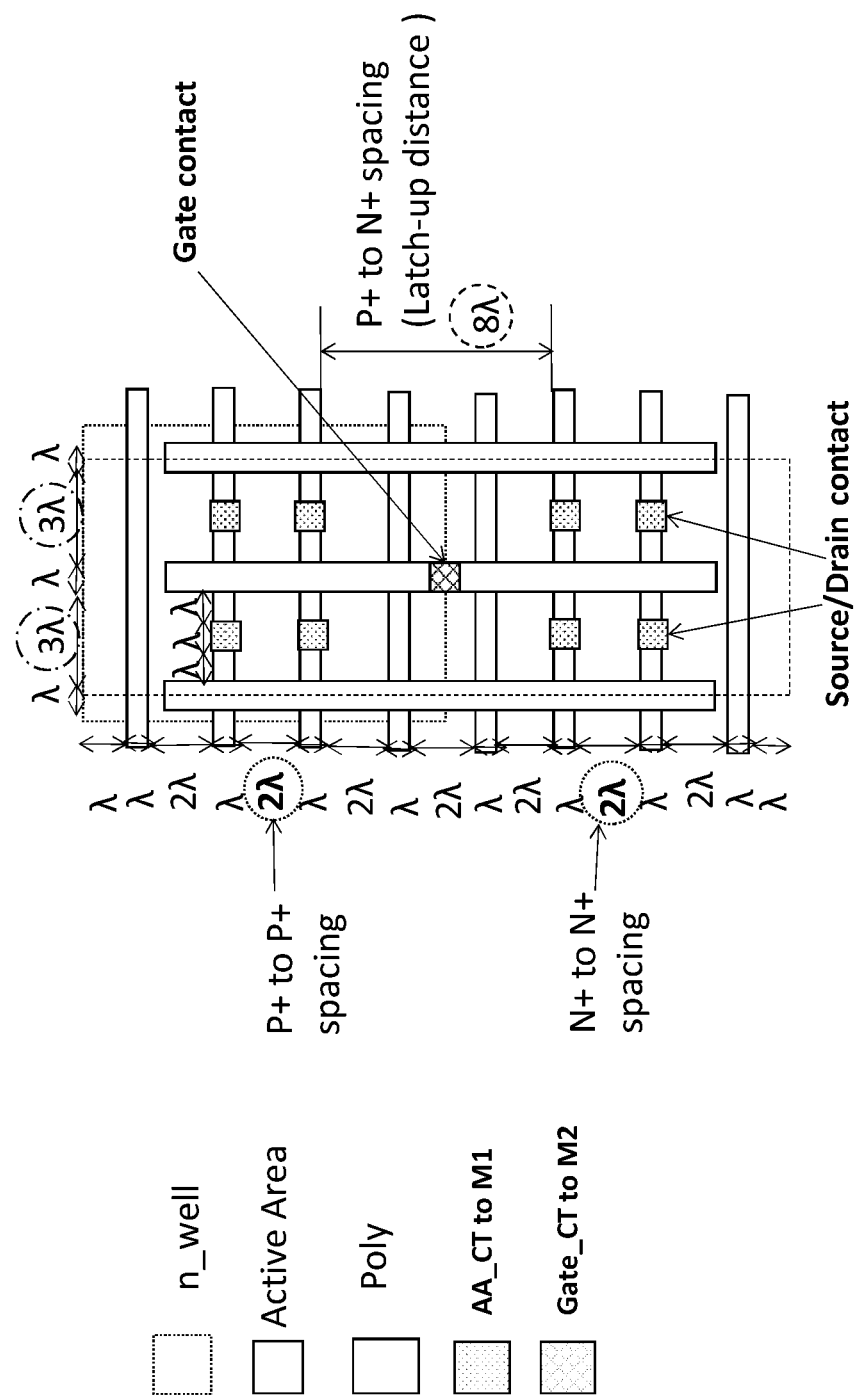
FIG. 33B is a stick diagram of the new 6T SRAM with contacts according to the present invention.

As shown in FIG. 33B, source/drain contacts (for connection to the metal 1 layer) could be formed in the active regions. The size of the source/drain contact could be as small as λ×λ, no matter the size of the technology node or (or minimum feature size). Similarly, gate contact (for direct connection to the metal 2 layer without connecting metal 1 layer, as explained previously) could be formed on the gate or Poly line, and the size of the gate contact could be as small as λ×λ as well. That is, the linear dimensions of the source, the drain and the gate of the transistors and the contacts thereof in the standard cell are precisely controlled, and the linear dimension can be as small as the minimum feature size, Lambda (λ). In this embodiment the gap between two gate or Poly lines is as small as 3λ.

Moreover, because the bottom of source/drain structure could be isolated from the substrate as previously mentioned, the n+ to n+ or p+ to p+ isolation can be kept within a reasonable range. Therefore, the spacing between two adjacent active regions could be scaled down to as small as 2λ (marked by dots circle in the left of FIG. 33B). Furthermore, the latch-up distance between the PMOS and the NMOS in the present invention could be down to as small as 8λ (marked by dash circle in the right of FIG. 33B), no matter the size of the technology node or (or minimum feature size), because the n+ and p+ regions of the source and drain regions in the NMOS and PMOS transistors respectively are fully isolated by insulators.

Figure 34A:
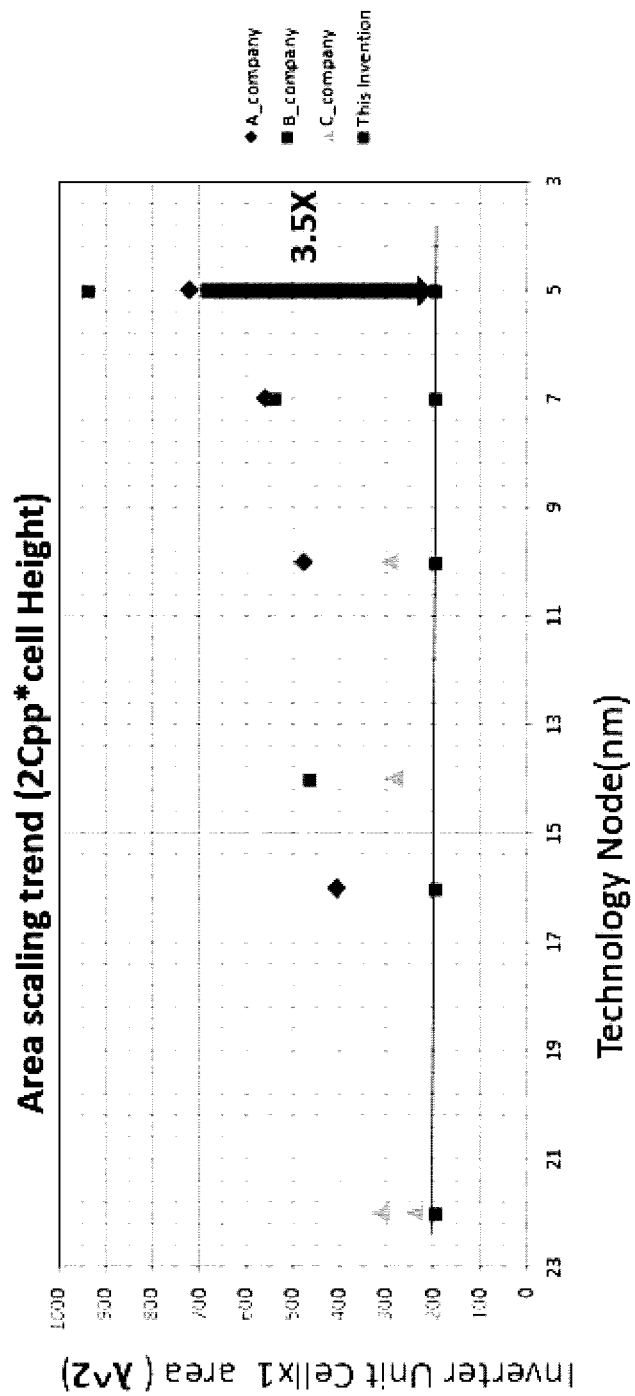
FIG. 34A shows the standard cell area (in term $\lambda^2$) across different technology nodes from three different foundries A, B, and C and the present invention.

According to the above-mentioned, the standard cell (2 Cpp×Cell_Height) in which an inverter could be accommodated has area size of $192\lambda^2$ according to the present invention, and such area size in terms of $\lambda^2$ will almost be the same at least from technology node 22 nm down to 5 nm, as shown in FIG. 34A. Comparing with the conventional results from other foundries, the proposed the standard cell (2 Cpp*cell Height) is around 1/3.5 of the area of the conventional 5 nm standard cell.

Of course, it is not necessary to utilize all improved technologies proposed ire the new standard cell of the present invention, only one of the proposed technologies is enough to reduce the area of the standard cell structure, as compared with the transitional standard cell. For example, the area of the standard cell (2 Cpp*cell Height) according to the present invention could be within the range of 190$\lambda^2$~600$\lambda^2$ at technology node of 5 nm, within the range of 190$\lambda^2$~450$\lambda^2$ or 190$\lambda^2$~250$\lambda^2$ at technology node of 7 nm, within the range of 190$\lambda^2$~250$\lambda^2$ at technology node between 10 nm and 14 nm, etc.

Moreover, in another embodiment, the present invention could be utilized in different cell sizes, such as 3 Cpp×Cell_Height or 5 Cpp×Cell_Height. A NOR cell or A NAND cell or two inverter cells could be embedded into the cell size of 3 Cpp×Cell_Height, and two NOR cells or two NAND cells could be embedded into the cell size of 5 Cpp×Cell_Height. It is also concluded that the area size of the proposed standard cell in terms of $\lambda^2$ (no matter cell sizes 3 Cpp×Cell_Height, or 5 Cpp×Cell_Height is almost the same at least from technology node 22 nm down to 5 nm.

FIG. 34B shows the values of Cpp, fin pitch and Cell_Height across different technology nodes from three different foundries and the present invention which implements some of the proposed transistor structure and interconnection with extra tolerance. The values of Cpp and fin pitch of the present invention could be applied not only to SRAM cell, but also to standard cell (as shown in FIG. 31B and FIG. 33A). Of course, it is not necessary to utilize all improved technologies proposed in new die, only one of the proposed technologies is enough to reduce the area of the SRAM cell or standard cell structure, as compared with the transitional SRAM cell. Thus, as compared with the other available foundries, the value of Cpp according to the present invention could be not greater than 45 nm (such as within the range of 45~20 nm or 40~20 nm) at technology node of 5 nm, not greater than 50 nm (such as within the range of 50~28 nm or 45~28 nm) at technology node of 7 nm, not greater than 50 nm (such as within the range of 50~40 nm or 45~40 nm) at technology node 10 nm, or not greater than 67 nm (such as within the range of 67~64 nm) at technology node between 14 nm and 16 nm. Furthermore, the value of fin pitch according to the present invention could be not greater than 20 nm (such as within the range of 20~15 nm) at technology node of 5 nm, not greater than 24 nm (such as within the range of 24~21 nm) at technology node of 7 nm, not greater than 32 nm (such as within the range of 32~30 nm) at technology node 10 nm.

Moreover, the value of Cpp could be not greater than 45 nm (such as within the range of 45~20 nm) when the second fin width is not greater than 5 nm, or the value of Cpp could be not greater than 50 nm (such as within the range of 50~28 nm) when the second fin width is not greater than 7 nm but not less than 5 nm, or the value of Cpp could be not greater than 50 nm (such as within the range of 50~40 nm) when the second fin width is not greater than 10 nm but not less than 7 nm, or the value of Cpp could be not greater than 67 nm (such as within the range of 67~64 nm) when the second fin width is between 14~16 nm.

Figure 35:
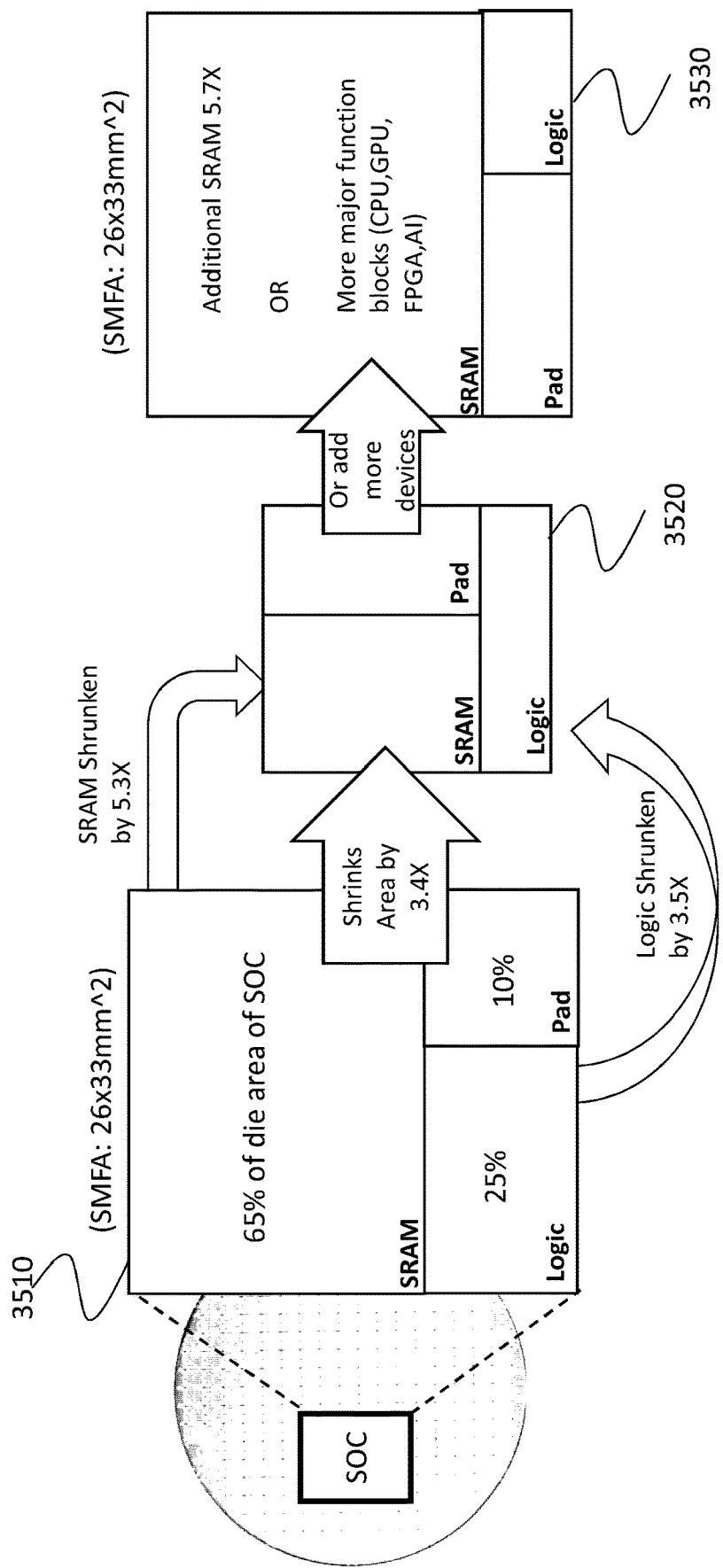
FIG. 35 is a diagram illustrating the proposed integrated scaling and stretching platform according to the present invention.

According to the above-mentioned, FIG. 35 discloses the present innovation of an Integrated Scaling and/or Stretching Platform (ISSP) in its monolithic die design. First, with the proposed new transistor, CMOS, and interconnection structure, etc., an original schematic circuit of Die A can be scaled down in its area by 2 to 3 times; so a single major function block like CPU or GPU can be shrunk to a much smaller size. Then more SRAM or more major function blocks could be formed in one single monolithic die. Using 5 nm technology node as example, a 6-T SRAM cell size can be shrunken to about 100F^2 (where F is the minimum feature size made on silicon wafers) as shown in FIG. 32. That is, if F=5 nm, then the SRAM cell can occupy about 2500 nm^2 in contrast to the state-of-the-art cell area around 800F^2 based on publications (~shrunken by 8×). Moreover, a 8-finger CMOS Inverters (shown in FIG. 33A and FIG. 33B) with dimension of 2 Cpp×Cell_Height) should consume a die area of 200F^2 in contrast to that of the published CMOS Inverter more than 700^2 or up to 900F^2 for its 5 nm process node in FIG. 34A.

That is, in the event a die A has a schematic circuit (such as a SRAM circuit, a logic circuit, a combination of SRAM+ logic circuit, or a major function block circuit CPU, GPU, FPGA, etc.) which occupies a first die area (such as Ynm^2) based on a technology node (such as 7 nm or 5 nm), with the help of the present invention, the total area of the die A with the same schematic circuit could be shrunk even the die A is still manufactured by the same technology node. Moreover, the new die area occupied by the same schematic circuit in the die A will be smaller than the first die area, such as be 20%~90% (or 30%~70%) of Ynm^2.

For example, as shown in FIG. 35, an original SOC die 3510 has a Scanner Maximum Field Area (SMFA) of 26×33 mm^2, in which original SRAM, original logic circuit, and I/O pads occupies 65%, 25% and 10% of the die area, respectively. In the event the SRAM is shrunk to 1/5.3, and logic circuit is shrunk to 1/3.5, then the new shrunk die 3520 has a die area which is 1/3.4 of the SMFA of 26×33 mm^2. Thus, more SOC dice will be produced in the same SMFA of 26×33 mm^2 (such as 2.4 times dice). In another point of view, it is easily to combine more SRAM (such as 5.7 times quantity of the original SRAM) with the shrunk die 3520 in the same SMFA to become a new monolithic die 3530 based on the proposed Integrated Scaling and/or Stretching Platform (ISSP); or combine more major function blocks (such as, new CPU, new GPU, new FPGA, etc.) with the shrunk die 3520 in the same SMFA to become another new monolithic die 3530.

Thus, more SRAM would be formed in the monolithic die. Nowadays, there are several levels of caches in major processing units (such as, CPUs or GPUs). The L1 and L2 caches (collectively "low level cache") are usually one per CPU or GPU core unit, with the L1 cache being divided into L1i and L1d, which are used to store instructions and data respectively, and the L2 cache, which does not distinguish between instructions and data, and the L3 cache (could be one of "high level cache"), which is shared by multiple cores and usually does not distinguish between instructions and data either. L1/L2 Cache is usually one per CPU or GPU core, which means that each additional CPU or GPU core has to increase the area of the same size. Usually, the higher volume of cache, the higher the hit rate. For high speed operation, those low level cache or high level cache are commonly made of SRAM. Therefore, based on our Integrated Scaling and/or Stretching Platform, the L1/L2 Cache ("low level cache") and L3 cache ("high level cache") could be increased in a monolithic single die with the Scanner Maximum Field Area (SMFA) limited by the photolithography exposure tools.

Figure 36A:
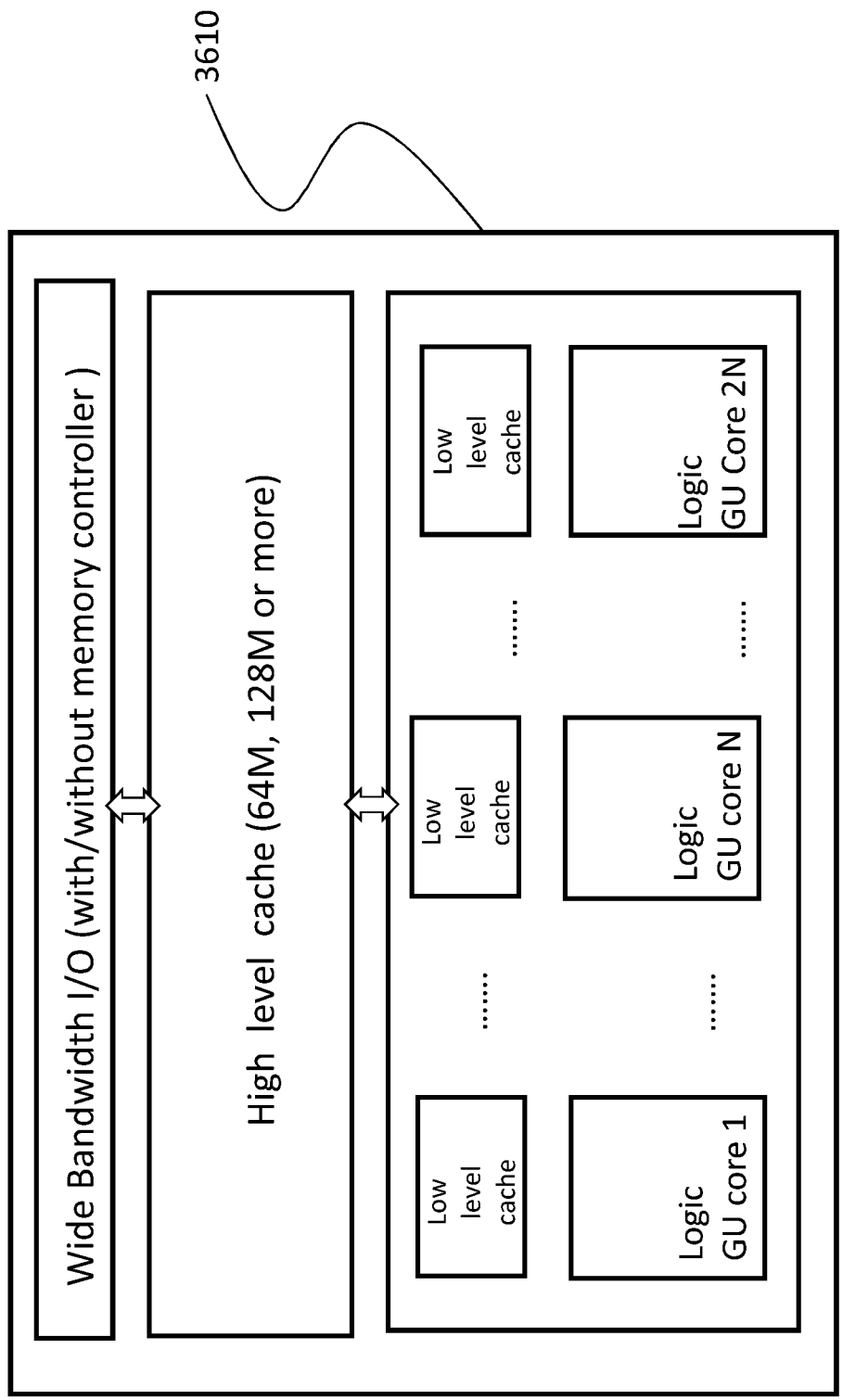
FIGS. 36A~36E show different embodiments of the monolithic die based on the proposed integrated scaling and stretching platform according to the present invention.

In one example, as shown in FIG. 36A about the single monolithic die 3610, a XPU 3610 (such as a GPU) with multiple cores has a SMFA (such as 26 mm by 33 mm, or 858 mm^2) in which the high level cache could have 64 MB SRAM or more (such as 128, 256, 512 MB or more). Furthermore, additional logic GU cores (GU core1 to GU core 2N, such as 64, 128, 256 or more cores) of the GPU could be inserted into the same SMFA to enhance the performance. So is the memory controller with wide bandwidth I/O, for another embodiment. Each monolithic die includes I/O bus (such as wide bandwidth I/O), each CPU or GPU core is electrically coupled to the I/O bus, and those caches or SRAM are electrically coupled to the I/O bus as well.

Figure 36B:
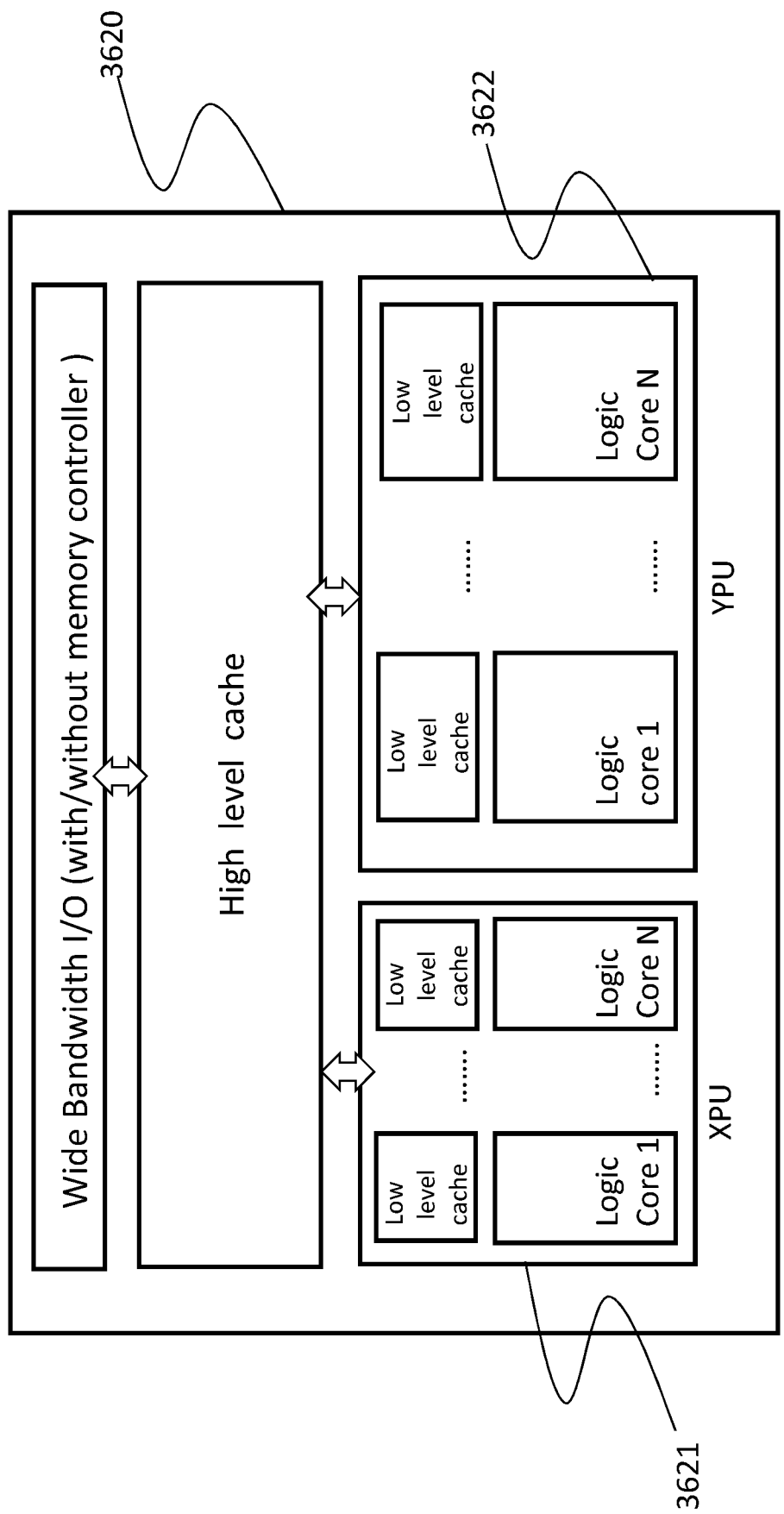

Alternatively, other than the exiting major function block, another major function block, such as Network Processing Unit (NPU), Tensor Processing Unit (TPU) or FPGA, which has also become smaller according to the present invention, can be integrated together in another monolithic die 3620 as illustrated in FIG. 36B. XPU 3621 and YPU 3622 in FIG. 36B represents processing unit with major function block and could be NPU, GPU, CPU, FPGA, or TPU. For example, the XPU 3621 could be CPU, and the YPU 3622 could be GPU. The major function block of XPU 3621 could be same as or different from that of the YPU 3622. XPU 3621 and YPU 3622 has multiple logic cores, and each core has low level cache (such as L1/L2 cache; 128K for L1 and 512K or 1M for L2), and a high volume of high level cache (such as L3 cache with 32 MB, 64 MB or more) is shared by XPU 3621 and YPU 3622. Each monolithic die includes I/O bus (such as wide bandwidth I/O), each logic core is electrically coupled to the I/O bus, and those caches or SRAM are electrically coupled to the I/O bus as well.

Thus, a single monolithic die (could be with the Scanner Maximum Field Area) of the present invention can have two (or three, or more) major function blocks or different schematic circuits. In conventional monolithic die has a first schematic circuit or a first major function block which may occupies 20%~90%, 30%~80%, 50%~90% or 60%~90% (for example, as shown in left hand side of FIG. 35, the logic circuit corresponding to a schematic circuit occupies around 25%~30%, the SRAM circuit corresponding to a schematic circuit occupies around 50%~65%, the combination of SRAM and logic circuits corresponding to another schematic circuit occupies around 80%~90%) of the scanner maximum field area of the conventional monolithic die. However, the single monolithic die of the present invention with the same scanner maximum field area (that is, made based on the same technology node as that of the conventional monolithic die, such as 5 nm or 7 nm) can not only include the same first schematic circuit or a first major function block, but also another second schematic circuit or second major function block (as shown in right hand side of FIG. 35). In another example, the area of the second schematic circuit in the monolithic die of the present invention similar to that of the first schematic circuit in the monolithic die of the present invention.

According to the present invention, the first schematic circuit or the first major function block in conventional monolithic die could be shrunk to 20%~90% (such as 30%~80%, for example, in FIG. 32 and FIG. 34A, SRAM circuit could be shrunk into 1/8, and logic circuit could be shrunk into 1/3.5) Especially, GPU is more and more often for AI training, but not so good for AI inference. On the other hand, FPGAs have blocks of logic that interact with each other and can be designed by engineers to help specific algorithms, and is suitable for AI inference. In a monolithic die both GPU and FPGA could be formed based on the Integrated Scaling and/or Stretching Platform (ISSP). Such monolithic die on one hand has great parallel computing, training speed and efficiency. And on the other hand, it also owns great AI inference ability with faster time to market, lower cost, and flexibility.

Figure 36C:
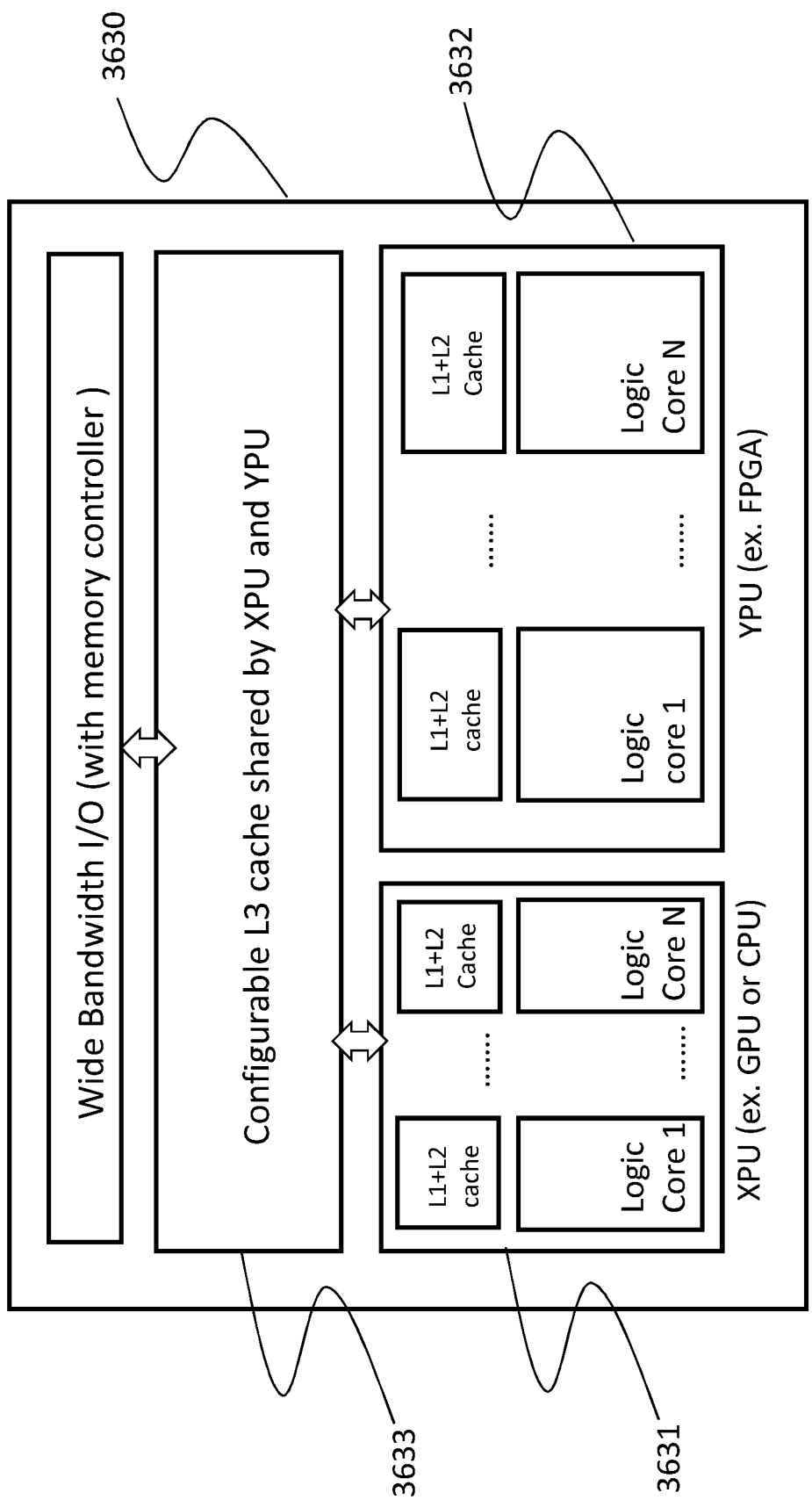
Figure 36D:
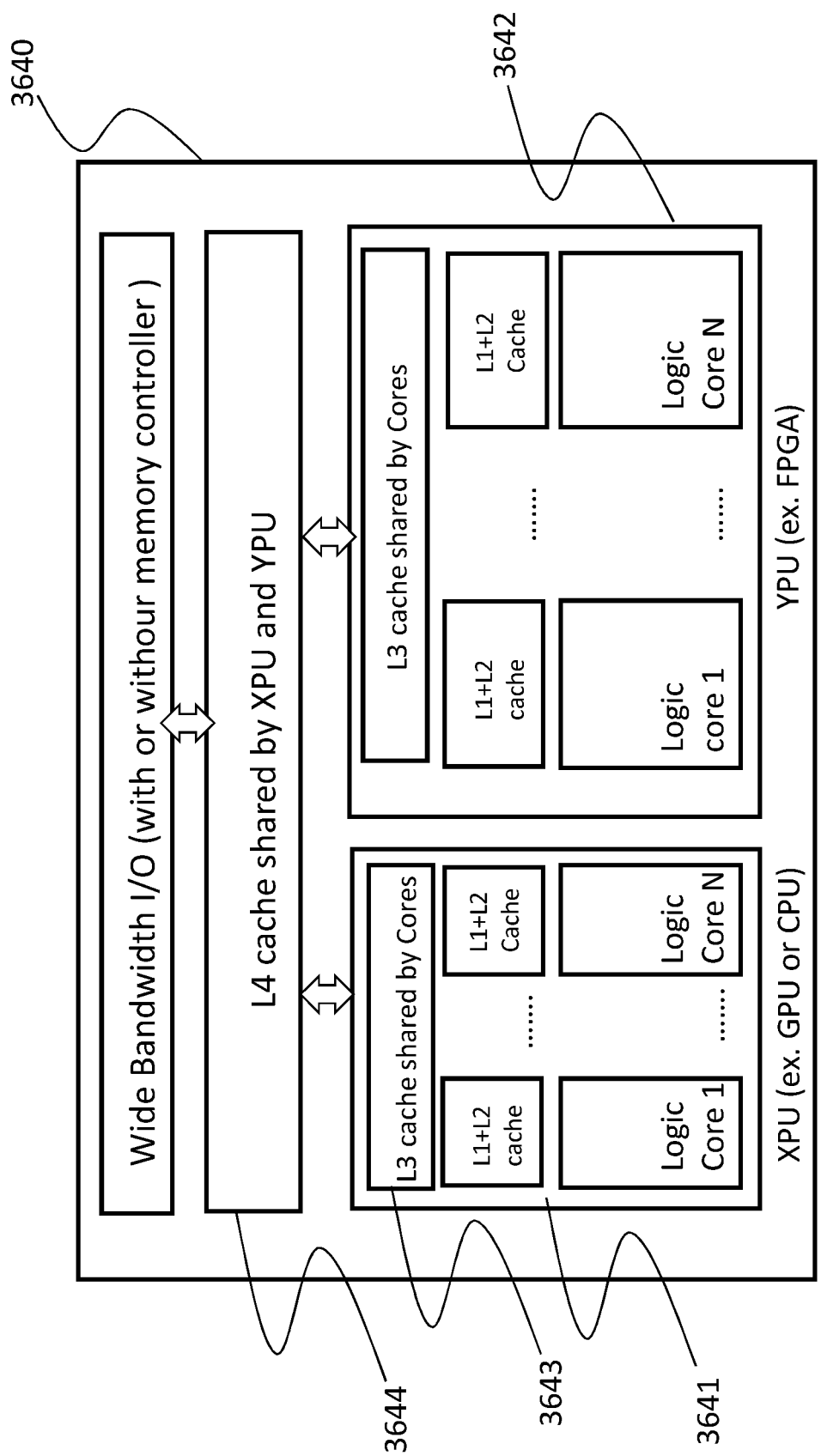

In another embodiment, as shown in FIG. 36C about the single monolithic die 3630, the shared high level cache 3633 (such as L3 cache) between XPU 3631 and YPU 3632 is configurable, either by setting in another mode register (not shown) or adaptively configurable during the operation of the monolithic die. For example, in one embodiment, by setting the mode register, ⅓ of the high level cache 3633 could be used by XPU 3631, and ⅔ of the high level cache 3633 could be used by YPU 3632. Such the shared volume of high level cache 3633 (such as L3 cache) for XPU 3631 or YPU 3632 could also be dynamically changed based on the operation of the Integrated Scaling and/or Stretching Platform (ISSP). Further in another embodiment as shown in FIG. 36D about the single monolithic die 3640, the high level cache includes L3 caches 3643 and L4 cache 3644, wherein each of XPU 3641 and YPU 3642 has corresponding L3 cache (such as 8M or more) 3643 shared by its own cores, and the L4 cache 3644 (such as 32 MB or more) is shared by XPU 3641 and YPU 3642. Again, in this example, each monolithic die includes I/O bus (such as wide bandwidth I/O), each logic core is electrically coupled to the I/O bus, and those caches or SRAM are electrically coupled to the I/O bus as well.

Especially important is that somewhat larger capacity shared SRAM (or embedded SRAM, "eSRAM") can be designed into the die due to much small areas of eSRAM design according to the present invention. Since more and smarter shared eSRAMs can be used, it's more effective to connect the external DRAMs to this eSRAM in the monolithic die with the limited SMFA corresponding to a specific technology node, and the volume of the required external DRAM could be reduced. Thus, the present invention discloses a platform to reconfigure memory architecture of a conventional chip system. In the conventional chip system, it comprises a first monolithic die (such as a GPU) to be connected to a first DRAM memory with a first predetermined volume (such as 1 GB), the first monolithic die has a scanner maximum field area (SMFA) based on a targeted technology node (such as 5 nm) and includes a first logic circuit and a first SRAM memory, and the sum of the area of the first logic circuit and the area of the first SRAM memory occupies at least 80~90% of the scanner maximum field area of the first monolithic die.

Based on the present invention, the new platform with a brand new memory architecture comprises a second monolithic die to be connected to a second DRAM memory, wherein the second monolithic die includes a second logic circuit and a second SRAM memory, and the second monolithic die has the same SMFA based on the same targeted technology node. Wherein the second logic circuit is the same or substantially the same as the first logic circuit (such as both of them are all the same GPU or NPU), but the area of the first logic circuit in the first monolithic die is greater than the area of the second logic circuit in the second monolithic die because the area of the second logic circuit could be shrunk according to the present invention. Moreover, larger volume SRAM can be designed into the die due to much small areas of SRAM structure according to the present invention and much remaining extra chip area in the second monolithic die, thus the volume of the second SRAM memory in the second monolithic die is much higher than the volume of the first SRAM memory in the first monolithic die. Since the larger SRAM volume in the second monolithic die, the volume of DRAM connected to the second monolithic die could be reduced, such that the volume of the second DRAM memory is smaller than the volume of the first DRAM memory.

Figure 36E:
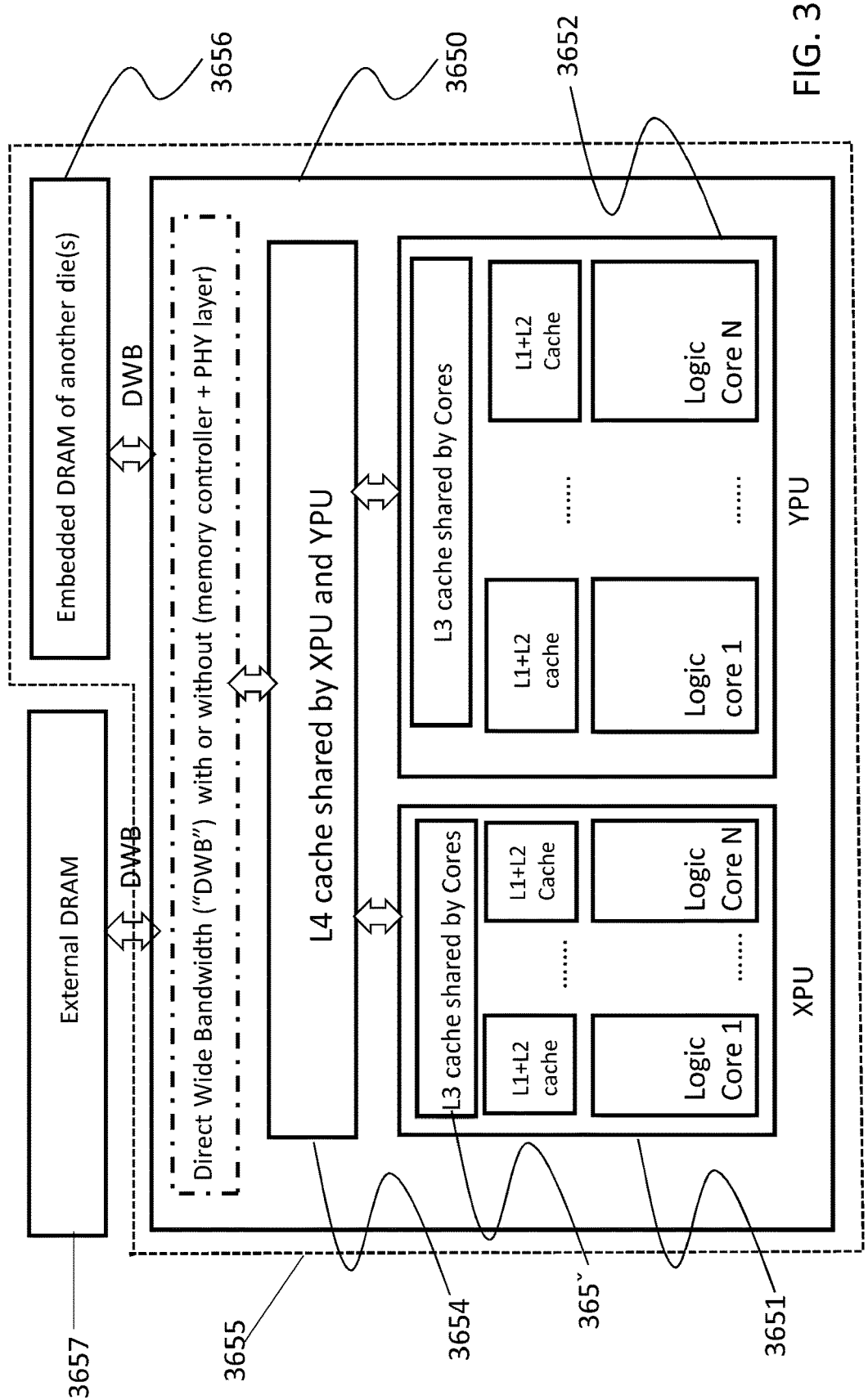

In another embodiment shown in FIG. 36E about the single monolithic die 3650, a single big size Direct Wide BUS (DWB) is a good candidate on a monolithic die (expandable to the maximum size of the reticle allowed) connected to another monolithic die of external DRAM or other embedded DRAM ("eDRAM"). The DWB is presented in the U.S. application Ser. No. 16/904,597, filed on Jun. 18, 2020 and entitled "MEMORY SYSTEM AND MEMORY CHIP", and the whole content of the U.S. application Ser. No. 16/904,597 is incorporated by reference herein. The DWB could has 128 bits, 256 bits, 512 bits, 1024 bis or more to transmit the date in parallel. In FIG. 36E, the embedded DRAM ("eDRAM") 3656 could be located in another die which is packaged with the monolithic die 3650 having at least two major function blocks (XPU 3651 and YPU 3652) and high volume SRAM (such as L3 3653 cache and L4 cache 3654). The external DRAM 3657 is separate from the package 3655 but communicate with the single monolithic die 3650 via the DWB. Moreover, the single monolithic die 3650 with the limited SMFA corresponding to a specific technology node also includes the memory controller and physical layer compatible with DWB.

In summary, monolithic/heterogeneous integration on a single die which enables the success of Moore's Law is now facing its limits, especially due to limits of photography printing technologies. On one hand the minimum feature size printed on the die is very costly to be scaled in its dimension, but on the other hand the die size is limited by a Scanner Maximum Field Area. But that more and diversified functions of processors are emerging, which are hard to integrated on a monolithic die. In addition, somewhat duplicated existence of eSRAMs on each major function die and external DRAMs only served for each individual die function is not a desirable and optimized solution. Based on the proposed Integrated Scaling and/or Stretching Platform (ISSP) in a monolithic die or SOC die: (a) a single major function block like FPGA, TPU, NPU, CPU or GPU can be shrunk to a much smaller size; (b) more SRAM or more function blocks could be formed in the monolithic die; and (c) two or more major function block, such as GPU and FPGA (or other combination), which has also gone through this ISSP to become smaller, can be integrated together in the same monolithic die. Furthermore, more levels of caches could be existed in a monolithic die. Such integrated monolithic die could be combined with another dies (such as eDRAMs) based on heterogeneous integration.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A monolithic die, comprising:
a first processing unit circuit formed in the monolithic die with a scanner maximum field area, the first processing unit circuit with a plurality of a first logic cores, and each first logic core corresponding to a first cache memory; and
a second processing unit circuit formed in the monolithic die, the second processing unit circuit with a plurality of a second logic cores, and each second logic core corresponding to a second cache memory;
wherein the scanner maximum field area of the monolithic die is defined by a specific technology node.

2. The monolithic die in claim 1, wherein the scanner maximum field area of the monolithic die is not greater than 26 mm by 33 mm, or 858 mm$^2$.

3. The monolithic die in claim 1, wherein a major function performed by the first processing unit circuit is different from a major function performed by the second processing unit circuit.

4. The monolithic die in claim 3, wherein the first processing unit circuit or the second processing unit circuit is selected from a group consisting of GPU, CPU, TPU, NPU, and FPGA.

5. The monolithic die in claim 1, further comprising a third cache memory, wherein the third cache memory is configurable and utilized by the first processing unit circuit and the second processing unit circuit during operation of the monolithic die, wherein the first cache memory, the second cache memory, and the third cache memory are made of SRAM.

6. The monolithic die in claim 1, further comprising a third processing unit circuit formed in the monolithic die, the third processing unit circuit with a plurality of a third logic cores, and each third logic core corresponding to a third cache memory.

7. A monolithic die, comprising:
a first processing unit circuit formed in the monolithic die with a scanner maximum field area, the first processing unit circuit with a plurality of a first logic cores, and each first logic core corresponding to a first cache memory;
a second processing unit circuit formed in the monolithic die, the second processing unit circuit with a plurality of a second logic cores, and each second logic core corresponding to a second cache memory; and
a third cache memory, wherein the third cache memory is shared and utilized by the first processing unit circuit and the second processing unit circuit during operation of the monolithic die;
wherein a major function performed by the first processing unit circuit is different from a major function performed by the second processing unit circuit.

8. The monolithic die in claim 7, wherein the first processing unit circuit or the second processing unit circuit is selected from a group consisting of GPU, CPU, TPU, NPU, and FPGA.

9. The monolithic die in claim 7, wherein the first cache memory, the second cache memory, and the third cache memory are made of SRAM.

* * * * *